United States Patent
Horikiri

(10) Patent No.: US 11,946,874 B2
(45) Date of Patent: Apr. 2, 2024

(54) METHOD FOR PRODUCING NITRIDE SEMICONDUCTOR LAMINATE, SILICON SEMICONDUCTOR PRODUCT, METHOD FOR INSPECTING FILM QUALITY AND METHOD FOR INSPECTING SEMICONDUCTOR GROWTH DEVICE

(71) Applicant: SUMITOMO CHEMICAL COMPANY, LIMITED, Tokyo (JP)

(72) Inventor: Fumimasa Horikiri, Hitachi (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 808 days.

(21) Appl. No.: 17/055,539

(22) PCT Filed: Apr. 8, 2019

(86) PCT No.: PCT/JP2019/015320
§ 371 (c)(1),
(2) Date: Mar. 8, 2021

(87) PCT Pub. No.: WO2019/220813
PCT Pub. Date: Nov. 21, 2019

(65) Prior Publication Data
US 2021/0215621 A1     Jul. 15, 2021

(30) Foreign Application Priority Data
May 15, 2018    (JP) .................. 2018-094151

(51) Int. Cl.
*G01N 21/59*      (2006.01)
*G01N 21/3563*    (2014.01)
(Continued)

(52) U.S. Cl.
CPC ..... *G01N 21/9501* (2013.01); *G01N 21/3563* (2013.01); *G01N 21/359* (2013.01);
(Continued)

(58) Field of Classification Search
CPC ........... G01N 21/9501; G01N 21/3563; G01N 21/359; G01N 21/59; G01N 2021/3568;
(Continued)

(56) References Cited

U.S. PATENT DOCUMENTS

| 5,227,861 A | 7/1993 | Nishizawa et al. |
| 5,595,916 A | 1/1997 | Fujimura et al. |

(Continued)

FOREIGN PATENT DOCUMENTS

| JP | H04-120404 A | 4/1992 |
| JP | 2007-126320 A | 5/2007 |

(Continued)

OTHER PUBLICATIONS

International Preliminary Report on Patentability and Written Opinion, along with English translations, dated Nov. 26, 2020 for corresponding International Patent Application No. PCT/JP2019/015320.

(Continued)

*Primary Examiner* — Allison Bernstein
*Assistant Examiner* — Margaret B Hayes
(74) *Attorney, Agent, or Firm* — Foley & Lardner LLP

(57) ABSTRACT

There is provided a method for producing a nitride semiconductor laminate in which a thin film is homoepitaxially grown on a substrate comprising group III nitride semiconductor crystals, the method including: homoepitaxially growing a thin film on a substrate, using the substrate in which a dislocation density on its main surface is $5 \times 10^6$ pieces/cm$^2$ or less, a concentration of oxygen therein is less than $1 \times 10^{17}$ at·cm$^{-3}$, and a concentration of impurities therein other than n-type impurity is less than $1 \times 10^{17}$ at·cm$^{-3}$; and inspecting a film quality of the thin film formed on the substrate, wherein in the inspection of the film quality, (Continued)

the film quality of the thin film is inspected by detecting a deviation of an amount of reflected light at a predetermined wavenumber determined in a range of 1,600 cm$^{-1}$ or more and 1,700 cm$^{-1}$ or less in a reflection spectrum obtained by irradiating the thin film on the substrate with infrared light, from an amount of reflected light at the predetermined wavenumber determined according to a film thickness of the thin film, a carrier concentration of the substrate, and a carrier concentration of the thin film.

10 Claims, 18 Drawing Sheets

(51) Int. Cl.
    *G01N 21/359*     (2014.01)
    *G01N 21/95*     (2006.01)
    *H01L 21/02*     (2006.01)
    *H01L 21/66*     (2006.01)
    *H01L 29/20*     (2006.01)

(52) U.S. Cl.
    CPC .......... *G01N 21/59* (2013.01); *H01L 21/0254* (2013.01); *H01L 22/12* (2013.01); *H01L 29/2003* (2013.01); *G01N 2021/3568* (2013.01)

(58) Field of Classification Search
    CPC .. H01L 21/0254; H01L 22/12; H01L 29/2003
    See application file for complete search history.

(56) References Cited

U.S. PATENT DOCUMENTS

| | | |
|---|---|---|
| 2007/0096147 A1 | 5/2007 | Oshima |
| 2011/0001142 A1* | 1/2011 | Saitoh ................ H01L 22/12 257/E29.089 |
| 2016/0233306 A1 | 8/2016 | Nagao et al. |

FOREIGN PATENT DOCUMENTS

| | | |
|---|---|---|
| JP | 2009-114061 A | 5/2009 |
| JP | 5748033 B1 | 7/2015 |
| JP | 2018-199601 A | 12/2018 |
| WO | WO-2019/003624 A1 | 1/2019 |

OTHER PUBLICATIONS

Hsu et al., "Low temperature metalorganic chemical vapor deposition of gallium nitride using dimethylhydrazine as nitrogen source," Thin Solid Films, vol. 419, 2002, pp. 33-39.

Barker et al., "Infrared Lattice Vibrations and Free-Electron Dispersion in GaN," Physical Review B, vol. 7, No. 2, Jan. 1973, pp. 743-750.

Horikiri et al., "The characterization of GaN homo-epitaxial layers grown on GaN substrates by using FT-IR," The Institute of Electronics, Information and Communication Engineers Technical Report, 2018, pp. 19-22.

International Searching Authority, "International Search Report," issued in connection with International Patent Application No. PCT/JP2019/015320, dated Jun. 18, 2019.

International Searching Authority, "Written Opinion," issued in connection with International Patent Application No. PCT/JP2019/015320, dated Jun. 18, 2019.

* cited by examiner (a)

(b)

(a)

(b)

(a)

(b)

(a)

(b)

(a) Epi layer (b) Substrate

METHOD FOR PRODUCING NITRIDE SEMICONDUCTOR LAMINATE, SILICON SEMICONDUCTOR PRODUCT, METHOD FOR INSPECTING FILM QUALITY AND METHOD FOR INSPECTING SEMICONDUCTOR GROWTH DEVICE

RELATED APPLICATIONS

The present application claims priority under 37 U.S.C. § 371 to International Patent Application No. PCT/JP2019/015320, filed Apr. 8, 2019, which claims priority to and the benefit of Japanese Patent Application No. 2018-094151, filed on May 15, 2018. The contents of these applications are hereby incorporated by reference in their entireties.

BACKGROUND

Technical Field

The present invention relates to a method for producing a nitride semiconductor laminate, a silicon semiconductor product, a method for inspecting a film quality, and a method for inspecting a semiconductor growth device.

Description of Related Art

As a non-contact and non-destructive method for inspecting physical properties of a thin film of semiconductor crystals grown on a substrate, for example, Fourier transform infrared spectroscopy (FT-IR method) is known (see, for example, Patent Document 1).

Patent Document 1: Japanese Unexamined Patent Publication No. 1992-120404

However, regarding crystals of group III nitride semiconductors represented by gallium nitride (GaN), it has been difficult to properly inspect physical properties of a homoepitaxial film comprising crystals having the same composition as the composition of the substrate, for example using the FT-IR method, because an influence of dislocation scattering is large, and there is no difference in an absorption coefficient in an infrared region (IR), especially at low carrier concentration of $1 \times 10^{17}$ $cm^{-3}$ or less.

An object of the present invention is to provide a new technique that enables non-destructive and non-contact inspection of physical properties such as film quality of a homoepitaxial film of group III nitride semiconductor crystals, for example, by using a FT-IR method.

SUMMARY OF THE INVENTION

According to an aspect of the present invention, there is provided a method for producing a nitride semiconductor laminate in which a thin film is homoepitaxially grown on a substrate comprising group III nitride semi conductor crystals, the method including:

homoepitaxially growing a thin film on a substrate, using the substrate in which a dislocation density on its main surface is $5 \times 10^6$ pieces/cm or less, a concentration of oxygen therein is less than $1 \times 10^{17}$ $cm^{-3}$, and a concentration of impurities therein other than n-type impurity is less than $1 \times 10^{17}$ at $\cdot cm^{-3}$; and inspecting a film quality of the thin film formed on the substrate, wherein in the inspection of the film quality, the film quality of the thin film is inspected by detecting a deviation of an amount of reflected light at a predetermined wavenumber determined in a range of 1,600 $cm^{-1}$ or more and 1,700 $cm^{-1}$ or less in a reflection spectrum obtained by irradiating the thin film on the substrate with infrared light, from an amount of reflected light at the predetermined wavenumber determined according to a film thickness of the thin film, a carrier concentration of the substrate, and a carrier concentration of the thin film.

According to another aspect of the present invention, there is provided a method for inspecting a film quality, for inspecting the film quality of the thin film in the nitride semiconductor laminate in which a thin film is homoepitaxially grown on a substrate comprising group III nitride semiconductor crystals, the method including:

inspecting the film quality of the thin film by detecting a deviation of an amount of reflected light at a predetermined wavenumber determined in a range of 1,600 $cm^{-1}$ or more and 1,700 $cm^{-1}$ or less, from an amount of reflected light at the predetermined wavenumber determined according to a film thickness of the thin film, a carrier concentration of the substrate, and a carrier concentration of the thin film, using the substrate in which a dislocation density on its main surface is $5 \times 10^6$ pieces/cm² or less, a concentration of oxygen is less than $1 \times 10^{17}$ at $\cdot cm^{-3}$, and a concentration of impurities other than n-type impurity is less than $1 \times 10^{17}$ at $\cdot cm^{-3}$.

According to further another aspect of the present invention, there is provided a method for producing a nitride semiconductor laminate in which a thin film is homoepitaxially grown on a substrate comprising group III nitride semiconductor crystal, the method including:

homoepitaxially growing a thin film on a substrate, using the substrate in which a dislocation density on its main surface is $5 \times 10^6$ pieces/cm² or less, a concentration of oxygen is less than $1 \times 10^{17}$ at $\cdot cm^{-3}$, and a concentration of impurities other than n-type impurity is less than $1 \times 10^{17}$ at $\cdot cm^{-3}$; and inspecting a film quality of the thin film formed on the substrate, the inspection of the film quality including:

acquiring an actually measured first reflection spectrum by irradiating the thin film on the substrate with infrared light;

acquiring a calculated second reflection spectrum, using an optical model showing a laminated structure of the nitride semiconductor laminate and a dielectric function model showing a dielectric function of the nitride semiconductor laminate, which is acquiring the second reflection spectrum by setting a film thickness of the thin film, a carrier concentration of the substrate and a carrier concentration of the thin film in the optical model and the dielectric function model, so that a fringe pattern of the second reflection spectrum is fitted to a fringe pattern of the first reflection spectrum; and detecting a deviation of an amount of reflected light at a predetermined wavenumber determined in a range of 1,600 $cm^{-1}$ or more and 1,700 $cm^{-1}$ or less, from an amount of reflected light at the predetermined wavenumber.

According to further another aspect of the present invention, there is provided a nitride semiconductor laminate, including:

a substrate comprising group III nitride semiconductor crystals; and a thin film homoepitaxially grown on the substrate, wherein a dislocation density on a main surface of the substrate is $5 \times 10^6$ pieces/cm$^2$ or less, a concentration of oxygen in the substrate is less than $1 \times 10^{17}$ at ·cm$^{-3}$, and a concentration of impurities other than n-type impurity in the substrate is less than $1 \times 10^{17}$ at ·cm$^{-3}$, and when taking into consideration of a deviation of an amount of reflected light at a predetermined wavenumber in a reflection spectrum obtained by irradiating the thin film on the substrate with infrared light, from an amount of reflected light at the predetermined wavenumber determined according to a film thickness of the thin film, a carrier concentration of the substrate, and a carrier concentration of the thin film, a maximum value of a degree of a deviation in a wavenumber range of 1,600 cm$^{-1}$ or more and 1,700 cm$^{-1}$ or less is larger than any of a maximum value of a degree of a deviation in a wavenumber range of 1,500 cm$^{-1}$ or more and less than 1,600 cm$^{-1}$ and a maximum value of a degree of a deviation in a wavenumber range of more than 1,700 cm$^{-1}$ and 1,800 cm$^{-1}$ or less.

According to further another aspect of the present invention, there is provided a nitride semiconductor laminate, including:

a substrate comprising group III nitride semiconductor crystals; and a thin film homoepitaxially grown on the substrate, wherein a dislocation density on its main, surface is $5 \times 10^6$ pieces/cm$^2$ or less, a concentration of oxygen is less than $1 \times 10^{17}$ at ·cm$^{-3}$, and a concentration of impurities other than n-type impurity is less than $1 \times 10^{17}$ at ·cm$^{-3}$, and when taking into consideration of a deviation of an amount of reflected light at a predetermined wavenumber in a reflection spectrum obtained by irradiating the thin film on the substrate with infrared light, from an amount of reflected light at the predetermined wavenumber determined according to the film thickness of the thin film, the carrier concentration of the substrate, and the carrier concentration of the thin film, any one of a degree of a maximum value of the deviation in the wavenumber range of 1,600 cm$^{-1}$ or more and 1,700 cm$^{-1}$ or less, a maximum value of the deviation in the wavenumber range of 1,500 cm$^{-1}$ or more and less than 1,600 cm$^{-1}$, and a maximum value of the deviation in the wavenumber range of more than 1,700 cm$^{-1}$ and 1,800 cm$^{-1}$ or less, is less than 1% as a difference in intensity reflectance.

According to further another aspect of the present invention, there is provided a method for inspecting a film quality of a multilayer film in a nitride semiconductor laminate obtained by homoepitaxially growing the multilayer film in which multiple layers comprising a group III nitride semiconductor are laminated on a substrate comprising group III nitride semiconductor crystals, the method including:

inspecting a film quality of a thin film by detecting a deviation of an amount of reflected light at a predetermined wavenumber determined in a range of 1,600 cm$^{-1}$ or more and 1,700 cm$^{-1}$ or less in a reflection spectrum obtained by irradiating the multilayer film on the substrate with infrared light, from an amount of reflected light at the predetermined wavenumber determined according to a film thickness of each layer of the multilayer film, a carrier concentration of the substrate, and a carrier concentration of each layer, using the substrate in which a dislocation density on its main surface is $5 \times 10^6$ pieces/cm$^2$ or less, a concentration of oxygen is less than $1 \times 10^{17}$ at ·cm$^{-3}$, and a concentration of impurities other than n-type impurity is less than $1 \times 10^{17}$ at ·cm$^{-3}$, wherein the multilayer film is a film grown by adjusting a thickness of each layer and a carrier concentration of each layer so that an amount of reflected light determined according to the thickness of each layer, the carrier concentration of the substrate, and the carrier concentration of each layer, does not have a maximum or minimum in a wavenumber range of 1,600 cm$^{-1}$ or more and 1,700 cm$^{-1}$ or less.

According to further another aspect of the present invention, there is provided a method for inspecting a semiconductor growth device, for homoepitaxially growing a group III nitride semiconductor on a substrate comprising crystals of a group fit nitride semiconductor, the method including:

homoepitaxially growing a multilayer film in which multiple layers comprising group III nitride semiconductors are laminated on a substrate, using the substrate in which a dislocation density on its main surface is $5 \times 10^6$ pieces/cm$^2$ or less, a concentration of oxygen is less than $1 \times 10^{17}$ at ·cm$^{-3}$, and a concentration of impurities other than n-type impurity is less than $1 \times 10^{17}$ at cm$^{-3}$; and inspecting a film quality of the multilayer film formed on the substrate, wherein in the inspection of the film quality, the film quality of the multilayer film is inspected by detecting a deviation of an amount of reflected light at a predetermined wavenumber determined in a range of 1,600 cm$^{-1}$ or more and 1,700 cm$^{-1}$ or less in a reflection spectrum obtained by irradiating the multilayer film on the substrate with infrared light, from an amount of reflected light at the predetermined wavenumber determined according to a film thickness of each layer of the multilayer film, a carrier concentration of the substrate, and a carrier concentration of each layer, and in the epitaxial growth of the multilayer film, the multilayer film is grown by adjusting a thickness of each layer and the carrier concentration of each layer so that an amount of reflected light determined according to the thickness of each layer, the carrier concentration of the substrate, and the carrier concentration of each layer, does not have a maximum or minimum in a wavenumber range of 1,600 cm$^{-1}$ or more and 1,700 cm$^{-1}$ or less.

Advantage of the Invention

According to the present invention, there is provided a new technique that enables non-destructive and non-contact inspection of a film quality for homoepitaxial films of group III nitride semiconductor crystals.

DETAILED DESCRIPTION OF THE INVENTION

First Embodiment

Hereinafter, a first embodiment of the present invention will be described with reference to the drawings.

The nitride semiconductor laminate 1 described by way of example in this embodiment is, for example, a substrate-like structure used as a substrate when producing a semiconductor device as a Schottky barrier diode (SBD). Since it is used as a substrate for a semiconductor device, the nitride semiconductor laminate 1 may be hereinafter referred to as an "intermediate body" or an "intermediate precursor".

Figure 1:
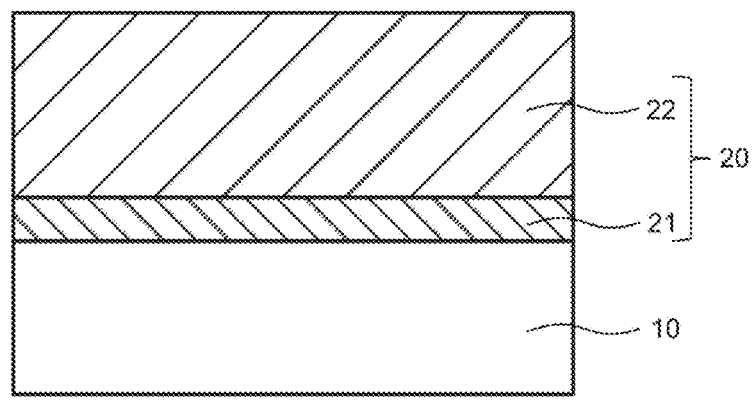
FIG. 1 is a cross-sectional view schematically illustrating schematic configuration example of a nitride semiconductor laminate 1 according to a first and second) embodiment of the present invention.

As illustrated in FIG. 1, the nitride semiconductor laminate (intermediate body) 1 according to the present embodiment is configured to include at least a substrate 10 and a semiconductor layer 20 which is a thin film formed on the substrate 10.

(1-i) Detailed Configuration of the Substrate 10

Subsequently, the substrate 10 constituting the nitride semiconductor laminate (intermediate body) 1 will be described in detail. Note that in the following, a main surface of the substrate or the like mainly refers to an upper main surface of the substrate or the like, and may be a surface of the substrate or the like. Further, a back surface of the substrate or the like refers to a lower main surface of the substrate or the like.

Figure 2:
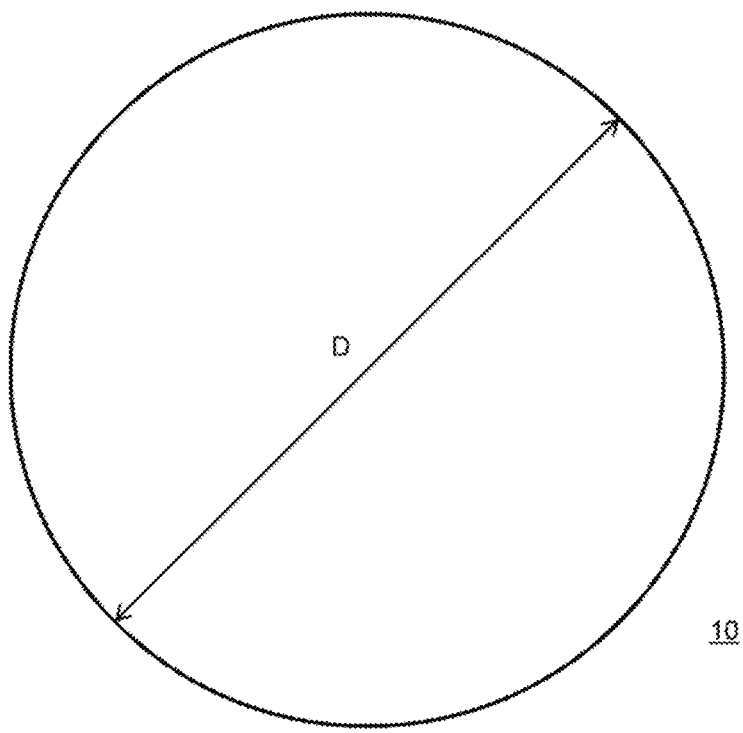
FIG. 2 is a view illustrating a configuration example of a substrate 10 in a nitride semiconductor laminate according to the first (and second) embodiment of the present invention, in which A is a schematic plan view, and B is a schematic cross-sectional view.
Figure 2:
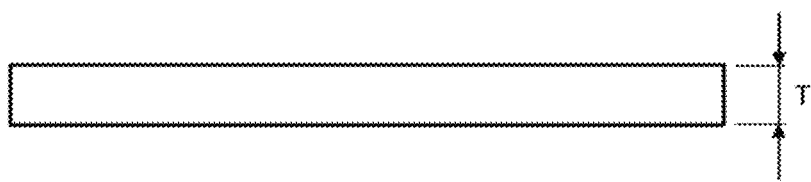

As illustrated in FIG. 2, the substrate 10 is formed in a disk shape, and comprises a single crystal of a group III nitride semiconductor, specifically, for example, a single crystal of gallium nitride (GaN).

A plane orientation of the main surface of the substrate 10 is, for example, a (0001) plane (+c plane, Ga polar plane).

However, for example, it may be 000-1 plane (−c plane, N polar plane).

The GaN crystal constituting the substrate 10 may have a predetermined off angle with respect to the main surface of the substrate 10. The off-angle refers to an angle formed by a normal direction of the main surface of the substrate 10 and a main axis (c-axis) of the GaN crystal constituting the substrate 10. Specifically, the off angle of the substrate 10 is, for example, 0° or more and 1.2° or less, and is also conceivable that the off angle is larger than 0° or more and 1.2° or less, and is 2° or more and 4° or less. further, for example, the GaN crystal may be a so-called double off having an off angle in each of a direction and m direction.

Further, a dislocation density on the main surface of the substrate 10 is, for example, $5 \times 10^6$ pieces/cm$^2$ or less. When the dislocation density on the main surface of the substrate 10 is more than 5×10⁶ pieces/cm², there is a possibility that a local withstand voltage of a semiconductor layer 20 formed on the substrate 10 will be decreased. On the other hand, as in the present embodiment, by setting the dislocation density on the main surface of the substrate 10 to 5×10⁶ pieces/cm² or less, a local decrease of withstand voltage in the semiconductor layer 20 formed on the substrate 10, can be suppressed.

Note that the main surface of the substrate 10 is an epiready surface, and a surface roughness (arithmetic mean roughness Ra) of the main surface of the substrate 10 is, for example, 10 nm or less, preferably 5 nm or less.

Further, a diameter D of the substrate 10 is not particularly limited, but is, for example, 25 mm or more. When the diameter D of the substrate 10 is less than 25 mm, productivity tends to decrease when producing a semiconductor device using the substrate 10. Therefore, the diameter D of the substrate 10 is preferably 25 mm or more. Further, thickness T of the substrate 10 is, for example, 150 μm or more and 2 mm or less. When the thickness T of the substrate 10 is less than 150 μm, mechanical strength of the substrate 10 may decrease and it may be difficult to maintain a self-supporting state. Therefore, the thickness T of the substrate 10 is preferably 150 μm or more. Here, for example, the diameter D of the substrate 10 is 2 inches, and the thickness T of the substrate 10 is 400 μm.

Further, the substrate 10 contains, for example, an n-type impurity (donor). Examples of the n-type impurity contained in the substrate 10 include silicon (Si) and germanium (Ge). Further, examples of the n-type impurity include oxygen (O), O and Si, O and Ge, O and Si and Ge, in addition to Si and Ge. Since the n-type impurity are doped in the substrate 10, free electrons having a predetermined concentration are generated in the substrate 10.

(Regarding Absorption Coefficient, Etc.)

In the present embodiment, the substrate 10 satisfies a predetermined requirement for an absorption coefficient in an infrared region. Thereby, the substrate 10 has a dependency between a carrier concentration in the substrate 10 and an absorption coefficient in the infrared region, as will be described in detail later.

Details will be described below.

When producing the nitride semiconductor laminate 1, or when producing a semiconductor device using the nitride semiconductor laminate 1, or the like, for example, as will be described below, heating of the substrate 10 may be performed, like in epitaxially growing the semiconductor layer 20 on the substrate 10 and activating impurities in the semiconductor layer 20. For example, when the substrate 10 is heated by irradiating the substrate 10 with infrared rays, it is important to set heating conditions based on the absorption coefficient of the substrate 10.

Figure 3:
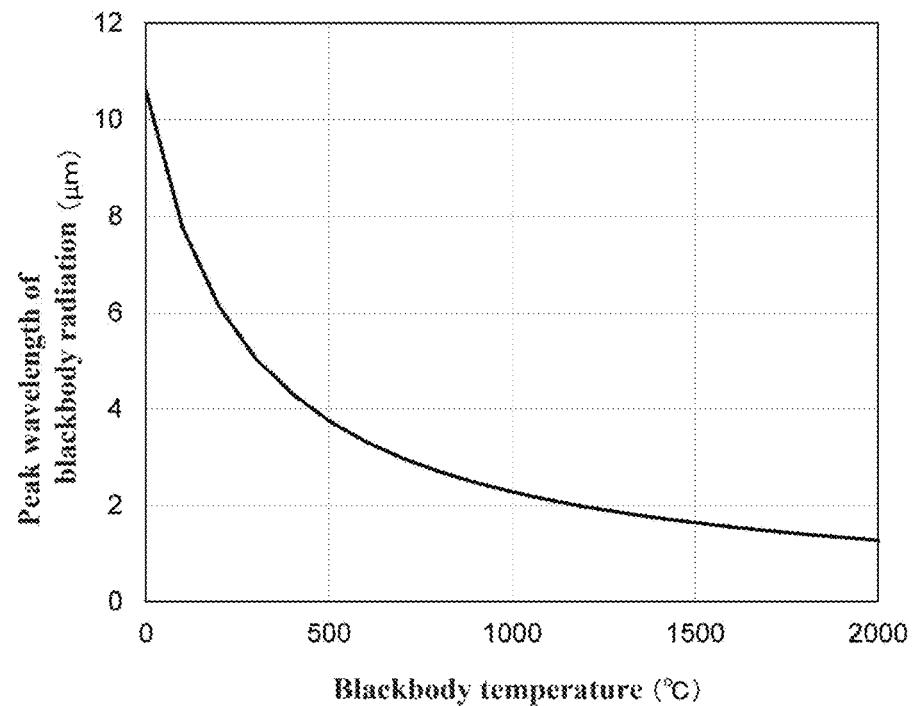
FIG. 3 is a view illustrating Wien's deviation law.

Here, FIG. 3 is a view illustrating a Wien's deviation law. In FIG. 3, a horizontal axis shows a blackbody temperature (° C.), and a vertical axis shows a peak wavelength (μm) of blackbody radiation. According to the Wien's deviation law illustrated in FIG. 3, the peak wavelength of blackbody radiation is inversely proportional to the blackbody temperature. When the peak wavelength is λ (μm) and the temperature is T (° C.), they have a relationship of λ=2,896/(T+273). When it is assumed that a radiation from a predetermined heating source in the heating of the substrate 10 is the blackbody radiation, infrared rays having a peak wavelength corresponding to the heating temperature are emitted from the heating source to the substrate 10. For example, when the temperature is about 1,200° C., the infrared peak wavelength λ is 2 μm, and when the temperature is about 600° C., the infrared peak wavelength λ is 3.3 μm.

When the substrate 10 is irradiated with infrared rays having such a wavelength, absorption by free electrons (free carrier absorption) occurs in the substrate 10, which causes the substrate 10 to be heated.

Therefore, in the present embodiment, based on the free carrier absorption of the substrate 10, the absorption coefficient in the infrared region of the substrate 10 satisfies the following predetermined requirements.

Figure 4:
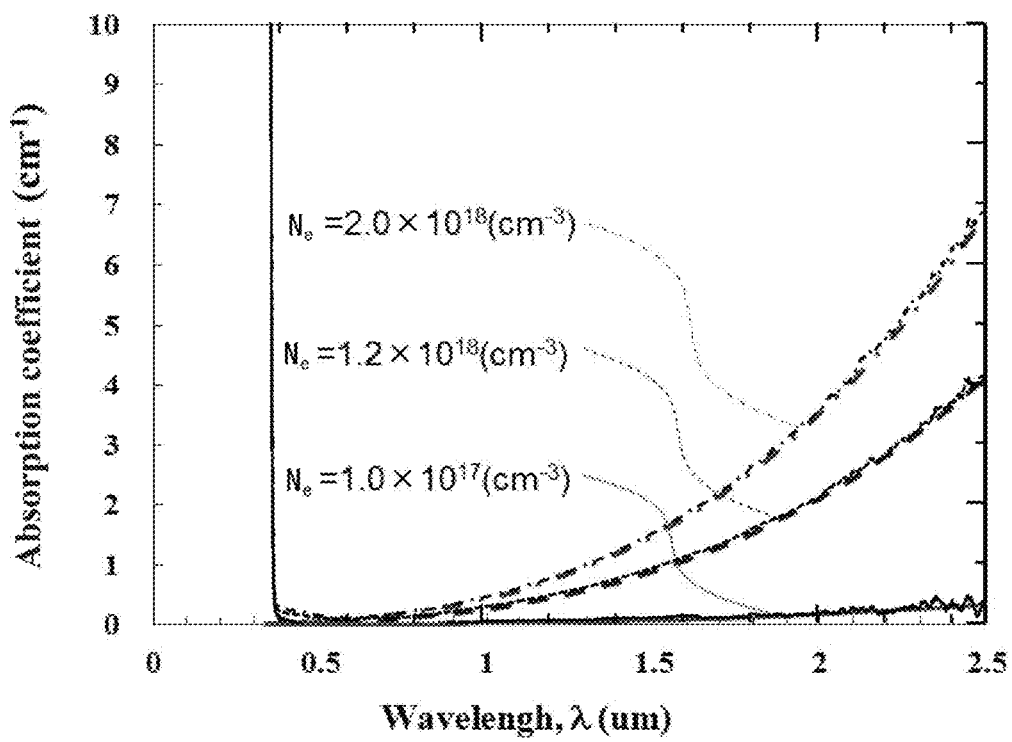
FIG. 4 is a view illustrating a free electron concentration dependence of an absorption coefficient measured at room temperature (27° C.) in a GaN crystal produced by a production method according to the first (and second) embodiment of the present invention.

FIG. 4 is a view illustrating a dependence of the absorption coefficient measured at room temperature (27° C.), on the free electron concentration in the GaN crystal produced by the production method according to the present embodiment. In addition FIG. 4 illustrates the measurement results of a substrate comprising GaN crystal produced by doping Si by a production method described later. In FIG. 4, a horizontal axis shows a wavelength (nm), and a vertical axis shows an absorption coefficient α (cm⁻¹) of the GaN crystal. Further, the free electron concentration in the GaN crystal is defined as $N_e$, and the absorption coefficient α of the GaN crystal is plotted for each predetermined free electron concentration $N_e$. As illustrated in FIG. 4, in the GaN crystal produced by the production method described later, the absorption coefficient α in the GaN crystal tends to increase (monotonically increase) as a wavelength increases due to the free carrier absorption, in a wavelength range of at least 1 μm or more and 3.3 μm or less. Further, as the free electron concentration $N_e$ in the GaN crystal increases, the free carrier absorption in the GaN crystal tends to increase.

Since the substrate 10 of this embodiment comprises the GaN crystal produced by the production method described later, it has small crystal distortion and is in a state of containing almost no impurities other than oxygen (O) and n-type impurity (for example, impurities compensating for n-type impurity). Therefore, the free electron concentration dependence of the absorption coefficient is shown as illustrated in FIG. 4. As a result, in the substrate 10 of the present embodiment, the absorption coefficient in the infrared region can be approximated as a function of free carrier concentration and wavelength as follows.

Specifically, when the wavelength is λ (μm), the absorption coefficient of the substrate 10 at 27° C. is α (cm⁻¹), the free electron concentration in the substrate 10 is $N_e$ (cm⁻³), and K and a are constants, the absorption coefficient α in a wavelength range of at least 1 μm or more and 3.3 μm or less (preferably 1 μm or more and 2.5 μm or less) is approximated by equation (1), in the substrate 10 of the present embodiment.

$$\alpha = N_e K \lambda^a \quad (1) \text{ (wherein, } 1.5\times10^{-19} \le K \le 6.0\times10^{-19}, a=3)$$

Note that "The absorption coefficient α is approximated by equation (1)" means that the absorption coefficient α is approximated by equation (1) by the method of least squares. That is, the above provision includes not only a case where the absorption coefficient completely matches the equation (1) (satisfies the equation (1)) but also a case where the equation (1) is satisfied within a predetermined error range. Note that a predetermined error is, for example, within ±0.1α, preferably within ±0.01α at a wavelength of 2 μm.

The absorption coefficient α in the above wavelength range may be considered to satisfy the equation (1').

$$1.5\times10 N_e \lambda^3 \le \alpha \le 6.0\times10^{-19} N_e \lambda^3 \quad (1')$$

Further, in the substrates 10 satisfying the above provision, particularly in the substrate having extremely low crystal strain and extremely high purity (that is, low impurity concentration), the absorption coefficient α in the above wavelength range approximately satisfies equation (1").

$$\alpha = 2.2 \times 10^{-19} N_e \lambda^3 \quad (1'')$$

Similarly to the above provisions, the provision that "the absorption coefficient α is approximated by equation (1')" includes not only a case where the absorption coefficient completely matches the equation (1) (satisfies the equation (1')) but also a case where the equation (1') is satisfied within a predetermined error range. Note that a predetermined error is, for example, within ±0.1α, preferably within ±0.01α at a wavelength of 2 μm.

In FIG. 4 described above, a measured value of the absorption coefficient α in the GaN crystal produced by the production method described later is shown by a thin line. Specifically, the measured value of the absorption coefficient α when the free electron concentration $N_e$ is $1.0 \times 10^{17}$ cm$^{-3}$ is shown by a thin solid line, the measured value of the absorption coefficient α when the free electron concentration $N_e$ is $1.2 \times 10^{18}$ cm$^{-3}$ is shown by a thin dotted line, and the measured value of the absorption coefficient α when the free electron concentration $N_e$ is $2.0 \times 10^{18}$ cm$^{-3}$ is shown by a thin alternate long and short dash line. On the other hand, in the above FIG. 4, the function of the above equation (1) is shown by a thick line. Specifically, the function of the equation (1) when the free electron concentration $N_e$ is $1.0 \times 10^{17}$ cm$^{-3}$ is shown by a thick solid line, and the function of the equation (1) when the free electron concentration $N_e$ is $1.2 \times 10^{18}$ cm$^{-3}$ is shown by a thick dotted line, and the function of the equation (1) when the free electron concentration $N_e$ is $2.0 \times 10^{18}$ cm$^{-3}$ is shown by a thick alternate long and short dash line. As illustrate in FIG. 4, the measured value of the absorption coefficient α in the GaN crystal produced by the production method described later can be accurately fitted by the function of the equation (1). Note that in the case of FIG. 4 (in the case of Si doping), when $K = 2.2 \times 10^{-19}$, the absorption coefficient α is accurately approximated by equation (1).

As described above, since the absorption coefficient of the substrate 10 is approximated by equation (1), the absorption coefficient of the substrate 10 can be accurately designed based on the concentration $N_e$ of the free electrons in the substrate 10.

Further in the present embodiment, for example, the absorption coefficient α of the substrate 10 satisfies equation (2) in a wavelength range of at least 1 μm or more and 3.3 μm or less.

$$0.15\lambda^3 \leq \alpha \leq 6\lambda^3 \quad (2)$$

If $\alpha < 0.15\lambda^3$, the substrate 10 cannot sufficiently absorb infrared rays, and the heating of the substrate 10 may become unstable. In contrast, by satisfying $0.15\lambda^3 \leq \alpha$, infrared rays can be sufficiently absorbed by the substrate 10, and the substrate 10 can be heated stably. On the other hand, when satisfying $6\lambda^3 < \alpha$, it corresponds to the concentration of n-type impurity in the substrate 10 exceeding a predetermined value ($1 \times 10^{19}$ at ·cm$^{-3}$ or more) as described later, and the crystallinity of the substrate 10 may decrease. In contrast, by satisfying $\alpha \leq 6\lambda^3$, it corresponds to the concentration of n-type impurity in the substrate 10 being equal to or less than a predetermined value, and good crystallinity of the substrate 10 can be ensured.

The absorption coefficient α of the substrate 10 preferably satisfies equation (2') or equation (2").

$$0.15\lambda^3 \leq \alpha \leq 3\lambda^3 \quad (2')$$

$$0.15\lambda^3 \leq \alpha \leq 1.2\lambda^3 \quad (2'')$$

This makes it possible to stably heat the substrate 10 while ensuring better crystallinity of the substrate 10.

Further, in the present embodiment, for example, when a difference between a maximum value and a minimum value of the absorption coefficient α in the main surface of the substrate 10 (a difference obtained by subtracting the minimum value from the maximum value; hereinafter, also referred to as "the difference in the in-plane absorption coefficient of the substrate 10") defined as Δα, Δα (cm$^{-1}$) satisfies equation (3).

$$\Delta\alpha \leq 1.0 \quad (3)$$

When satisfying Δα>1.0, the heating efficiency due to infrared irradiation may become non-uniform in the main surface of the substrate 10. In contrast, by satisfying Δα≤1.0, the heating efficiency due to infrared irradiation can be made uniform in the main surface of the substrate 10.

It is preferable that Δα satisfies equation (3').

$$\Delta\alpha \leq 0.5 \quad (3')$$

By satisfying Δα≤0.5, the heating efficiency due to infrared irradiation can be stably made uniform in the main surface of the substrate 10.

The provision of the equations (2) and (3) regarding the absorption coefficients α and Δα can be replaced with, for example, the provision at a wavelength of 2 μm.

Namely, in the present embodiment, for example, the absorption coefficient of the substrate 10 at a wavelength of 2 μm is 1.2 cm$^{-1}$ or more and 48 cm$^{-1}$ or less. The absorption coefficient of the substrate 10 at a wavelength of 2μ, is preferably 1.2 cm$^{-1}$ or more and 24 cm$^{-1}$ or less, and more preferably 1.2 cm$^{-1}$ or more and 9.6 cm$^{-1}$ or less.

Further, in the present embodiment, for example, the difference between the maximum value and the minimum value of the absorption coefficient at a wavelength of 2 μm in the main surface of the substrate 10 is within 1.0 cm$^{-1}$, preferably within 0.5 cm$^{-1}$.

An upper limit value of the in-plane absorption coefficient difference of the substrate 10 has been described. However, a lower limit of the in-plane absorption coefficient difference of the substrate 10 is preferably zero because the smaller it is, the better. Note that even if the in-plane absorption coefficient difference of the substrate 10 is 0.01 cm$^{-1}$, the effect of the present embodiment can be sufficiently obtained.

Here, the requirements for the absorption coefficient of the substrate 10 are defined at a wavelength of 2 μm which corresponds to a peak wavelength of infrared rays when a temperature is about 1,200° C. However, the effect of satisfying the above requirements for the absorption coefficient of the substrate 10 is not limited to when the temperature is about 1,200° C. This is because a spectrum of infrared rays emitted from a heating source has a predetermined wavelength width according to Stefan-Boltzmann's law, and includes a component having a wavelength of 2 μm even if the temperature is other than 1,200° C., and therefore if the absorption coefficient of the substrate 10 satisfies the above requirements at the wavelength of 2 μm corresponding to the temperature of 1,200° C., the absorption coefficient of the substrate 10 and the difference between the maximum value and the minimum value of the absorption coefficient in the main surface of the substrate 10 are within a predetermined range even at wavelengths other than 1,200° C. Thereby, the substrate 10 can be stably heated, and the heating efficiency for the substrate 10 can be made uniform in the main surface even if the temperature is other than 1,200° C.

Above FIG. 4 is a result of measuring the absorption coefficient of the GaN crystal at room temperature (27° C.). Therefore, when considering the absorption coefficient of the substrate 10 under a predetermined temperature condition in heating the substrate 10, it is necessary to consider how the free carrier absorption of the GaN crystal under a predetermined temperature condition changes with respect to the free carrier absorption of the GaN crystal under a room temperature condition.

Figure 5:
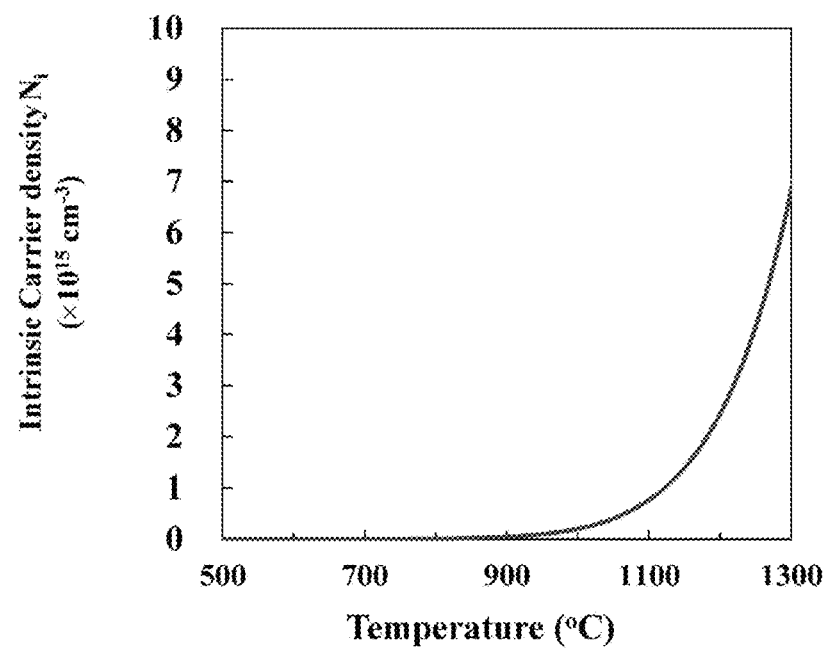
FIG. 5 is a view illustrating an intrinsic carrier concentration with respect to a temperature of a GaN crystal.

FIG. 5 is a view illustrating an intrinsic carrier concentration with respect to the temperature of the GaN crystal. As illustrated in FIG. 5, in the GaN crystal constituting the substrate 10, as the temperature rises, the concentration of the intrinsic carrier concentration Ni that is thermally excited between bands (between a valence band and a conduction band) increases. However, even if the temperature of the GaN crystal is around 1,300° C., the concentration of the intrinsic carrier concentration Ni that is thermally excited between the bands of the GaN crystal is less than $7 \times 10^{15}$ cm$^{-3}$, which is sufficiently below the concentration (eg $1 \times 10^{17}$ cm$^{-3}$) of the free carriers produced in the GaN crystal by doping with n-type impurity. That is, it can be said that concentration of the free carrier in the GaN crystal is within a so-called exogenous region such that the concentration of the free carrier is determined by doping with n-type impurity under a temperature condition where the temperature of the GaN crystal is less than 1,300° C.

That is, in the present embodiment, the concentration of the intrinsic carrier thermally excited between the bands of the substrate 10 under a temperature condition (room temperature (27° C.) or higher and 1,250° C. or lower) at least in a production process of the semiconductor laminate 1 and the semiconductor device 2 described later, is lower than the concentration of the free electrons generated in the substrate 10 by doping with n-type impurity under the temperature condition of room temperature (for example, 1/10 times or less). Thereby, it can be considered that the concentration of the free carrier in the substrate 10 under a predetermined temperature condition in heating the substrate 10 is substantially equal to the concentration of the free carrier in the substrate 10 under a temperature condition of room temperature, and it can be considered that the absorption of the free carrier under a predetermined temperature condition is approximately equal to the absorption of the free carrier at room temperature. That is, as described above, when the absorption coefficient in the infrared region of the substrate 10 satisfies the above-described predetermined requirements at room temperature, it can be considered that the absorption coefficient in the infrared region of the substrate 10 substantially maintains the above-described predetermined requirement.

Further, in the substrate 10 of the present embodiment, the absorption coefficient α in the wavelength range of at least 1 μm or more and 3.3 μm or less is approximated by the equation (1), and therefore at a predetermined wavelength λ, the absorption coefficient α of the substrate 10 has a relationship substantially proportional to the free electron concentration $N_e$.

Figure 6:
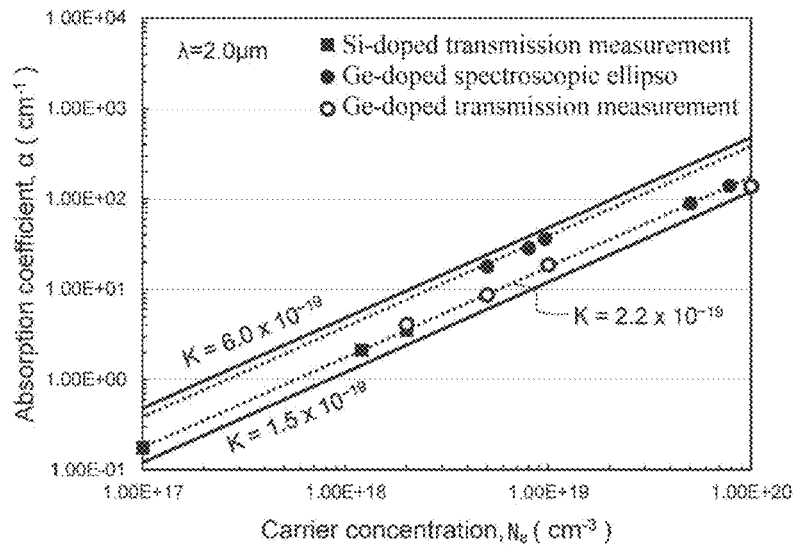
FIG. 6 A is a view illustrating a relationship of an absorption coefficient at wavelength 2 μm with respect to a free electron concentration, and B is a view illustrating a relationship of an absorption coefficient at wavelength 2 μm with respect to a free electron concentration in a GaN crystal produced by the production method according to the first (and second) embodiment of the present invention.
Figure 6:
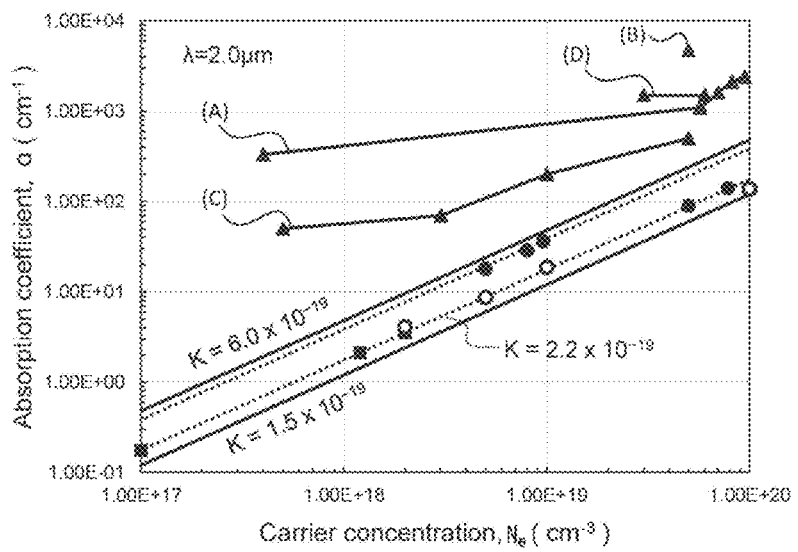

FIG. 6A is a view illustrating a relationship between the absorption coefficient at a wavelength of 2 μm and a free electron concentration in the GaN crystal produced by the production method according to the present embodiment. In FIG. 6A, a lower solid line ($\alpha = 1.2 \times 10^{-18}$ n) is a function in which $K=1.5 \times 10^{-19}$ and $\lambda=2.0$ are substituted into the equation (1), and an upper solid line ($\alpha = 4.8 \times 10^{-18}$ n) is a function in which $K=6.0 \times 10^{-19}$ and $\lambda=2.0$ are substituted into the equation (1). Further, FIG. 6A illustrates not only Si-doped GaN crystal but also Ge-doped GaN crystal, and also illustrates a result of measuring the absorption coefficient by a transmission measurement and a result of measuring the absorption coefficient by a spectroscopic ellipsometry method. As illustrated in FIG. 6A, when the wavelength λ is 2.0 μm, the absorption coefficient α of the GaN crystal produced by a production method described later has a relationship substantially proportional to the free electron concentration Ne. Further, a measured value of the absorption coefficient α in the GaN crystal produced by the production method described later can be fitted accurately by the function of the equation (1) within a range of $1.5 \times 10^{-19} \le K \le 6.0 \times 10$ cm$^{-19}$.

The GaN crystal produced by the production method described later has high purity (that is, low impurity concentration) and good thermal and electrical properties, and therefore the measured value of the absorption coefficient α can often be accurately fitted by the function of the equation (1) when satisfying $K=2.2 \times 10^{-19}$, that is, by $\alpha=1.8 \times 10^{-18}$ n.

In the present embodiment, based on the above-described absorption coefficient α of the substrate 10 being proportional to the free electron concentration $N_e$, the free electron concentration $N_e$ in the substrate 10 satisfies the following predetermined requirements.

In the present embodiment, for example, the free electron concentration $N_e$ in the substrate 10 is $1.0 \times 10^{18}$ cm$^{-3}$ or more and $1.0 \times 10^{19}$ cm$^{-3}$ or less. Thereby, from the equation (1), the absorption coefficient of the substrate 10 at a wavelength of 2 μm can be 1.2 cm$^{-1}$ or more and 48 cm$^{-1}$ or less. The free electron concentration $N_e$ in the substrate 10 is preferably $1.0 \times 10^{18}$ cm$^{-3}$ or more and $5.0 \times 10^{18}$ cm$^{-3}$ or less, and more preferably $1.0 \times 10^{18}$ cm$^{-3}$ or more and $2.0 \times 10^{18}$ cm$^{-3}$ or less. Therefore, the absorption coefficient of the substrate 10 at a wavelength of 2 μm can be preferably 1.2 cm$^{-1}$ or more and 24 cm$^{-1}$ or less, and more preferably 1.2 cm$^{-1}$ or more and 9.6 cm$^{-1}$ or less.

Further, as described above, when the difference between the maximum value and the minimum value of the absorption coefficient α in the main surface of the substrate 10 is Δα, the difference between the maximum and minimum values of the free electron concentration $N_e$ in the main surface of the substrate 10 is $\Delta N_e$, and the wavelength λ is 2.0 μm, the equation (4) can be obtained by differentiating the equation (1).

$$\Delta\alpha = 8K\Delta N_e \quad (4)$$

In the present embodiment, for example, the difference $\Delta N_e$ between the maximum value and the minimum value of the free electron concentration $N_e$ in the main surface of the substrate 10 is $8.3 \times 10^{17}$ cm$^{-3}$ or less, preferably $4.2 \times 10^{17}$ cm$^{-3}$ or less. Therefore, from the equation (4), the difference Δα between the maximum value and the minimum value of the absorption coefficient at the wavelength of 2 μm can be within 1.0 cm$^{-1}$, preferably 0.5 cm$^{-1}$ or less.

Although the upper limit value of $\Delta N_e$ has been described, a lower limit value of $\Delta N_e$ is preferably zero because the smaller it is, the better. Even if $\Delta N_e$ is $8.3 \times 10^{15}$ cm$^{-3}$, the effect of the present embodiment can be sufficiently obtained.

In the present embodiment, the free electron concentration $N_e$ in the substrate 10 is equal to the concentration of n-type impurity in the substrate 10, and the concentration of n-type impurity in the substrate 10 satisfies the following predetermined requirements.

In the present embodiment, for example, the concentration of n-type impurity in the substrate 10 is $1.0 \times 10^{18}$ at ·cm$^{-3}$ or more and $1.0 \times 10^{19}$ at cm$^{-3}$ or less. Therefore, the free electron concentration $N_e$ in the substrate 10 can be $1.0 \times 10^{18}$ cm$^{-3}$ or more and $1.0 \times 10^{19}$ cm$^{-3}$ or less. The concentration of n-type impurity in the substrate 10 is preferably $1.0 \times 10^{18}$ at ·cm$^{-3}$ or more and $5.0 \times 10^{18}$ at ·cm$^{-3}$ or less, and more preferably $1.0 \times 10^{18}$ at ·cm$^{-3}$ or more and $2.0 \times 10^{18}$ at ·cm$^{-3}$ or less. Therefore, the free electron concentration $N_e$ in the substrate 10 can be preferably $1.0 \times 10^{18}$ cm$^{-3}$ or more and $5.0 \times 10^{18}$ cm$^{-3}$ or less, and more preferably $1.0 \times 10^{18}$ cm$^{-3}$ or more and $2.0 \times 10^{18}$ cm$^{-3}$ or less.

Further, in the present embodiment, the difference between the maximum value and the minimum value of the concentration of n-type impurity in the main surface of the substrate 10 (hereinafter, also referred to as an in-plane concentration difference of n-type impurity) is within $8.3 \times 10^{17}$ at ·cm$^{-3}$, preferably within $4.2 \times 10^{17}$ at ·cm$^{-3}$. Therefore, the difference $\Delta N_e$ between the maximum value and the minimum value of the free electron concentration $N_e$ in the main surface of the substrate 10 can be equal to the in-plane concentration difference of n-type impurity, and is within $8.3 \times 10^{17}$ cm$^{-3}$, preferably within $4.2 \times 10^{17}$ cm$^{-3}$.

The upper limit value of the in-plane concentration difference of n-type impurity has been described. However, a lower limit value of the in-plane concentration difference of n-type impurity is preferably zero because the smaller it is, the better. Even if the in-plane concentration difference of the n-type impurity is $8.3 \times 10^{15}$ at ·cm$^{-3}$, the effect of the present embodiment can be sufficiently obtained.

Further, in the present embodiment, the concentration of each element in the substrate 10 satisfies the following predetermined requirements.

In the present embodiment, the concentration of O among Si, Ge and O used as n-type impurity, whose addition amount is relatively difficult to control, is extremely low, and therefore the concentration of n-type impurity in the substrate 10 is determined by a total concentration of Si and Ge, whose addition amount is relatively easy to control.

Namely, the concentration of O in the substrate 10 is negligibly low with respect to the total concentration of Si and Ge in the substrate 10, and it is for example, 1/10 or less. Specifically, for example, the concentration of O in the substrate is less than $1 \times 10^{17}$ at ·cm$^{-3}$, and on the other hand, the total concentration of Si and Ge in the substrate 10 is $1 \times 10^{18}$ at ·cm$^{-3}$ or more and $1.0 \times 10^{19}$ at ·cm$^{-3}$ or less. Therefore, the concentration of n-type impurity in the substrate 10 can be controlled by the total concentration of Si and Ge, which are relatively easy to control the amount of addition. As a result, the free electron concentration $N_e$ in the substrate 10 can be accurately controlled to be equal to the total concentration of Si and Ge in the substrate 10, and the difference $\Delta N_e$ between the maximum value and the minimum value of the free electron concentration in the main surface of the substrate 10 can be accurately controlled so as to satisfy a predetermined requirement.

Further, in the present embodiment, the concentration of impurities other than n-type impurity in the substrate 10 is negligibly low, with respect to the concentration of n-type impurity in the substrate 10 (that is, the total concentration of Si and Ge), and for example, it is 1/10 or less. Specifically, for example, the concentration of impurities other than n-type impurity in the substrate is less than $1 \times 10^{17}$ at ·cm$^{-3}$. This makes it possible to reduce the factors that hinder the generation of free electrons from n-type impurity. As a result, the free electron concentration $N_e$ in the substrate 10 can be accurately controlled to be equal to the concentration of n-type impurity in the substrate 10, and the difference $\Delta N_e$ between the maximum value and the minimum value of the free electron concentration in the main surface of the substrate 10 can be accurately controlled so as to satisfy a predetermined requirement.

The present inventors have confirmed that the concentration of each element in the substrate 10 can be stably controlled so as to satisfy the above requirements by adopting a production method described later.

According to the production method described later, the concentration of O and carbon (C) in the substrate 10 can be decreased to less than $5 \times 10^{15}$ at ·cm$^{-3}$, and further, it is found that each concentration of iron (Fe), chromium (Cr), boron B, etc., in the substrate 10 can be decreased to less than $1 \times 10^{15}$ at ·cm$^{-3}$. Further, according to this method, it is also found that the concentration of elements other than the above elements to less than a lower limit of detection in the measurement by secondary ion mass spectrometry (SIMS: Secondary ion Mass Spectrometry).

Further, in the substrate 10 produced by the production method described later in the present embodiment, it is estimated that the substrate 10 of the present embodiment has a higher mobility ($\mu$) than a conventional substrate, because an absorption coefficient by free carrier absorption is smaller than an absorption coefficient of a conventional substrate. Therefore, the resistivity of the substrate 10 of the present embodiment ($\rho = 1/eN_e\mu$) is lower than that of the conventional substrate, even when the free electron concentration in the substrate 10 of the present embodiment is equal to the free electron concentration in the conventional substrate. Specifically, when the free electron concentration $N_e$ in the substrate 10 is $1.0 \times 10^{18}$ cm$^{-3}$ or more and $1.0 \times 10^{19}$ cm$^{-3}$ or less, the resistivity of the substrate 10 is, for example, 2.2 mΩ·cm or more and 17.4 mΩ·cm or less.

(1-ii) Detailed Configuration of a Semiconductor Layer 20

Next, the semiconductor layer 20 constituting a nitride semiconductor laminate (intermediate) 1 will be described in detail.

The semiconductor layer 20 is formed by epitaxially growing on the main surface of the substrate 10. The semiconductor layer 20 comprises a single crystal of a group III nitride semiconductor, specifically, for example a single crystal of GaN, as in the case of the substrate 10. Further, since the semiconductor layer 20 is epitaxially grown on the substrate 10, a plane orientation is, for example, a (0001) plane (+c plane, Ga polar plane) or a 000-1 plane (−c plane, N polar plane as in the case of the substrate 10.

The off-angle of the GaN crystal constituting the semiconductor layer 20 is the same as that of the substrate 10.

In the present embodiment, the surface (main surface) of the semiconductor layer 20 satisfies a predetermined requirement for reflectance in an infrared region. Specifically, the reflectance on the surface of the semiconductor layer 20 is 5% or more and 30% or less in a wavelength range of at least 1 μm or more and 3.3 μm or less. Therefore, infrared rays can be sufficiently delivered to the substrate 10 in heating the substrate 10 (semiconductor laminate 1). As a result, the substrate 10 can be heated stably.

A surface roughness (arithmetic mean roughness Ra) of the surface of the semiconductor layer 20 is, for example, 1 nm or more and 30 nm or less. Therefore, the reflectance on the surface of the semiconductor layer 20 can be 5° or more and 30% or less in a wavelength range of at least 1 μm or more and 3.3 μm or less.

Next, a specific configuration of the semiconductor layer 20 of the present embodiment will be described.

As illustrated in FIG. 1, the semiconductor layer 20 includes, for example, a base n-type semiconductor layer 21 and a drift layer 22.

(Base n-Type Semiconductor Layer)

A base n-type semiconductor layer 21 is provided so as to be in contact with the main surface of the substrate 10, as a buffer layer that inherits the crystallinity of the substrate 10 and stably epitaxially grows the drift layer 22. Further, the base n-type semiconductor layer 12 is configured as an n-type GaN layer containing n-type impurity. Examples of the n-type impurity contained in the base n-type semiconductor layer 12 include Si and Ge, as in the case of the substrate 10. The concentration of the n-type impurity in the base n-type semiconductor layer 12 is substantially equal to that of the substrate 10, and is, for example, $1.0 \times 10^{18}$ at $\cdot cm^{-3}$ or more and $1.0 \times 10^{19}$ at $\cdot cm^{-3}$ or less.

A thickness of the base n-type semiconductor layer 21 is thinner than a thickness of the drift layer 22, and is for example, 0.1 μm or more and 3 μm or less.

(Drift Layer)

The drift layer 22 is provided on the base n-type semiconductor layer 21 and is configured as an n-type GaN layer containing n-type impurity with a low concentration. Examples of the n-type impurity in the drift layer 22 include Si and Ge, as in the n-type impurity in the base n-type semiconductor layer 21.

The concentration of the n-type impurity in the drift layer 22 is lower than the concentration of the n-type impurity in each of the substrate 10 and the base n-type semiconductor layer 21, and is, for example, $1.0 \times 10^{15}$ at $\cdot cm^{-3}$ or more and $5.0 \times 10^{16}$ at $\cdot cm^{-3}$ or less. By setting the concentration of the n-type impurity in the drift layer 22 to $1.0 \times 10^{18}$ at $\cdot cm^{-3}$ or more, on-resistance of the semiconductor device can be reduced. On the other hand, by setting the concentration of the n-type impurity in the drift layer 22 to $5.0 \times 10^{16}$ at $\cdot cm^{-3}$ or less, a predetermined withstand voltage of the semiconductor device can be secured.

The drift layer 22 is provided thicker than, for example, the base n-type semiconductor layer 21 in order to improve the withstand voltage of the semiconductor device. Specifically, the thickness of the drift layer 22 is, for example, 3 μm or more and 40 μm or less. By setting the thickness of the drift layer 22 to 3 μm or more, a predetermined withstand voltage of the semiconductor device can be secured. On the other hand, by setting the thickness of the drift layer 22 to 40 μm or less, the on-resistance of the semiconductor device can be reduced.

(1-iii) Structural Features of Nitride Semiconductor Laminate 1

Next, structural features of the nitride semiconductor laminate 1 in which the semiconductor layer 20 is formed on the substrate 10 will be described.

As already described, both the substrate 10 and the semiconductor layer 20 constituting the nitride semiconductor laminate 1 comprise a group III nitride semiconductor crystal (specifically, for example, a GaN single crystal) Namely, the semiconductor layer 20 which is a thin film comprising crystals having the same composition as that of the substrate 1 is formed on the substrate 10 by epitaxial growth. Accordingly, the nitride semiconductor laminate 1 corresponds to the semiconductor layer 20 homoepitaxially grown on a substrate 10.

Further, the substrate 10 constituting the nitride semiconductor laminate 1 satisfies a predetermined requirement for the absorption coefficient in the infrared region, and therefore, there is a dependency between the free electron concentration (carrier concentration) in the substrate 10 and the absorption coefficient in the infrared region. Having a dependency here means that there is a special correlation (necessity) between two or more events, and for example, means that when an event occurs, a specific event always appears depending on it.

Specifically, as described above, the absorption coefficient in the infrared region can be approximated as a function of free carrier concentration and wavelength. More specifically, regarding the dependence in the substrate 10, the absorption coefficient α in the wavelength range of at least 1 μm or more and 3.3 μm or less is approximated by the above-described equation (1), $$\alpha = N_e K \lambda^a \qquad (1)(1.5 \times 10^{-19} \leq K \leq 6.0 \times 10^{-19},\ a=3)$$

wherein the wavelength is λ (μm), the absorption coefficient of the substrate 10 at 27° C. is α ($cm^{-1}$), the free electron concentration (carrier concentration) in the substrate 10 is $N_e$ ($cm^{-3}$), and K and a are constants.

The dependency in the substrate 10 is not limited to the above-described example, and for example may include a case where there is a certain correlation such that the absorption coefficient decreases depending on the decrease of the carrier concentration.

Regarding the nitride semiconductor laminate 1 in which the semiconductor layer 20 is formed on the substrate 10, it is very important to control a film thickness of the semiconductor layer 20 that has been homoepitaxially grown. For that purpose, a method capable of measuring the film thickness of the semiconductor layer 20 in a non-contact and non destructive manner is required. For example, FT-IR method is known as a method for measuring a thin film obtained by homoepitaxial growth in a non-contact and non-destructive manner.

However, the nitride semiconductor laminate 1 in the present embodiment is a so-called GaN-on-GaN substrate in which a semiconductor layer 20 comprising a GaN crystal is homoepitaxially grown on the substrate 10 also comprising the GaN crystal. Regarding the group III nitride semiconductor crystal represented by the GaN crystal, the influence of dislocation scattering is large, and there is no difference in the absorption coefficient in the infrared region especially at a low carrier concentration of $1 \times 10^{17}$ $cm^{-3}$ or less. Therefore, when the substrate 10 and the semiconductor layer 20 are GaN-on-GaN substrates with the same composition comprising GaN crystal, it is common general knowledge that it is difficult in principle to measure the film thickness by the FT-IR method. More specifically, for example, even when a measurement is performed using light in the far infrared region with a wavenumber of 500 $cm^{-1}$ or less, regarding infrared light with a wavenumber of 1,000 $cm^{-1}$ or more (particularly, a wavenumber of 1,500 $cm^{-1}$ or more), an amount of absorption is very small, and the difference in absorption coefficient is difficult to become apparent. Therefore, it is a common general knowledge that it is difficult to measure the film thickness using the light in the infrared region.

However, in the present embodiment, as already described above, the dislocation density on the main surface of the substrate 10 constituting the nitride semiconductor laminate 1 is low, for example, $5 \times 10^6$ pieces/$cm^2$ or less. Moreover, the substrate 10 constituting the nitride semiconductor laminate 1 satisfies a predetermined requirement for the absorption coefficient in the infrared region. Therefore, there is a dependency between the carrier concentration in the substrate 10 and the absorption coefficient in the infrared region. Then, in the present embodiment, using such a substrate 10, the semiconductor layer 20 is homoepitaxially grown on the substrate 10 to form a nitride semiconductor laminate 1. By homoepitaxially growing, the GaN crystal constituting the semiconductor layer 20 is similar to the GaN crystal constituting the substrate 10 on which the semiconductor layer 20 is formed. That is, the semiconductor layer 20 has a low dislocation and has a dependency between the carrier concentration and the absorption coefficient in the infrared region like the substrate 10, even if there is a difference in carrier concentration between the semiconductor layer 20 and the substrate 10.

Accordingly, in the case of the nitride semiconductor laminate 1 of the present embodiment, the absorption coefficient in the infrared region becomes different depending on the difference in carrier concentration between the substrate 10 and the semiconductor layer 20, for example, even with a low carrier concentration of $1\times10^{17}$ $cm^{-3}$ or less, and as a result, it is possible to measure the film thickness with a light in the infrared region having a wavenumber of 1,000 $cm^{-1}$ or more (particularly, a wavenumber of 1,500 $cm^{-1}$ or more) using the FT-IR method. That is, it overturns a conventional knowledge of technique and enables film thickness measurement by the FT-IR method, even when the nitride semiconductor laminate 1 is the GaN-on-GaN substrate.

More specifically, in the nitride semiconductor laminate 1 in the present embodiment, since the substrate 10 satisfies the relationship approximated by the equation (1), even in the semiconductor layer 20 homoepitaxially grown on the substrate 10, the relationship between the carrier concentration $N_e$ and the absorption coefficient $\alpha$ is established. Accordingly, for example, even in the case of a low carrier concentration of $1\times10^{17}$ $cm^{-1}$ or less, there is definitely a difference in the absorption coefficient $\alpha$ depending on the carrier concentration $N_e$ in a wavelength range of at least 1 µm or more and 3.3 µm or less (that is, the wavenumber of 3,030 $cm^{-1}$ or more and 10,000 $cm^{-1}$ or less), and it is very suitable for measuring the film thickness using the FT-IR method.

As described above, the film thickness of the nitride semiconductor laminate 1 which is the GaN-on-GaN substrate can be measured by the FT-IR method, which means that in other words, the nitride semiconductor laminate 1 is configured as described below.

As will be described in detail later, in the FT-IR method, the object to be analyzed is irradiated with infrared light to obtain a reflection spectrum. The reflection spectrum referred to here is a plot of an amount of light reflected when irradiating infrared light (this is also referred to as "reflected light amount") with respect to the wavelength (wavenumber). Then, in the FT-IR method, the film thickness of the object to be analyzed is measured by analyzing a fringe pattern in the obtained reflection spectrum. The fringe pattern referred to here is a pattern representing an existence of fringes (interference fringes) in which a portion having a large amount of light and a portion having a small amount of light alternately occur due to an interference of light, and is a pattern generated in response to a change in an optical path length when obtaining a reflection spectrum.

Accordingly, the nitride semiconductor laminate 1 whose film thickness can be measured by the FT-IR method, has a fringe pattern in the reflection spectrum obtained by irradiating the semiconductor layer 20 on the substrate 10 with infrared light by the FT-IR method. When there is a fringe pattern in the reflection spectrum, by analyzing the fringe pattern, the film thickness of the semiconductor layer 20 can be measured by the FI-IR method, that is, the film thickness can be measured using the FT-IR method.

Further, since the nitride semiconductor laminate 1 of the present embodiment is configured to enable film thickness measurement using the FT-IR method, a film quality can also be inspected using the film thickness measurement as will be described in the second embodiment described later.

(2) Method for Producing the Nitride Semiconductor Laminate 1

Next, a procedure for producing the nitride semiconductor laminate 1 having the above-described configuration, including the film thickness measurement by the FT-IR method, that is, a method for producing the nitride semiconductor laminate 1 according to the present embodiment will be described.

Figure 7:
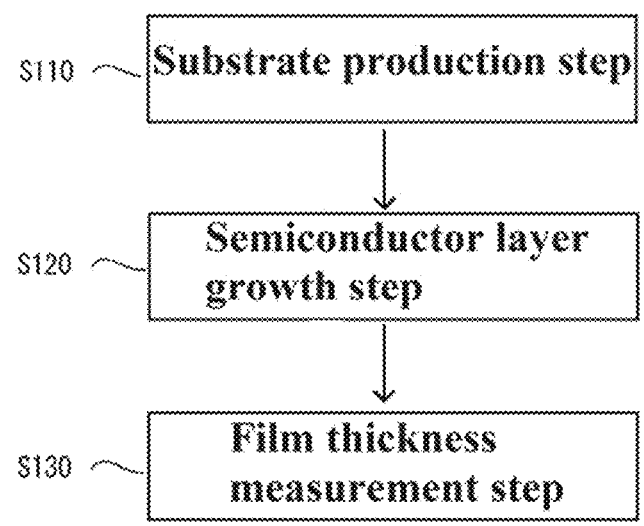
FIG. 7 is a flow chart illustrating a schematic procedure of a method for producing a nitride semiconductor laminate 1 according to the first (and second) embodiments of the present invention.

As illustrated in FIG. 7, the method for producing the nitride semiconductor laminate 1 according to the present embodiment, includes at least a substrate production step (step 110, hereinafter the step is abbreviated as "S"), a semiconductor layer growth step (S120), and a film thickness measurement step (S130).

(2-i) Substrate Production Step

In the substrate production step (S110), the substrate 10 is produced. The substrate 10 is produced by using a hydride vapor phase deposition apparatus (HVPE apparatus) 200 shown below.

(Configuration of HVPE Apparatus)

Here, the configuration of the HVPE apparatus 200 used for producing the substrate 10 will be described in detail with reference to FIG. 8.

The HVPE apparatus 200 includes an airtight container 203 in which a film forming chamber 201 is configured inside. An inner cover 204 is provided in the film forming chamber 201, and a susceptor 208 as a base with a seed crystal substrate (also referred to as "a seed substrate" hereafter) 5 thereon is provided at a position surrounded by the inner cover 204. The susceptor 208 is connected to a rotation shaft 215 of a rotation mechanism 216, and is configured to be rotatable according to a drive of the rotation mechanism 216.

A gas supply pipe 232a, which supplies hydrogen chloride (HCl) gas into a gas generator 233a, a gas supply pipe 232b, which supplies ammonia ($NH_3$) gas into the inner cover 204, a gas supply pipe 232c, which supplies a doping gas described later into the inner cover 204, a gas supply pipe 232d, which supplies a mixed gas ($N_2/H_2$ gas) of nitrogen ($N_2$) gas and hydrogen ($H_2$) gas as a purge gas into the inner cover 204, and a gas supply pipe 232e which supplies $N_2$ gas as a purge gas into the film forming chamber 201, are connected to one end of the airtight container 203. Flow rate controllers 241a to 241e and valves 243a to 243e are provided to the gas supply pipes 232a to 232e respectively in this order from an upstream side. A gas generator 233a for accommodating a Ga melt as a raw material is provided downstream of the gas supply pipe 232a. A nozzle 249a is provided to the gas generator 233a for supplying gallium chloride (GaCl) gas produced by a reaction of HCl gas with Ga melt, toward the seed substrate 5 or the like disposed on the susceptor 208. Nozzles 249b and 249c are connected respectively to a downstream side of the gas supply pipes 232b and 232c, for supplying various gases to the seed substrate 5 and the like arranged on the susceptor 208. The nozzles 249a to 249c are disposed so as to allow gas to flow in a direction intersecting the surface of the susceptor 208. The doping gas supplied from the nozzle 249c is a mixed gas of a doping source gas and a carrier gas such as $N_2/H_2$ gas. As for the doping gas, HCl gas may be flown together for the purpose of suppressing thermal decomposition of a halide gas as a doping source. As the doping source gas constituting the doping gas, for example, use of dichlorosilane ($SiH_2Cl_2$) gas or silane ($SiH_4$) gas can be considered in the case of silicon (Si) doping, and use of dichlorogerman ($GeCl_4$) gas or Germanic ($GeH_4$) gas can be considered in the case of germanium (Ge) doping. However, the doping source gas is not limited to these gases.

An exhaust pipe 230 is provided at the other end of the airtight container 203, for exhausting an inside of the film forming chamber 201. A pump (or blower) 231 is provided to the exhaust pipe 230. Zone heaters 207a and 207h are provided on an outer circumference of the airtight container 203, for heating an inside of the gas generator 233a and the seed substrate 5, or the like on the susceptor 208 to a desired temperature for each region. Further, a temperature sensor (not illustrated) is provided in the airtight container 203, for measuring the temperature inside the film forming chamber 201.

Components of the HVPE apparatus 200 described above, particularly each member for forming the flow of various gases, are configured, for example, as described below in order to enable crystal growth to be performed with a low impurity concentration as described later.

Figure 8:
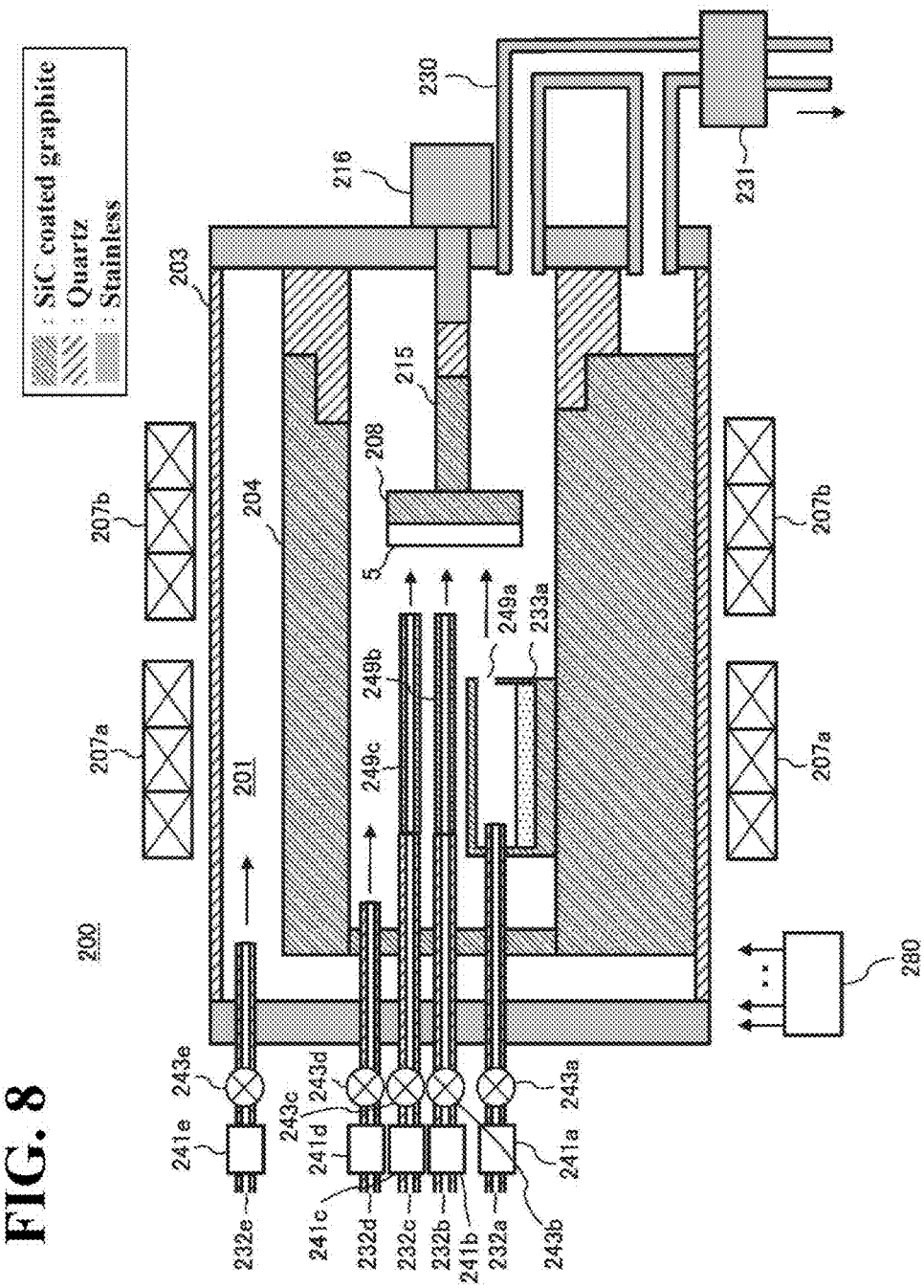
FIG. 8 is a schematic configuration view of a vapor deposition apparatus 200.

Specifically, as illustrated in FIG. 8 so as to be identifiable by a hatch type, it is preferable to use a member made of a quartz-free and boron-free material, as a member constituting a high temperature region which is a region of the airtight container 203 that is heated to a crystal growth temperature (for example, 1,000° C. or higher) by receiving radiation from the zone heaters 207a and 207b, and which is a region in contact with the gas supplied to the seed substrate 5. Specifically, as the member constituting the high temperature region, for example, it is preferable to use a member made of silicon carbide (SiC) coated graphite. On the other hand, in a relatively low temperature region, it is preferable to make the member using high-purity quartz. Namely, in the high temperature region where the temperature becomes relatively high and comes into contact with HO gas or the like, each member is made of SiC coated graphite instead of high-purity quartz. Specifically, the inner cover 204, the susceptor 208, the rotating shaft 215, the gas generator 233a, the nozzles 249a to 249c, and the like are made of SiC coated graphite. Since a core tube constituting the airtight container 203 can only be made of quartz, an inner cover 204 that surrounds the susceptor 208, the gas generator 233a, and the like is provided in the film forming chamber 201. The walls at both ends of the airtight container 203, the exhaust pipe 230, and the like may be made of a metal material such as stainless steel.

For example, "Polykov et al. J. Appl. Phys. 115, 183706 (2014)" discloses that by growing at 950° C., GaN crystal can grow with low impurity concentration. However, such low-temperature growth causes deterioration of the obtained crystal quality, and good thermophysical properties, electrical properties, and the like cannot be obtained.

In contrast, according to the above-described HVPE apparatus 200 of the present embodiment, in a high temperature region where the temperature becomes relatively high and comes into contact with HCl gas, etc., each member is made of SiC-coated graphite. Therefore, for example, even in a temperature range of 1,050° C. or higher, which is suitable for the growth of GaN crystals, impurities such as Si, O, C, Fe, Cr and Ni caused by quartz, stainless steel and the like can be prevented from supplied to the crystal growth portion. As a result, the GaN crystal can grow with high purity and good thermal and electrical properties.

Each member of the WIPE apparatus 200 is connected to a controller 280 configured as a computer, and a processing procedure and processing conditions described later are controlled by a program executed by the controller 280.

(Substrate Production Procedure)

Next, a series of processes from epitaxially growing the GaN single crystal on the seed substrate 5 using the above-described HVPE apparatus 200, and then slicing the grown crystal to obtain a substrate 10, will be described with reference to FIG. 8. In the following description, an operation of each part constituting the HVPE apparatus 200 is controlled by the controller 280.

The procedure for producing the substrate 10 performed by using the HVPE apparatus 200 includes a loading step, a crystal growth step, an unloading step, and a slice step.

(Loading Step)

Specifically, first, a furnace opening of the reaction vessel 203 is opened, and the seed substrate 5 is placed on the susceptor 208. The seed substrate 5 placed on the susceptor 208 serves as a base (seed) for producing the substrate 10, and is a plate-like structure comprising a single crystal of GaN, which is an example of a nitride semiconductor.

When placing the seed substrate 5 on the susceptor 208, the surface of the seed substrate 5 placed on the susceptor 208, that is, the main surface (crystal growth surface, base surface) on the side facing the nozzles 249a to 249c is (0001) plane, that is, +C plane (Ga polar plane).

(Crystal Growth Step)

In this step, after loading of the seed substrate 5 into the reaction chamber 201 is completed, the furnace opening is closed, and while heating and exhausting an inside of the reaction chamber 201, supply of $H_2$ gas, or 112 gas and $N_2$ gas into the reaction chamber 201 is started. Then, supply of the HCl gas and $NH_3$ gas from gas supply pipes 232a and 232b is started, and GaCl gas and $NH_3$ gas are supplied to the surface of the seed substrate 5, respectively in a state where the inside of the reaction chamber 201 has reached a desired treatment temperature and treatment pressure, and the atmosphere inside the reaction chamber 201 has become a desired atmosphere.

Figure 9:
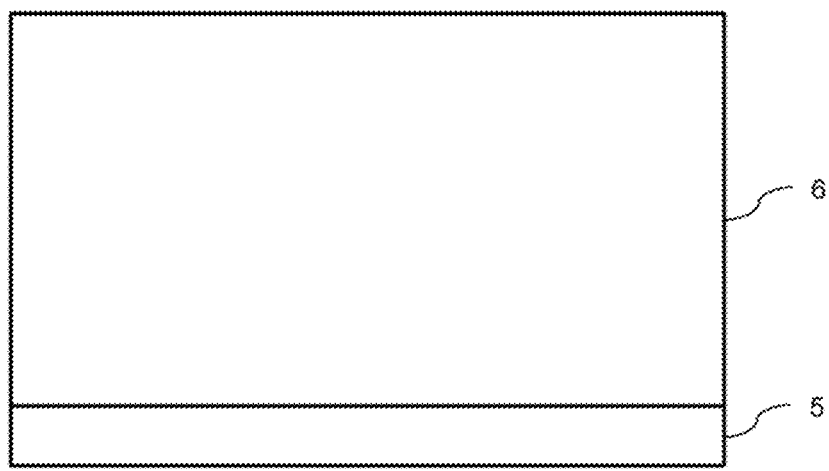
FIG. 9 A is a view illustrating a state in which a GaN crystal film 6 is thickly grown on a seed crystal substrate 5, and B is a view illustrating a state in which a plurality of nitride crystal substrates 10 are obtained by slicing a thickly grown GaN crystal film 6.
Figure 9:
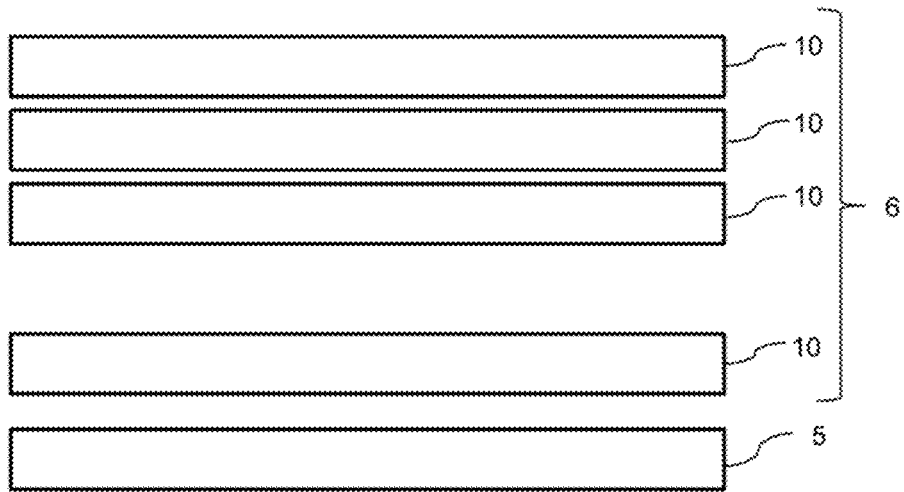

Therefore, as illustrated in a cross-sectional view in FIG. 9A, a GaN crystal grows epitaxially on the surface of the seed substrate 5 in the c-axis direction, and a GaN crystal 6 is formed. At this time, by supplying $SiH_2Cl_2$ gas, Si as an n-type impurity can be added to the GaN crystal 6.

In this step, in order to prevent thermal decomposition of the GaN crystal constituting the seed substrate 5, it is preferable to start supplying $NH_3$ gas into the reaction chamber 201 when the temperature of the seed substrate 5 reaches 500° C. or earlier. Further, in order to improve an in-plane film thickness uniformity of the GaN crystal 6, this step is preferably performed, with the susceptor 208 rotated.

In this step, the temperature of the zone heaters 207a and 207b is preferably set to, for example, 700 to 900° C. in the heater 207a that heats an upstream portion in the reaction chamber 201 including the gas generator 233a, and the temperature is preferably set to, for example, 1,000 to 1,200° C. in the heater 207b that heats a downstream portion in the reaction chamber 201 including the susceptor 208. Thereby, the susceptor 208 is adjusted to a predetermined temperature of 1,000 to 1,200° C. In this step, an internal heater (not illustrated) may be used in an off state, but temperature control using an internal heater may be performed, as long as the temperature of the susceptor 208 is in the above-described range of 1,000 to 1,200° C.

The following are examples of other processing conditions in this step.

Processing pressure: 0.5 to 2 atm
Partial pressure of GaCl gas: 0.1 to 20 kPa
Partial pressure of $NH_3$ gas/Partial pressure of GaCl gas: 1 to 100
Partial pressure of $H_2$ gas/Partial pressure of GaCl gas: 0 to 100
Partial pressure of $SiH_2Cl_2$ gas: $2.5 \times 10^{-5}$ to $1.3 \times 10^{-3}$ kPa Further, when supplying GaCl gas and $NH_3$ gas to the surface of the seed substrate 5, $N_2$ gas as a carrier gas may be added from each of the gas supply pipes 232a to 232b. By adding $N_2$ gas and adjusting a blowing flow velocity of the gas supplied from the nozzles 249a to 249b, it is possible to appropriately control a distribution of the supply amount of the source gas and the like on the surface of the seed substrate 5 and realize a uniform growth rate distribution over an entire in-plane area. A rare gas such as Ar gas or He gas may be added instead of the $N_2$ gas.

(Unloading Step)

After growing the GaN crystal 6 of a desired thickness on the seed substrate 5, supply of HCl gas to the gas generator 233a, supply of $H_2$ gas into the reaction chamber 201, and heating by the zone heaters 207a and 207b, are stopped respectively, while supplying $NH_3$ gas and $N_2$ gas into the reaction chamber 201 and exhausting the inside of the reaction chamber 201. Then, when the temperature in the reaction chamber 201 drops to 500° C. or lower, the supply of $NH_3$ gas is stopped, the atmosphere in the reaction chamber 201 is replaced with $N_2$ gas, and the pressure is restored to an atmospheric pressure. Then, the temperature inside the reaction chamber 201 is dropped to, for example, 200° C. or lower, that is, a temperature at which the GaN crystal ingot (seed substrate 5 on which the GaN crystal 6 is formed on the main surface) can be unloaded from the reaction vessel 203. Thereafter, the crystal ingot is unloaded from the inside of the reaction chamber 201 to the outside.

(Slice Step)

Thereafter, by slicing the unloaded crystal ingot, for example, in a direction parallel to a growth plane of the GaN crystal 6, one or more substrates 10 can be obtained as illustrated in FIG. 9B.

Since the various compositions and various physical properties of the substrate 10 are as described above, the description thereof will be omitted. This slicing process can be performed using, for example, a wire saw, an electric discharge machine, or the like. A thickness of the substrate 10 is 250 µm or more, for example, about 400 µm. Thereafter, the surface (+c plane) of the substrate 10 is subjected to a predetermined polishing process to make this surface an epiready mirror surface. The back surface (−c plane) of the substrate 10 is a lap surface or a mirror surface.

As described above, the substrate 10 of the present embodiment configured as illustrated in FRI 2, that is, the substrate 10 having a dependency between the carrier concentration and the absorption coefficient in the infrared region is produced.

(2-ii) Semiconductor Layer Growth Step

After the substrate 10 is produced in the substrate production step (S110), a semiconductor layer growth step (S120) is then performed. In the semiconductor layer growth step (S120), the GaN crystal is homoepitaxially grown on the substrate 10 to form a semiconductor layer 20.

The semiconductor layer 20 is formed by, for example, an organometallic vapor phase growth (MOVPE: Metalorganic Vapor Phase Epitaxy) method. The MOVPE apparatus used for forming the semiconductor layer 20 may be a known one, and detailed description thereof will be omitted here.

In forming the semiconductor layer 20, for example, by the MOVPE method, the substrate 10 is irradiated with at least infrared rays, and the GaN crystals constituting the semiconductor layer 20 are epitaxially grown on the substrate 10.

At this time, when the substrate 10 satisfies the above requirements for the absorption coefficient in the infrared region, the substrate 10 can be stably heated by irradiating the substrate 10 with infrared rays, and the temperature of the substrate 10 can be controlled with high accuracy. Further, heating efficiency due to the irradiation of infrared rays can be made uniform within a main surface of the substrate 10. As a result, crystallinity, thickness, concentration of various impurities, and the like of the GaN crystals constituting the semiconductor layer 20 can be controlled with high accuracy to make them uniform in the main surface of the substrate 10.

Specifically, for example, the semiconductor layer 20 of the present embodiment is formed by the following procedure.

First, the substrate 10 is loaded into the processing chamber of the MOVPE apparatus (not illustrated).

Figure 10:
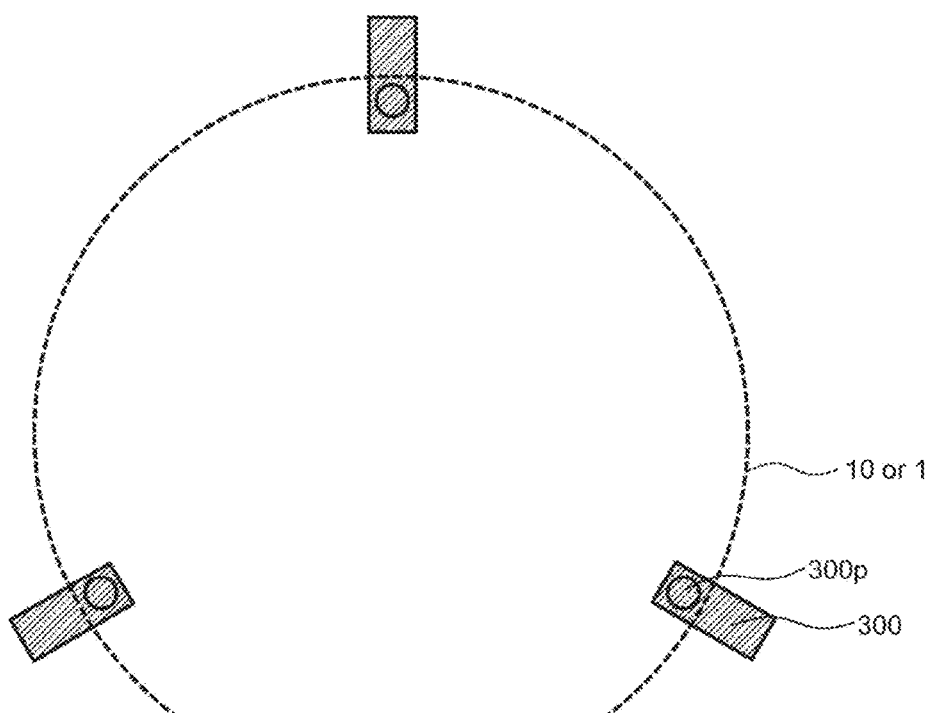
FIG. 10 A is a schematic top view illustrating a holding member 300 on which the nitride crystal substrate 10 or the semiconductor laminate 1 is placed, and B is a schematic front view illustrating a holding member 300 on which the nitride crystal substrate 10 or the semiconductor laminate 1 is placed.
Figure 10:
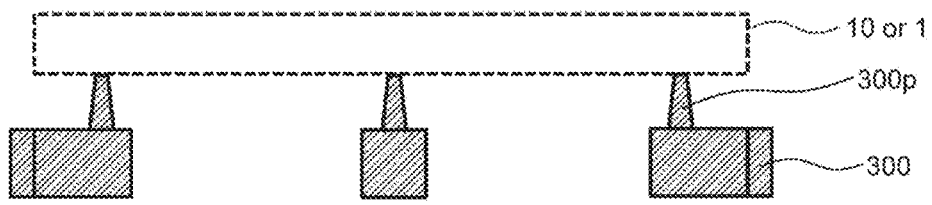

At this time, as illustrated in FIGS. 10 A and 10 B, the substrate 10 is placed on a holding member 300. The holding member 300 has, for example, three convex portions 300p, and is configured to hold the substrate 10 by the three convex portions 300p. Therefore, the substrate 10 can be heated by irradiating the substrate 10 with infrared rays, rather than transferring heat from the holding member 300 to the substrate 10 when heating the substrate 10. Here, when the substrate 10 is heated by heat transfer from a plate-shaped holding member (or when heat transfer is performed in combination), it is difficult to uniformly heat the substrate 10 over an entire in-plane area depending on a back surface state of the substrate 10 and a surface condition of the holding member. Further, as the substrate 10 is heated, the substrate 10 may be warped, and a contact condition between the substrate 10 and the holding member may gradually change. Therefore, heating conditions of the substrate 10 may be non uniform over the entire in-plane area. In contrast, according to the present embodiment, such a problem can be solved and the substrate 10 can be heated stably and uniformly in the main surface, by using the holding member 300 as described above and heating the substrate 10 mainly by irradiating the substrate 10 with infrared rays.

In order to reduce an effect of heat transfer, it is preferable to properly select a shape and a dimension of the convex portion 300p, so that the contact area between the convex portion 300p and the substrate 10 is 5% or less, preferably 3% or less of a supported surface of the substrate 10.

After the substrate 10 is placed on the holding member 300, hydrogen gas and $NH_3$ gas (further $N_2$ gas) are supplied to the processing chamber of the MOVPE apparatus, and the substrate 10 is heated by irradiating the substrate 10 with infrared rays from a predetermined heating source (for example, a lamp heater). When the temperature of the substrate 10 reaches a predetermined growth temperature (for example, 1,000° C. or higher and 1,100° C. or lower), for example, trimethylgallium (TMG) as a group III organometallic raw material and $NH_3$ as a group V raw material are supplied to the substrate 10. At the same time, for example, $SiH_4$ gas is supplied to the substrate 10 as an n-type impurity raw material. Thereby, a base n-type semiconductor layer 21 as a n-type GaN layer is epitaxially grown on the substrate 10.

Next, a drift layer 22 as an n-type GaN layer containing n-type impurities having a lower concentration than that of the base n-type semiconductor layer 21 is epitaxially grown on the base n-type semiconductor layer 21.

When the growth of the drift layer 22 is completed, the supply of the group III organometallic raw material and the heating of the substrate 10 are stopped. Then, when the temperature of the substrate 10 becomes 500° C. or lower, the supply of the group V raw material is stopped. Thereafter, after replacing the atmosphere in the processing chamber of the MOVPE apparatus with $N_2$ gas to restore the atmospheric pressure and lowering the temperature in the processing chamber to a temperature at which the substrate can be unloaded, the grown substrate 10 is unloaded from the processing chamber.

Thereby, the nitride semiconductor laminate 1 of the present embodiment configured as illustrated in FIG. 1 is produced.

Here, an example is given in the case where the nitride semiconductor laminate 1 is produced through the substrate production step (S110) and the semiconductor layer growth step (S120). However, in addition to each of these steps, for example, an annealing step may be performed.

In the annealing step, for example, the substrate 10 is irradiated with at least infrared rays to anneal the nitride semiconductor laminate 1 in an atmosphere of an inert gas using a predetermined heat treatment device (not illustrated). Thereby, for example, activation of the semiconductor layer 20 constituting the nitride semiconductor laminate 1 and recovery of crystal damage can be performed.

At this time, since the substrate 10 satisfies the above requirements for the absorption coefficient in the infrared region, the substrate 10 can be stably heated by irradiating the substrate 10 with infrared rays, and the temperature of the substrate 10 can be controlled with high accuracy. Further, the heating efficiency due to the irradiation of infrared rays can be made uniform within the main surface of the substrate 10. As a result, the degree of activation (activation rate, free hole concentration) of impurities in the semiconductor layer 20 can be controlled with high accuracy, and can be made uniform in the main surface of the substrate 10.

Further, at this time, by heating the substrate 10 using the holding member 300 illustrated in FIGS. 10A and 10B, the substrate 10 can be heated mainly by irradiating the substrate 10 with infrared rays instead of transferring heat from the holding member 300 to the substrate 10. As a result, the substrate 10 can be heated stably and uniformly in the main surface.

2-iii) Film Thickness Measurement Step

After producing the nitride semiconductor laminate 1 through the substrate production step (S110) and the semiconductor layer growth step (S120), next, a film thickness measurement step (S130) is performed in the film thickness measurement step (S130), the film thickness of the semiconductor layer 20 constituting the nitride semiconductor laminate 1 is measured.

When the film thickness of the semiconductor layer 20 is measured in the film thickness measurement step (S130), the control of the film thickness of the semiconductor layer 20 can be strictly performed. Specifically, for example, by measuring the film thickness of the semiconductor layer 20 and comparing it with a predetermined reference value, the quality of the produced nitride semiconductor laminate 1 can be determined. Further, for example, it is also conceivable to judge a suitability of various processing conditions when producing the nitride semiconductor laminate 1, based on a measured value obtained in the film thickness measurement step (S130).

In the film thickness measurement step (S130) in the present embodiment, the film thickness of the semiconductor layer 20 is measured by using a FT-IR method, which is a method for measuring the film thickness in a non-contact and non-destructive manner.

Details of the film thickness measuring method by the FT-IR method will be described below.

(3) Film Thickness Measurement Method by FT-IR Method

Figure 11:
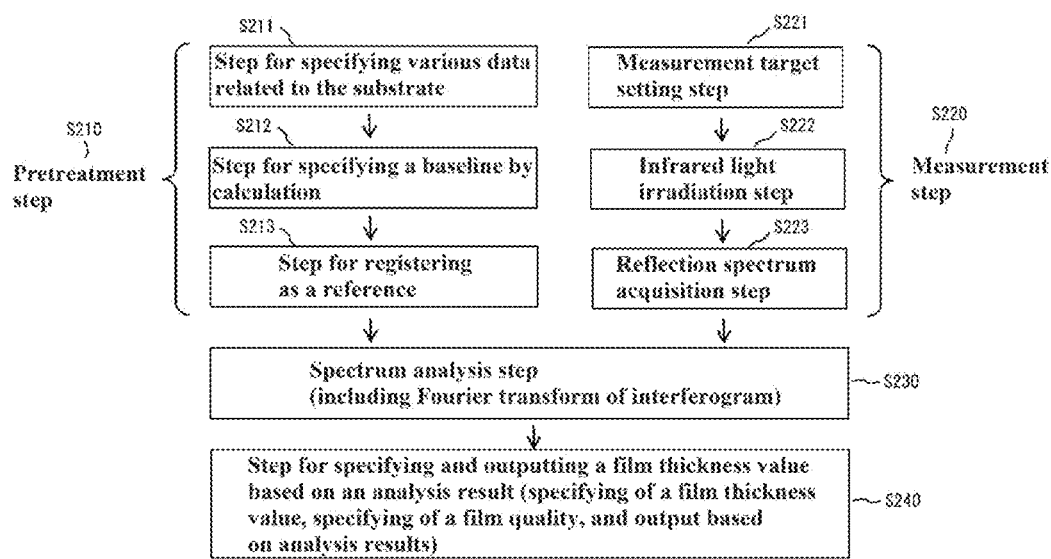
FIG. 11 is a flow chart illustrating an example of a procedure of a film thickness measuring method according to the first (and second) embodiment of the present invention.

As illustrated in FIG. 11, the film thickness measurement method according to the present embodiment includes at least a pretreatment step (S210), a measurement step (S220), a spectrum analysis step (S230), and a step for specifying and outputting a film thickness value based on an analysis result (S240). The pretreatment step (S210) includes a step for specifying various data related to the substrate (S211), a step for specifying a baseline by calculation (S212), and a step for registering as a reference (S213). Further, the measurement step (S220) includes a measurement target setting step (S221), an infrared light irradiation step (S222), and a reflection spectrum acquisition step (S223). Each of these steps will be described in order hereafter.

(3-i) Pretreatment Step

In the pretreatment step (S210), a process that needs to be performed in advance for measuring the film thickness by the FT-IR method is performed as a pretreatment prior to the measurement step (S220).

(Modeling of Dielectric Function)

Here, first, modeling of a dielectric function of an object to be measured (sample), which is a premise of the pretreatment step (S210), will be described. The dielectric function of the sample is required for data analysis, but if the dielectric function of the sample is unknown, it is necessary to model the dielectric function.

An object to be measured is an intermediate 1 constituting a Schottky barrier diode (SBD), and specifically, it is a nitride semiconductor laminate 1 in which the semiconductor layer 20 is formed on the substrate 10.

The nitride semiconductor laminate 1 has a two-layer structure in which the semiconductor layer 20 is a double structure of a base n-type semiconductor layer 21 and a drift layer 22. Regarding the nitride semiconductor laminate 1 having such a laminated structure, a relationship between light reflection and transmission is as shown in an optical model illustrated in FIG. 12A.

However, in the nitride semiconductor laminate 1 having such a laminated structure, for example, when light is incident on a material having a high refractive index to a material having a low refractive index, almost no reflection occurs at an interface of each layer. Therefore, the nitride semiconductor laminate 1 to be measured can be simplified as illustrated in FIG. 12B instead of the optical model illustrated in FIG. 12A. Hereinafter, the nitride semiconductor laminate 1 to be measured will be considered as being approximated by an optical model composed of a medium $N_0$/epi layer $N_1$/substrate $N_2$, as illustrated in FIG. 12B.

In such an optical model, an amplitude reflectance coefficient of the sample is $r_{012}$ in consideration of multiple reflections in the epi layer $N_1$. The amplitude reflectance coefficient $r_{012}$ can be obtained by the equation (5) using the Fresnel equation.

[Formula 1]

$$r_{012} = \frac{r_{01} + r_{12}\exp(-i2\beta)}{1 + r_{01}r_{12}\exp(-i2\beta)} \quad (5)$$

A phase change 13 in the equation (5) can be obtained by the equation (6). In the equation (6), $\theta_1$ and $\theta_0$ are both incident angles of light (see FIG. 12). Further, $N_1$ is a complex refractive index of the epi layer,

[Formula 2]

$$\beta = \frac{2\pi d_1}{\lambda} N_1 \cos\theta_1 = \frac{2\pi d_1}{\lambda}\left(N_1^2 - \sin^2\theta_0\right)^{0.5} \quad (6)$$

In this way, regarding the nitride semiconductor laminate 1 to be measured, the analysis can be performed relatively easily by considering a simplified optical model as illustrated in FIG. 12B and using a virtual substrate approximation that considers only the dielectric function of an uppermost layer.

Although detailed explanation is omitted here, in the analysis, the primary reflection coefficient $r_{01}$ from the surface of the epi layer $N_1$ and the primary reflection coefficient $r_{02}$ from the substrate $N_2$ when the epi layer $N_1$ is absent, are also calculated by using known arithmetic expressions.

By the way, the reflection of light is determined by a complex dielectric constant or a complex refractive index of a substance. Further, light is classified into p-polarized light and s-polarized light according to a direction of an electric field of the light incident on the sample, and each exhibits different reflection.

The Fresnel equation for the amplitude reflectance coefficient rp of the p-polarized light component is as shown in equation (7).

[Formula 3]

$$r_p = \frac{N_{ti}^2\cos\theta_i - \sqrt{N_{ti}^2 - \sin^2\theta_i}}{N_{ti}^2\cos\theta_i + \sqrt{N_{ti}^2 - \sin^2\theta_i}}, \quad N_{ti} = N_t/N_i \quad (7)$$

Further, the Fresnel equation for the amplitude reflectance coefficient rs of the s-polarized light component is as shown in equation (8).

[Formula 4]

$$r_s = \frac{\cos\theta_i - \sqrt{N_{ti}^2 - \sin^2\theta_i}}{\cos\theta_i + \sqrt{N_{ti}^2 - \sin^2\theta_i}}, \quad N_{ti} = N_t/N_i \quad (8)$$

However, in equations (7) and (8), $\theta_i$ is an incident angle of light from a medium i. Further, $N_{ti}$ is a complex refractive index of light incident on a medium t from a medium i, and is defined by equation (9). In equation (9), n is a real part of the complex refractive index, k is an extinction coefficient, and k>0.

[Formula 5]

$$N = n - ik \quad (9)$$

Further, there is a close relationship between the dielectric constant and the refractive index of a substance, and the complex dielectric constant ε is defined by equation (10).

[Formula 6]

$$N^2 = \varepsilon \quad (10)$$

The square of the amplitude reflectance r obtained from the Fresnel equation as described above is an intensity reflectance R.

Specifically, for example, in the case of vertical incidence ($\theta i=0°$), the interfacial reflectance R with the dielectric (N=n−k) is as shown in the equation (11) if the medium $N_0$ is a vacuum (N=1−i0).

[Formula 7]

$$R = R_p(=r_p^2) = R_s(=r_s^2) = \frac{(n-1)^2 + k^2}{(n+1)^2 + k^2} \quad (11)$$

On the other hand, for example, in the case of non-vertical incident ($\theta i \neq 0°$), the interfacial reflectance R with the dielectric (N=n−ik) is as shown in the equation (12), when calculating the amplitude reflectance coefficients $r_{01}$, p, $r_{01}$, S, $r_{012}$, p, $r_{012}$ and S for the p-polarized light component and the s-polarized light component, respectively.

[Formula 8]

$$R = \frac{R_p + R_s}{2} \quad (12)$$

The complex dielectric constant ε is defined not only by equation (10) but also by equation (13).

[Formula 9]

$$\varepsilon = \varepsilon_1 - i\varepsilon_2 \quad (13)$$

Then, from the two equations (9) and (13), it is found that the equations (14) and (15) are established.

[Formula 10]

$$\varepsilon_1 = n^2 - k^2 \quad (14)$$

[Formula 11]

$$\varepsilon_2 = 2nk \quad (15)$$

Based on each of these equations, the complex refractive index of N is given by equations (16) and (17) using the value of the complex dielectric constant.

[Formula 12]

$$n^2 = \frac{\varepsilon_1 + \sqrt{\varepsilon_1^2 + \varepsilon_2^2}}{2} \quad (16)$$

[Formula 13]

$$k^2 = \frac{-\varepsilon_1 + \sqrt{\varepsilon_1^2 + \varepsilon_2^2}}{2} \quad (17)$$

When considering a dielectric function model that should be applied to the analysis of the optical model based on the relationship defined by the above equations, it is conceivable to apply a Drude model or a Lorentz-Drude model because there is the free carrier absorption.

The Drude model is a model that considers only free carrier absorption, and the dielectric constant c can be obtained by equation (18).

[Formula 14]

$$\varepsilon = \varepsilon_\infty \left(1 - \frac{\omega_p^2}{(\omega(\omega + i\gamma))}\right) \quad (18)$$

On the other hand, the Lorenz-Drude model is a model that considers not only free carrier absorption but also coupling with LO phonons, and the dielectric constant c can be obtained by equation (19).

[Formula 15]

$$\varepsilon = \varepsilon_\infty \left(\frac{(\omega_{LO}^2 - \omega^2 - i\omega\Gamma_{LO})}{\omega_{TO}^2 - \omega^2 - i\omega\Gamma_{TO}} - \frac{\omega_p^2}{\omega(\omega + i\gamma)}\right) \quad (19)$$

Wherein, $\varepsilon_\infty$ is a high frequency dielectric constant. $\omega_{LO}$, $\omega_{TO}$, and $\omega_p$ are LO phonon frequency, TO phonon frequency, and a plasma frequency, respectively. $\Gamma_{LO}$, $\Gamma_{TO}$ and $\gamma$ are LO phonon attenuation constant (damping constant), TO phonon attenuation constant and free carrier attenuation constant, respectively. Further, plasma frequency $\omega_p$ is given by equation (20), and attenuation constant $\gamma$ is given by equation (21).

[Formula 16]

$$\omega_p^2 = \frac{N_e e^2}{\varepsilon_\infty m^*} \quad (20)$$

[Formula 17]

$$\gamma = \frac{e}{m^* \mu} \quad (21)$$

In equation w (20) and (21), m* represents an effective mass of a sample. Further, in the equation (21), μ is a drift mobility.

As described above, in the present embodiment, after simplifying the object (sample) to be measured as shown in the optical model illustrated in FIG. 12B, it is decided to apply at least one of the Drude model or the Lorenz-Drude model as the dielectric function model. Then, each step described below is performed using at least one of the Drude model or the Lorenz-Drude model. There are no particular restrictions on whether to apply the Drude model or the Lorenz-Drude model, or both, and may be decided as appropriate.

(S211: Step for Specifying Various Data Related to the Substrate)

After identifying the dielectric function model as described above, first, various data required for performing arithmetic processing using the dielectric function model are specified. Specifically, various data required for arithmetic processing using the formula (18) or the formula (19) are specified.

Various data to be specified here corresponds to, for example, a physical property value (characteristic value) for each of the substrate $N_2$ and the epi layer $N_1$ constituting the optical model illustrated in FIG. 12B. However, the substrate $N_2$ and the epi layer $N_1$ are models of the substrate 10 and the drift layer 22 in the nitride semiconductor laminate 1. Therefore, various data to be specified can be specified based on the physical property values (characteristic values) of the substrate 10 and the drift layer 22.

At this time, as described above, the substrate 10 has a low dislocation density, and moreover, the absorption coefficient in the infrared region satisfies a predetermined requirement. That is, the substrate 10 is configured to have high controllability of the free carrier concentration, and as a result, the reliability of various physical property values (characteristic values) is high. The same can be said for the drift layer 22 epitaxially grown on the substrate 10. Accordingly, when various data required for arithmetic processing using the dielectric function model are specified based on the physical property values (characteristic values) of the substrate 10 and the drift layer 22, the various data become data based on an actual product (that is, the produced nitride semiconductor laminate 1), and are extremely reliable.

Examples of various data specified here include the following specific examples when the substrate 10 and the semiconductor layer 20 comprise GaN crystals.

Specifically, for example, when the Drude model is applied, $\varepsilon_\infty=5.35$, $m_e=0.22$ m0 ($m_0$ is the mass of the electron), $\omega_{p\_sub}=390.4$ cm$^{-1}$ ($\mu=320$ cm$^2$V$^{-1}$ s$^{-1}$) $\omega_{p\_epi}=23.1$ cm$^{-1}$ ($\mu=1200$ cm$^2$V$^{-1}$) cm$^{-1}$), $\gamma_{sub}=132.6$ cm$^{-1}$, $\gamma_{epi}=35.4$ cm$^{-1}$ are established.

Further, for example, when the Lorenz-Drude model is applied, $\varepsilon_\infty=5.35$, $m_e=0.22$ m0, $\omega_{LO}=746$ cm$^{-1}$, $\omega_{TO}=560$ cm$^{-1}$, $\omega_{p\_sub}=390.4$ cm$^{-1}$ ($\mu=320$ cm$^2$V$^{-1}$ s$^{-1}$), $\omega_{p\_epi}=23.1$ cm$^{-1}$ ($\mu=1200$ cm$^2$V$^{-1}$ s$^{-1}$), $\Gamma=\Gamma_{LO}=\Gamma_{TO}=1.27$ cm$^{-1}$, $\gamma_{sub}=132.6$ cm$^{-1}$, $\gamma_{epi}=35.4$ cm$^{-1}$ are established.

Various data given as specific examples here correspond to physical property values peculiar to GaN, or values obtained by calculation based on the physical property values using each of the above equations.

In the present embodiment, when calculating data, the carrier concentration of the epitaxial layer is obtained in advance by C-V measurement, and its value is used as a constant (fixed) fitting parameter. Even in that case, each free carrier concentration is very highly controlled, for example, as follows: the free carrier concentration of the substrate 10 is about 1.0 to 1.5×10$^{18}$ cm$^{-3}$, the free carrier concentration of the semiconductor layer 20 which is a homoepitaxial layer is about 2.0×10$^{18}$ cm$^{-3}$. In consideration of this matter, the various data obtained by data calculation are extremely reliable.

Thus, in the present embodiment, various data is specified after an expected carrier concentration is obtained, then, the film thickness is measured by the FT-IR method as described later. This suggests that, for example, if the accuracy of the FT-LR measurement itself improves in the future, there is a possibility that both the carrier concentration and the film thickness can be obtained by measurement.

(S212: Baseline Specifying Step by Calculation)

After specifying the various data as described above, the arithmetic processing by the dielectric function model is subsequently performed using the specified various data.

In the arithmetic processing by the dielectric function model, first, the refractive index n and the extinction coefficient k for the substrate $N_2$ and the epi layer $N_1$ are obtained.

Figure 13:
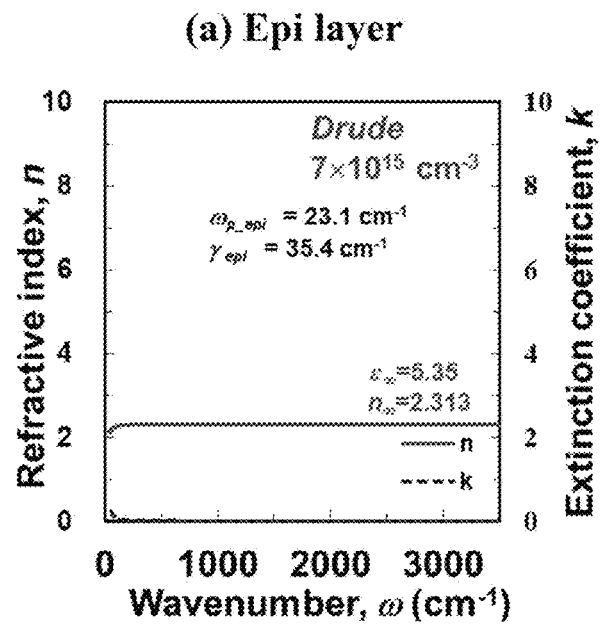
FIG. 13 is an explanatory view illustrating a specific example of calculation results for a refractive index n and an extinction coefficient k by a Drude model, in which A is a view illustrating a calculation result for an epi layer, and B is a view illustrating a calculation result for a substrate.
Figure 13:
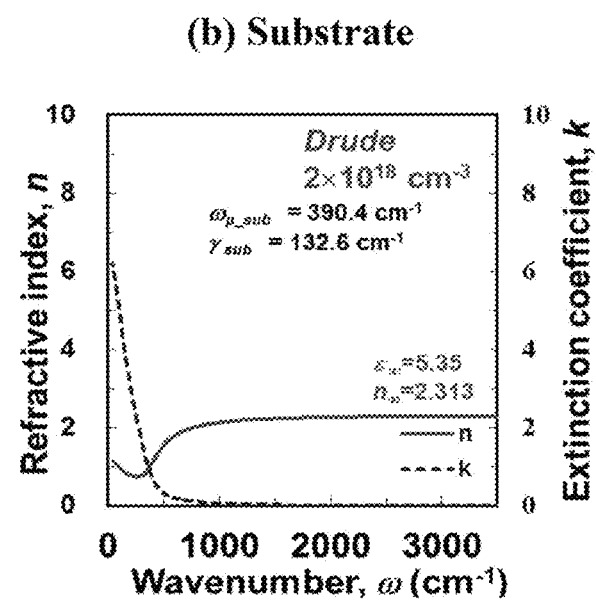

Specifically, for example, when applying the Drude model, the arithmetic processing according to the equation (18) is performed using the various data specified as described above to obtain the dielectric constant ε. Then, the refractive index n and the extinction coefficient k are obtained for each of the substrate $N_2$ and the epilayer $N_1$, using the calculation result and equations (13) to (17). The calculation result is, for example, as illustrated in FIGS. 13A and 13B.

Figure 14:
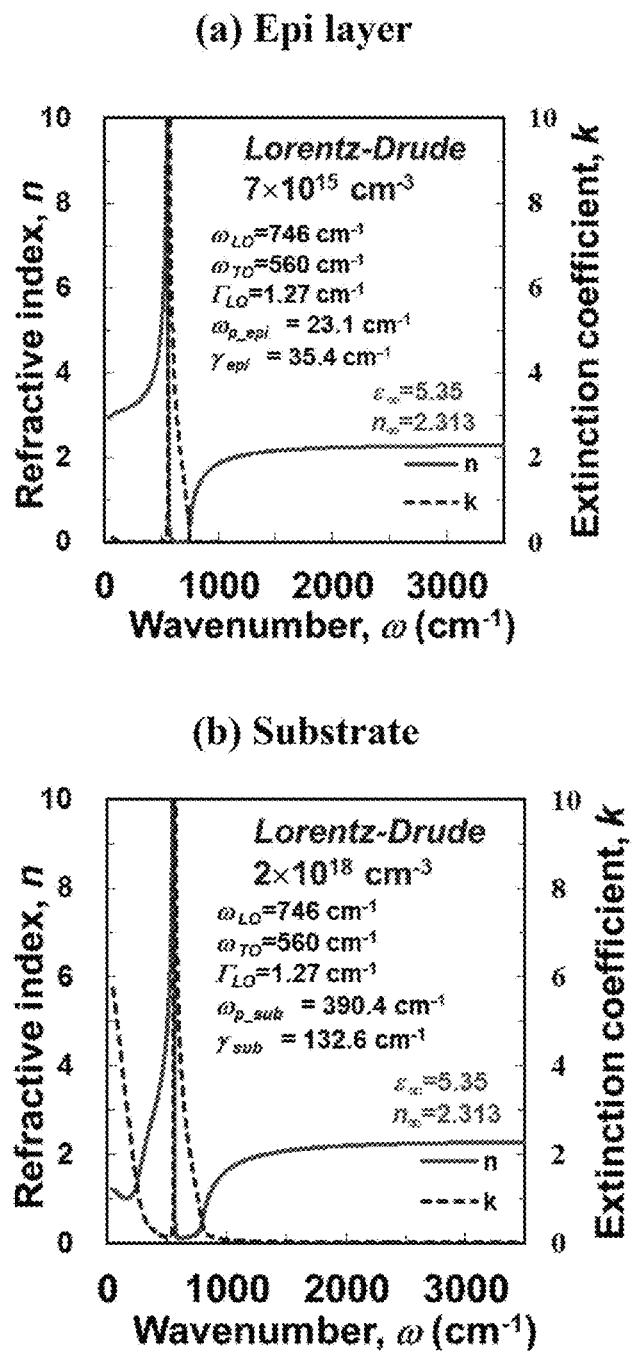
FIG. 14 is an explanatory view illustrating a specific example of a calculation result for refractive index n and extinction coefficient k by the Lorenz-Drude model, in which A is a view illustrating a calculation result for an epi layer, and B is a view illustrating a calculation result for a substrate.

Further, for example, when applying the Lorenz-Drude model, the arithmetic processing according to the equation (19) is performed using the various data specified as described above to obtain the dielectric constant ε. Then, the refractive index n and the extinction coefficient k are obtained for each of the substrate $N_2$ and the epilayer $N_1$, using the calculation result and equations (13) to (17). The calculation result is as illustrated in FIGS. 14A and 14B, for example.

After obtaining the refractive index n and the extinction coefficient k the reflectance R is then calculated using the calculation result and the equation (11) or the equation (12) to obtain a reflection spectrum specified from the calculation result.

For example, in the case of vertical incidence (θi=0°), the reflection spectrum is as illustrated in FIG. 15A for the Drude model, and is illustrated in FIG. 15B for the Lorenz-Drude model.

Further, for example, in the case of non-vertical incident (θi≠0), more specifically, in the case of θi=30°, the reflection spectrum is as illustrated in FIG. 16A for the Drude model, and as illustrated in FIG. 15B for the Lorenz-Drude model).

Figure 15:
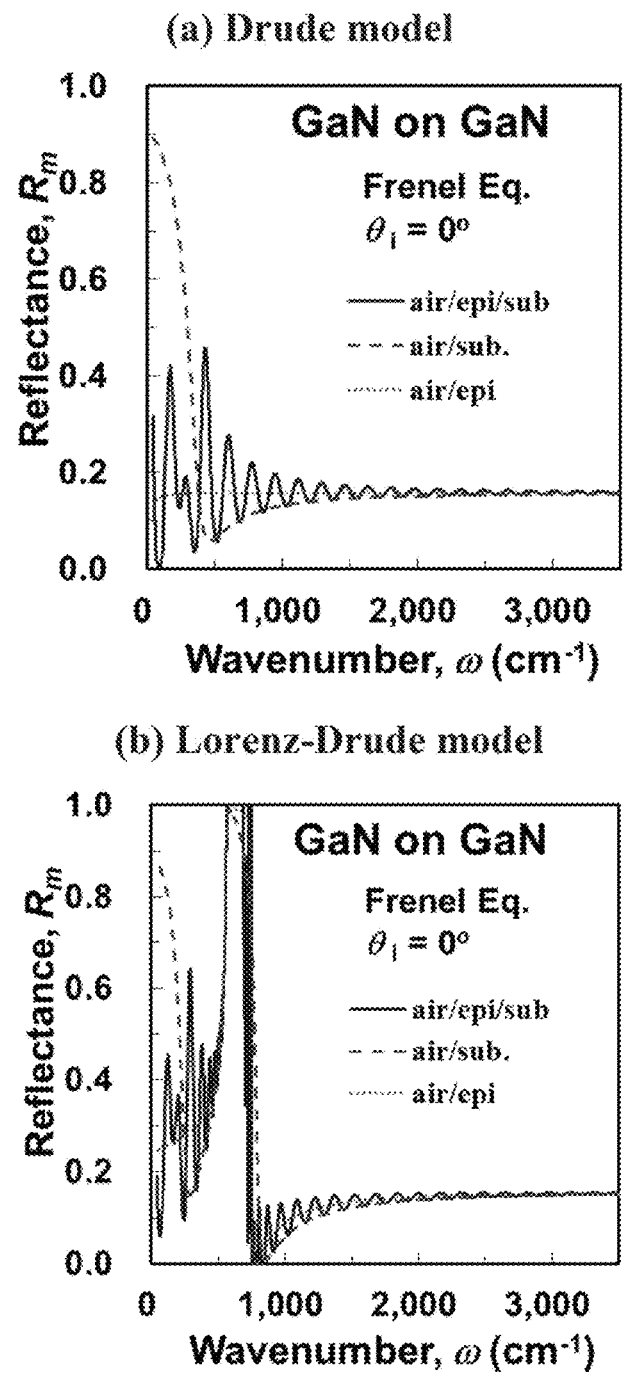
FIG. 15 is an explanatory view illustrating a specific example of a calculation result for a reflection spectrum in the case of vertical incidence ($\theta i=0°$), in which A is a view illustrating a reflection spectrum of a Drude model, and B is a view illustrating a reflection spectrum of a Lorenz-Drude model.
Figure 16:
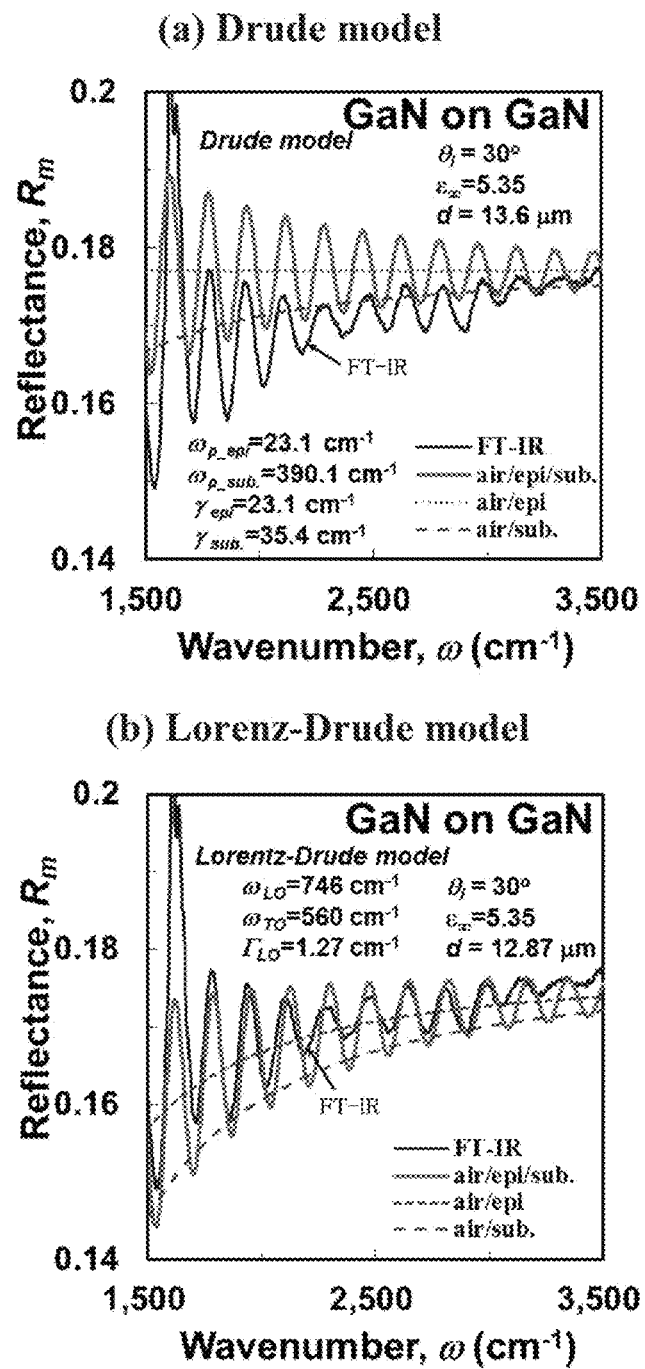
FIG. 16 is an explanatory view illustrating a specific example of a calculation result for a reflection spectrum in the case of non-vertical incident ($\theta i=30°$), in which A is a view illustrating a reflection spectrum related to the Drude model, and B is a view illustrating a reflection spectrum related to the Lorenz-Drude model.

The reflection spectrum as described above can be obtained for each of the following cases: the optical model composed of the medium $N_0$/epi layer $N_1$/substrate $N_2$ based on the reflection coefficient $r_{012}$ (see solid lines in FIGS. 15 and 16); an interface between the medium $N_0$ and the epi layer $N_1$ based on the reflectance coefficient $r_{01}$ (see broken lines in FIGS. 15 and 16); an interface between the medium $N_0$ and the substrate $N_2$ based on the reflectance coefficient $r_{02}$ in the absence of the epi layer $N_1$ (See dotted lines in FIGS. 15 and 16). Of these, the reflection spectrum for the interface of the substrate $N_2$ based on the reflectance coefficient $r_{02}$, corresponds to a baseline as a reference when analyzing the reflection spectrum by the FT-IR method.

That is, in the present embodiment, the reflection spectrum is obtained by arithmetic processing such as simulation in the case of a single body substrate $N_2$, and the reflection spectrum is specified as a baseline used for measuring the film thickness by the FT-IR method.

As described above, such a baseline is specified based on the physical property values (characteristic values) of the substrate 10. The substrate 10 is configured to have high controllability of the free carrier concentration, and as a result, the reliability of various physical property values (characteristic values) is high. Thus, the various data used to specify the baseline are highly reliable. Therefore, in the present embodiment, the baseline can be reliably specified using arithmetic processing such as simulation.

Regarding the laminate of the same composition as the optical model to be analyzed, FIG. 16 also illustrates a reflection spectrum obtained by actual measurement by FT-IR method (see arrow "FT-IR" in the figure). When this reflection spectrum is compared with the reflection spectrum for an optical model composed of medium $N_0$/epi layer $N_1$ substrate $N_2$ (see solid line in the figure), it is found that each is similar (especially in the case of the Lorenz-Drude model illustrated in FIG. 16B). From this fact, it is found that the reflection spectrum obtained by the arithmetic processing in the present embodiment is extremely reliable.

As is performed when measuring the film thickness by the FT-IR method, by Fourier transforming the reflection spectrum described above, the film thickness of the epi layer $N_1$ can be calculated. Specifically, when the film thickness of the epi layer $N_1$ is calculated for the example of FIG. 15 or FIG. 16, the film thickness $d_{epi}$=13.6 μm in the case of the Drude model, and the film thickness $d_{epi}$=12.87 μm in the case of the Lorenz-Drude model. Thus, it can be considered that the difference in the calculation result between each model is that there is no LO phonon term in the Drude model, and therefore the refractive index n is larger than that of the Lorenz-Drude model, and the film thickness is calculated to be thicker. Further, to give a practical note, as is clear from FIG. 16A, the value varies in the case of the Drude model depending on a wavenumber range used to calculate the film thickness. Based on this tendency, it is acceptable to decide whether to apply the Drude model or the Lorenz Drude model, or both.

(S213: Registration Step as a Reference)

After specifying the baseline as described above, subsequently, data related to the specified baseline is used as reference data used in measuring the film thickness by the FT-IR method, and this reference data is registered.

The registration of the reference data may be performed by storing the reference data in a memory unit of a FT-IR measuring device described later, or by storing the reference data in an external storage device that can be accessed by the FT-IR measuring device.

When the registration of the reference data is completed, the preprocessing step (S210) is completed.

(3-ii) Measurement Step

After completing the pretreatment step (S210), the measurement step (S220) can be performed thereafter. In the measurement step (S220), the reflection spectrum required for measuring the film thickness by the FT-IR method is acquired for the nitride semiconductor laminate 1 which is an object to be measured. The acquisition of the reflection spectrum is performed using the FT-IR measuring device.

(Outline of the FT-IR Measuring Device)

Here, an outline of the FT-IR measuring device 50 will be briefly described.

Figure 17:
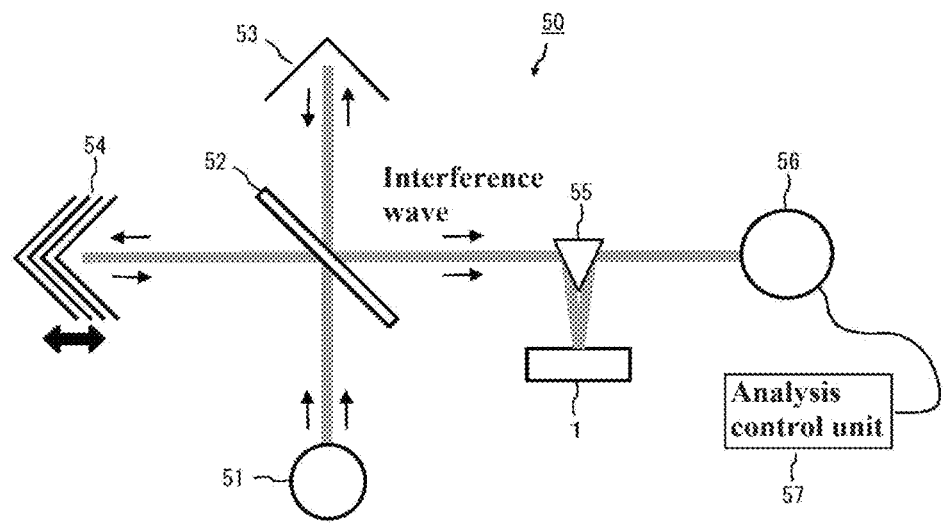
FIG. 17 is a schematic configuration view of an FT-IR measuring device 50.

As illustrated in FIG. 17, the FT-IR measuring device 50 is configured by including a light source 51 that emits light in the infrared region (IR), a half mirror 52, a fixed mirror 53 that is fixedly arranged, a movable mirror 54 arranged so as to be movable, a reflection mirror 55, a detector 56 that receives and detects light, and an analysis control unit 57 including a computer device connected to the detector 56.

In the FT-IR measuring device 50 having such a configuration, the light from the light source 51 is obliquely incident on the half mirror 52 and is divided into two light fluxes of transmitted light and reflected light. The two light fluxes are reflected by the fixed mirror 53 and the moving mirror 54 respectively, and return to the half mirror 52, and is synthesized again to generate an interference wave (interferogram). At this time, different interference waves can be obtained depending on a position (optical path difference) of the moving mirror 54. The optical path of the obtained interference wave is changed by the reflection mirror 55, and the object to be measured (specifically, the nitride semiconductor laminate 1) is irradiated. Then, after the reflected light (or transmitted light) generated by the object to be measured in response to the irradiation of the interference wave is changed in its optical path by the reflection mirror 55 again, and is received and detected by the detector 56. Thereafter, a detection result of the detector 56 is analyzed by the analysis control unit 57. Specifically, as will be described in detail later, the analysis control unit 57 performs spectrum analysis using the Fourier transform.

Hereinafter, the measurement step (S220) performed by using the FT-IR measuring device 50 having such a configuration will be specifically described.

(S221: Step for Setting the Object to be Measured)

In the measurement step (S220), first, the nitride semiconductor laminate 1 to be measured is set at an irradiated portion of the interference wave in the FT-IR measuring device 50. A method for setting the nitride semiconductor laminate 1 at the irradiated portion is not particularly limited as long as it conforms to the specification of the FT-IR measuring device 50. That is, the nitride semiconductor laminate 1 to be measured may be set according to the specification and the configuration of a sample mounting table (not illustrated) in the FT-IR measuring device 50.

(S222: Infrared Light Irradiation Step)

After setting the nitride semiconductor laminate 1, subsequently, light in the infrared region (IR) is emitted from the light source 51, and the moving mirror 54 is appropriately moved to generate an interference wave (interferogram), and the interference wave is applied to the nitride semiconductor laminate 1. Thereby, reflected light corresponding to the interference wave is emitted from the nitride semiconductor laminate 1.

(S223: Reflection Spectrum Acquisition Step)

Thereafter, the detector 56 receives the reflected light emitted from the nitride semiconductor laminate 1 and detects it. That is, by observing the interference waveform (interferogram) of the reflected light from the nitride semiconductor laminate 1 as a function of space or time by receiving and detecting the light received by the detector 56, the reflection spectrum required for measuring the film thickness by the FT-IR method is obtained from the nitride semiconductor laminate 1. The reflection spectrum referred to here is a plot of an amount of light reflected when the nitride semiconductor laminate 1 is irradiated with an interference wave, with respect to a wavelength (wavenumber).

As described above, in the nitride semiconductor laminate 1 which is the object to be measured, the substrate 10 has a low dislocation and has a dependency between the carrier concentration and the absorption coefficient in the infrared region. Also, the same applies to the semiconductor layer 20 homoepitaxially grown on the substrate 10.

Accordingly, in the case of the nitride semiconductor laminate 1 of the present embodiment, the reflection spectrum obtained by irradiation of the interference wave, reflects the influence of the interference wave. Specifically, the reflection spectrum has a fringe pattern, which is a pattern representing the presence of fringes (interference fringes) in which large and small light amounts are alternately generated due to light interference.

If the acquired reflection spectrum has a fringe pattern, by analyzing the fringe pattern, the film thickness of the nitride semiconductor laminate 1 which is the object to be measured can be measured, that is, the film thickness can be measured using the FT-IR method.

Thus, when the reflection spectrum having the fringe pattern is acquired from the nitride semiconductor laminate 1 which is the object to be measured, the measurement step (S220) is completed.

(3-iii) Spectrum Analysis Step

After the measurement step (S220) is completed, the spectrum analysis step (S230) is then performed In the spectrum analysis step (S230), the reflection spectrum obtained in the measurement step (S220) is analyzed by mathematically separating wavelength (wavenumber) components by performing the Fourier transform, while using the reference data registered in the pretreatment step (S210).

Specifically, in the spectrum analysis step (S230), the following analysis processing is performed. First, the reflection spectrum obtained from the nitride semiconductor laminate 1 is used as a sample spectrum, and the baseline (reflection spectrum) specified by the reference data is used as a background spectrum. Then, Fourier transform is applied to each of the sample spectrum and the background spectrum, and after obtaining each single beam spectrum (SB), for example, based on the equation (22), the reflection interference pattern is calculated by dividing the intensity of the sample spectrum by the intensity of the background spectrum.

$$(\text{Sample SB})/(\text{Background SB}) \times 100 = \text{Reflectometric interference pattern} \quad (22)$$

Based on the reflection interference pattern calculated in this way, the film thickness of the semiconductor layer 20 (specifically, for example, the drift layer 22 constituting the semiconductor layer 20) in the nitride semiconductor laminate 1, can be estimated from a fringe interval in the near infrared region of the reflection interference pattern.

(3-iv) Step for Specifying and Outputting a Film Thickness Value Based on an Analysis Result After completion of the spectrum analysis step (S220), a step for specifying and outputting a film thickness value based on an analysis result (S240) is then performed.

In the step for specifying and outputting the film thickness value based on the analysis result (S240), first, the film thickness value of the semiconductor layer 20 (for example, the drift layer 22) in the nitride semiconductor laminate 1 is specified based on the reflection interference pattern obtained as the analysis result in the spectrum analysis step (S220). Specifically, in the reflection interference pattern calculated in the spectrum analysis step (S220), there is a burst that appears when light is strengthened by interference, and a distance between bursts corresponds to an optical path difference of each reflected light component. Therefore, the film thickness value of the semiconductor layer 20 (for example, the drift layer 22) is specified by dividing the distance between the bursts by the value of the refractive index of the semiconductor layer 20.

Then, after the film thickness value of the semiconductor layer 20 is specified, the specified film thickness value is output thereafter. The film thickness value may be output by using, for example, a display unit (not illustrated) included in the FT-IR measuring device 50, a printer device (not illustrated) connected to the FT-IR measuring device 50, or the like.

By outputting the film thickness value in this way, a user of the FT-IR measuring device 50 referring to the output result can recognize the measurement result of the film thickness of the semiconductor layer 20 in the nitride semiconductor laminate 1. That is, the film thickness of the semiconductor layer 20 of the nitride semiconductor laminate 1 can be measured by using the FT-IR method.

(4) Effect Obtained by the Present Embodiment

According to the present embodiment, one or more of the following effects can be obtained.

(a) In the present embodiment, the substrate 10 having a dependency between the carrier concentration and the absorption coefficient in the infrared region is used, and the semiconductor layer 20 is homoepitaxially grown on the substrate 10 to form the nitride semiconductor laminate 1. Therefore, in the nitride semiconductor laminate 1, the absorption coefficient in the infrared region becomes different depending on the difference in carrier concentration between the substrate 10 and the semiconductor layer 20, and the film thickness can be measured using the FT-IR method.

More specifically, in the present embodiment, the dislocation density of the substrate 10 is low, for example, $5 \times 10^6$ pieces/cm$^2$ or less, and moreover, the substrate 10 satisfies a predetermined requirement for the absorption coefficient in the infrared region. Therefore, there is a dependency between the carrier concentration in the substrate 10 and the absorption coefficient in the infrared region. Further, by homoepitaxially growing the semiconductor layer 20 on the substrate 10, the GaN crystal constituting the semiconductor layer 20 becomes similar to the GaN crystal constituting the substrate 10. That is, the semiconductor layer 20 has a low dislocation and has a dependency between the carrier concentration and the absorption coefficient in the infrared region, similarly to the substrate 10 even when there is a difference in carrier concentration between the semiconductor layer 20 and the substrate 10.

Accordingly, in the case of the nitride semiconductor laminate 1 of the present embodiment, for example, even when the carrier concentration is as low as $1 \times 10^{17}$ cm$^{-3}$, the absorption coefficient in the infrared region differs depending on the difference in carrier concentration between the substrate 10 and the semiconductor layer 20. As a result, the film thickness can be measured using the FT-IR method.

As described above, according to the present embodiment, in the semiconductor layer 20 which is a homoepitaxial film of a group III nitride semiconductor crystal, for example, even in the case of a low carrier concentration of $1 \times 10^{17}$ cm$^{-3}$ or less, the absorption coefficient of IR becomes different depending on the carrier concentration, and the film thickness can be measured in a non-contact and non-destructive manner by using the FT-IR method. Accordingly, it is very useful for controlling the film thickness of the semiconductor layer 20, and through the film thickness control, it becomes possible to contribute to the improvement of properties and reliability of the semiconductor device configured by using the nitride semiconductor laminate 1.

(b) Particularly, as described in the present embodiment, when the substrate 10 satisfies the relationship approximated by the equation (1), that is, the dependence on the substrate 10 is defined by the equation (1), even in the semiconductor layer 20 homoepitaxially grown on the substrate 10, the relationship between the carrier concentration $N_e$ and the absorption coefficient α is surely established. Accordingly, for example, even when the carrier concentration is as low as $1 \times 10^{17}$ cm$^{-3}$, the absorption coefficient α will surely differ depending on the carrier concentration Ne in a wavelength range of at least 1 μm or more and 3.3 μm or less, which is very suitable for measuring the film thickness using the FT-IR method.

The reason why the substrate 10 satisfies the relationship approximated by the equation (1) is that the substrate 10 has a small crystal strain and is in a state of containing almost no impurities other than O and n-type impurities (for example, impurities compensating for n-type impurities). Therefore, in the substrate 10 of the present embodiment, the absorption coefficient α in the wavelength range of at least 1 lien or more and 3.3 μm or less can be approximated by the equation (1) ($\alpha = N_e K \lambda^a$) using a predetermined constant K and constant a.

For reference, in a GaN crystal produced by a conventional production method, it is difficult to accurately approximate the absorption coefficient α by using the constant K and the constant a defined above by the equation (1).

Here, FIG. 6B is a view comparing the relationship between the free electron concentration and the absorption coefficient at a wavelength of 2 μm. FIG. 6B illustrates not only the absorption coefficient of the GaN crystal produced by the production method of the present embodiment, but also the absorption coefficient of the GaN crystal described in the papers (A) to (D).

Paper (A): A. S. Barker Physical Review B7 (1973) p743 FIG. 8

Paper (B): P. I. Perlin, Physics Review Letter 75 (1995) p 296 FIG. 1 Estimated from the curve of 0.3 Gpa Paper (C): G. M. Bentoumi, Medical Science Engineering B50 (1997) p 142-147 FIG. 1

Paper (D): S. A. Pourowski, J. M. Crystal Growth 189-190 (1998) p. 153-158 FIG. 3 However, T=12K As illustrated in FIG. 6B, the absorption coefficient α of the conventional GaN crystals described in the papers (A) to (D) was larger than the absorption coefficient α of the GaN crystal produced by the production method of the present embodiment. Further, the slope of the absorption coefficient α in the conventional GaN crystal was different from the slope of the absorption coefficient α in the GaN crystal produced by the production method of the present embodiment. In the papers (A) and (C), it was also observed that the slope of the absorption coefficient α changed as the free electron concentration $N_e$ increased. Therefore, in the conventional GaN crystals described in the papers (A) to (D), it was difficult to accurately approximate the absorption coefficient α by the equation (1) using the constant K and the constant a defined above. Specifically, for example, there is a possibility that the constant K is higher than the above-described range, or the constant a is a value other than 3.

This is considered to be due to the following reason. It is considered that a large crystal strain was generated in the conventional GaN crystal due to a production method thereof. When crystal strain occurs in the GaN crystal, many dislocations occur in the GaN crystal. Therefore, in the conventional GaN crystal, dislocation scattering occurs, and it is considered that the absorption coefficient α becomes large or varies due to the dislocation scattering. Alternatively, it is considered that the concentration of O mixed unintentionally was high in the GaN crystal produced by the conventional production method. When O is mixed in the GaN crystal at a high concentration, lattice constants a and c of the GaN crystal become large (Reference: Chris G. Van de Walle, Physical Review B vol. 68, 165209 (2003)). Therefore, in the conventional GaN crystal, it is considered that a local lattice mismatch occurred between a portion contaminated by O and a portion having a relatively high purity, and crystal strain occurred in the GaN crystal. As a result, in the conventional GaN crystal, it is considered that the absorption coefficient α becomes large or varies. Alternatively, in the GaN crystal produced by a conventional production method, it is considered that the p-type compensating impurities compensating for the n-type impurities were unintentionally mixed in, and the concentration of the compensating impurities was increased. When the concentration of the compensating impurities is high, a high concentration of n-type impurities is required to obtain a predetermined free electron concentration. Therefore, it is considered that in the conventional GaN crystal, a total impurity concentration including the compensating impurity and the n-type impurity is high, and the crystal strain becomes large. As a result, in the conventional GaN crystal, it is considered that the absorption coefficient α becomes large or varies. In a GaN free-standing substrate that actually contains O and having a strained lattice, it has been confirmed that the absorption coefficient α is high (low mobility) as compared with the substrate 10 of the present embodiment having the same free electron concentration.

For this reason, in the conventional GaN crystal, it is difficult to accurately approximate the absorption coefficient α by the equation (1) using the constant K and the constant a defined above. That is, in the conventional GaN crystal, it has been difficult to accurately design the absorption coefficient based on the free electron concentration Ne. Therefore, in the conventional substrate comprising GaN crystals, in the step of irradiating the substrate with at least infrared rays to heat the substrate, heating efficiency tends to vary depending on the substrate, and it is difficult to control the temperature of the substrate. As a result, there was a possibility that the reproducibility of the temperature of each substrate would be low.

In contrast, the substrate 10 produced by the production method of the present embodiment has a small crystal strain and is in a state of containing almost no impurities other than O and n-type impurities. The absorption coefficient of the substrate 10 of the present embodiment is less affected by scattering (dislocation scattering) caused by crystal strain, and mainly depends on ionization impurity scattering. Therefore, the variation in the absorption coefficient α of the substrate 10 can be reduced, and the absorption coefficient α of the substrate 10 can be approximated by the above equation (1) using predetermined constant K and constant a. Since the absorption coefficient α of the substrate 10 can be approximated by the equation (1), the absorption coefficient of the substrate 10 can be accurately designed based on the concentration $N_e$ of the free electrons generated by doping the n-type impurities into the substrate 10. Also, since the absorption coefficient of the substrate 10 is accurately designed based on the free electron concentration $N_e$, in the step of irradiating the substrate 10 with at least infrared rays to heat the substrate 10, the heating condition can be easily set, and the temperature of the substrate 10 can be controlled with high accuracy. As a result, the temperature reproducibility of each substrate 10 can be improved. In this way, in the present embodiment, the substrate 10 can be heated with high accuracy and reproducibility.

(c) In the present embodiment, when measuring the film thickness using the FT-IR method, after specifying the dielectric function model for the substrate 10 that satisfies the equation (1), the reflection spectrum (baseline) in the case of the single body substrate 10 is obtained by arithmetic processing, based on the specified dielectric function model, and the obtained reflection spectrum is used as reference data. That is, since the substrate 10 has low dislocations and is of high quality, and controllability of the relationship between the carrier concentration $N_e$ and the absorption coefficient α on the substrate 10 is high (that is, the reliability regarding the carrier concentration $N_e$ is high), the reflection spectrum that serves as the baseline can be obtained by arithmetic processing (simulation). Accordingly, when measuring the film thickness using the FT-IR method, for example, it is not necessary to actually measure the reflection spectrum as a reference from the single body substrate because the reflection spectrum is obtained from the dielectric function model and the carrier concentration and the calculated value thus obtained is used as a reference, and therefore the efficiency can be improved in measuring the film thickness.

(d) in the present embodiment, the crystal of the group III nitride semiconductor is a GaN crystal, and the thickness of a so-called GaN-on-GaN substrate is measured by using the FT-IR method. That is, according to the present embodiment, measurement of the film thickness using the FT-IR method can be realized even with a GaN-on-GaN substrate, which was conventionally considered difficult to measure the film thickness in principle.

(e) The nitride semiconductor laminate 1 in the present embodiment has a fringe pattern in the reflection spectrum obtained by irradiating the semiconductor layer 20 on the substrate 10 with infrared light by the FT-IR method. In this way, when there is a fringe pattern in the reflection spectrum, by analyzing the fringe pattern, the film thickness of the semiconductor layer 20 can be measured, that is, the film thickness can be measured using the FT-IR method. Accordingly, for the nitride semiconductor laminate 1 in the present embodiment, the film thickness can be measured in a non-contact and non-destructive manner by using the FT-IR method, and through control of the film thickness based on the measurement result, it becomes possible to contribute to the improvement of the properties and the reliability of the semiconductor device configured using the nitride semiconductor laminate 1.

Second Embodiment

Next, a second embodiment of the present invention will be described.

(1) Method for Producing Nitride Semiconductor Laminate 1

In the second embodiment, a method for producing the nitride semiconductor laminate 1 is different from that of the first embodiment. Specifically, the film thickness measurement step (S130) is different from that of the first embodiment, and the substrate production step (S110) and the semiconductor layer growth step (S120) are the same as those of the first embodiment (see FIG. 7). The configuration of the nitride semiconductor laminate 1 in the second embodiment is the same as that in the first embodiment (see FIG. 1). That is, also in the second embodiment, the nitride semiconductor laminate 1 is configured to enable the measurement of the film thickness using the FT-IR method. Hereinafter, the film thickness measurement step (S130) according to the second embodiment will be described.

In the film thickness measurement step (S130) of the second embodiment, the film thickness is measured (that is, the film thickness is inspected) using the FT-IR method, in the same manner as in the first embodiment. However, in the film thickness measurement step (S130) of the second embodiment, in addition to measuring the film thickness, the film quality is also inspected by using the film thickness measurement. Therefore, in the second embodiment, the above step (S130) is also referred to as a "film thickness/film quality inspection step" instead of the "film thickness measurement step" (see FIG. 7).

In the same manner as in the first embodiment (see FIG. 11), the method for measuring a film thickness includes a pretreatment step (S210), a measurement step (S220), a spectrum analysis step (S230), and a step for specifying and outputting a film thickness value based on the analysis result (S240).

In the second embodiment, a model different from the first embodiment will be illustrated as an optical model used in the pretreatment step (S210). For example, the Lorenz- Drude model (Equation (19)) is given as the dielectric function model. However, for the physical property values of GaN, $\varepsilon_\infty=5.35$, $m_e^*=0.22$ $m_0$, $\omega_{LO}=735$ cm$^{-1}$, $\omega_{TO}=557$ cm$_{-1}$, $\Gamma_{LO}=12$ cm$^{-1}$, $\Gamma_{TO}=6$ cm$^{-1}$ are used in the following calculation. Literature values are used in the description of "when applying the Lorenz-Drude model" of the first embodiment. However, in the second embodiment, a phonon frequency and a phonon attenuation coefficient are finely adjusted to minimize a fitting error between a calculated value and an experimental value in the film thickness/film quality inspection step.

Figure 12:
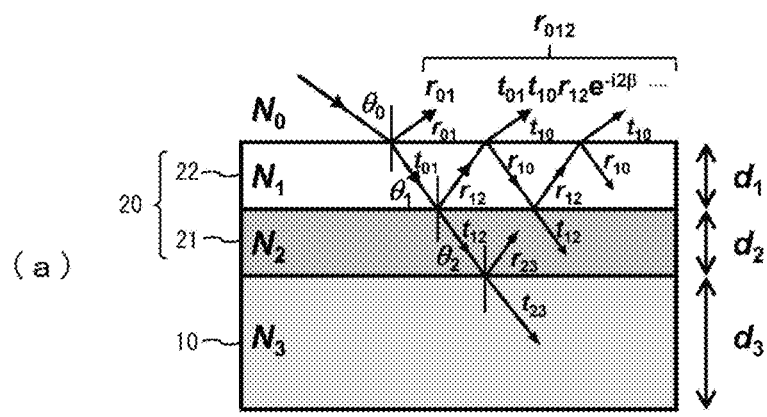
FIG. 12 A is a schematic view illustrating an example of an optical model of a multilayer film, and B is a schematic view illustrating an example of an optical model that simplifies A.
Figure 12:
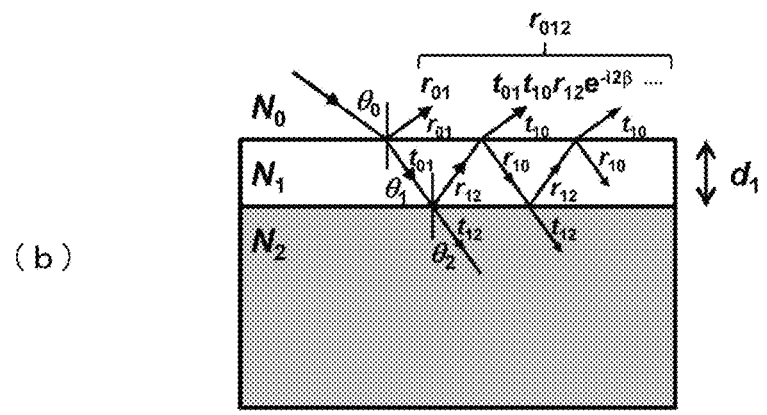

In the first embodiment, the optical model composed of medium $N_0$/epi layer $N_1$/substrate $N_2$, which is simplified as illustrated in FIG. 12 B, is used as an optical model. In contrast, in the second embodiment, an optical model composed of medium $N_0$/epi layer $N_1$ (drift layer 22)/epi layer $N_2$ (base n-type semiconductor layer 21)/substrate $N_3$ (substrate 10) as illustrated in FIG. 12A is used. Measuring the film thickness of the epi layer $N_1$ is the same as that of the first embodiment, but in the second embodiment, a base portion of the epi layer $N_1$ is treated as a laminate of the substrate $N_3$ and the epi layer $N_2$. Equations (7), (8), and the like are recalculated according to a modification from the first embodiment of the optical model.

Design values of the nitride semiconductor laminate 1 are as follows. The substrate $N_3$ has a Si concentration of $1\times10^{18}$ to $2\times10^{18}$ cm$^{-3}$. The epi layer $N_2$ has a thickness of 2 µm and a Si concentration of $2\times10^{18}$ cm$^{-3}$. The epi layer $N_1$ has a thickness of 13 µm and a Si concentration of $9\times10^{15}$ cm$^{-3}$.

Based on such design values, the following optical model is set. The carrier concentration of the substrate $N_3$ is changed as a parameter between $1\times10^{18}$ and $2\times10^{18}$ cm$^{-3}$. A design value thickness of 2 µm and a Si concentration of $2\times10^{18}$ cm$^{-3}$ are set as the thickness and carrier concentration of the epi layer $N_2$. The thickness of the epi layer $N_1$ is changed as a parameter in the vicinity of 13 µm. Since the carrier concentration of the epi layer $N_1$ can be ignored as compared with the carrier concentration of the substrate $N_3$ and the epi layer $N_2$, the carrier concentration is approximately set to 0 cm$^{-3}$.

Figure 18:
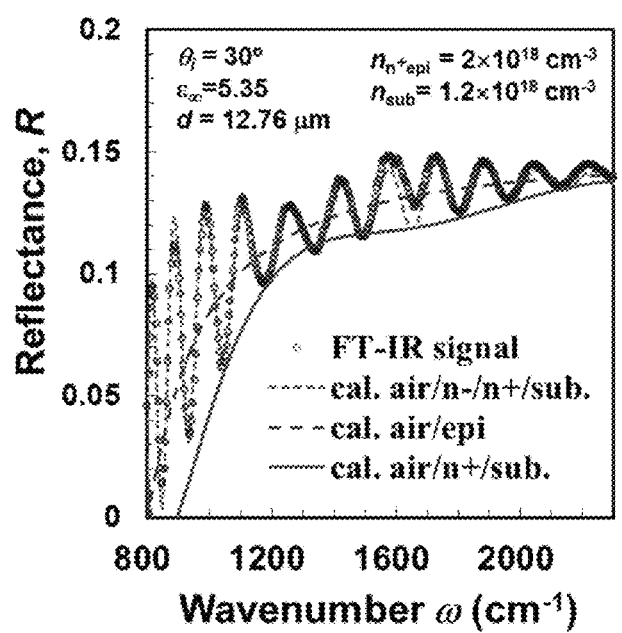
FIG. 18 is a view illustrating a reflection spectrum according to the second embodiment.

The reflection spectrum is obtained by calculation from the optical model and the dielectric function model. FIG. 18 illustrates an example of the reflection spectrum in this embodiment. A reflection spectrum for an interface between the medium $N_0$ and the laminate of the substrate $N_3$ and the epi layer $N_2$ based on the reflectance coefficient $r_{02}$ when there is no epi layer $N_1$, is shown by a solid line in FIG. 18, and a reflection spectrum for an interface between the medium $N_0$ and the epi layer $N_1$ based on the reflectance coefficient $r_{01}$ is shown by a broken line in FIG. 18. Further, a reflection spectrum for an optical model composed of medium $N_0$ epi layer $N_1$/epi layer $N_2$/substrate $N_3$ based on reflectance coefficient $r_{012}$, that is, a reflection spectrum (this is also called "calculated reflection spectrum") that simulates a reflection spectrum (this is also called "measured reflection spectrum") obtained by irradiating the nitride semiconductor laminate 1 with infrared light, is shown by a dotted line in FIG. 18.

The fringe pattern of the calculated reflection spectrum changes according to a set value of the optical model. For example, in the spectrum analysis step (S230), by selecting the set value of the optical model so that the fringe pattern of the calculated reflection spectrum is fitted to the fringe pattern of the actually measured reflection spectrum, a calculated reflection spectrum can be obtained that best approximates the actually measured reflection spectrum.

According to this example, in the set values of the optical model, the carrier concentration of the substrate $N_3$ and the thickness of the epi layer $N_1$ are used as parameters. By changing the thickness of the epi layer $N_1$, the pitch in the wavenumber direction in the calculated fringe pattern of the reflection spectrum changes. Further, by changing the carrier concentration of the substrate $N_3$, the amplitude in the reflectance direction in the fringe pattern of the calculated reflection spectrum changes. As illustrated in FIG. 18, in this example, by setting the carrier concentration of the substrate $N_3$ to $1.2\times10^{18}$ cm$^{-3}$ and setting the thickness of the epi layer $N_1$ to 12.76 µm, the actually measured reflection spectrum and the calculated reflection spectrum can be matched very well. By such fitting, the film thickness of the epi layer $N_1$ (drift layer 22) is calculated to be 12.76 µm.

Thus, the inventor of the present application has confirmed that the actually measured reflection spectrum and the calculated reflection spectrum can be matched very well as a whole. On the other hand, it is also found that a deviation between the two reflection spectra becomes large in the vicinity of a predetermined wavenumber determined in a wavenumber range of 1,600 cm$^{-1}$ or more and 1,700 cm$^{-1}$ or less, for example, in the vicinity of a wavenumber of 1,650 cm$^{-1}$. The calculated reflection spectrum is determined to have a constant shape by determining the film thickness of the epi layer $N_1$ (drift layer 22). Accordingly, it can be considered that such a deviation of the actually measured reflection spectrum from the calculated reflection spectrum (this is also referred to as "reflected light amount deviation") is caused by some film quality other than the film thickness in the drift layer 22.

Accordingly, for example, in the spectrum analysis step (S230), the film quality of the drift layer 22 can be inspected by detecting the deviation in the amount of reflected light at a predetermined wavenumber. In the example illustrated in FIG. 18, a maximum deviation in the amount of the reflected light (difference in the intensity reflectance R) that occurs at a wavenumber of about 1,650 cm$^{-1}$ is about 1%.

Since the deviation in the amount of the reflected light is large in the vicinity of the wavenumber of 1,650 cm$^{-1}$, the actually measured reflection spectrum and the calculated reflection spectrum may be fitted except for a wavenumber range sandwiching 1,650 cm$^{-1}$, for example, a wavenumber range of 1.600 cm$^{-1}$ or more and 1,700 cm$^{-1}$ or less. For the fitting, for example, a method of least squares is used.

Details are unknown, but one possibility is that such a deviation in the amount of the reflected light is probably caused by some point defects generated in the drift layer 22, for example, this is caused by infrared absorption due to a double bond (C=N) between carbon (C) entering the gallium (G site and nitrogen (N). As a wavenumber range in which infrared absorption occurs due to C=N, a wavenumber range of 1,610 cm$^{-1}$ or more and 1,680 cm$^{-1}$ or less is known. It is theoretically shown that the intensity reflectance R increases as the infrared absorption at a certain wavenumber increases. There are various possible causes for C mixing, but for example, when the semiconductor layer 20 is grown by MONTE, C derived from a source gas is mixed in the semiconductor layer 20.

When there are no point defects in the drift layer 22, it is estimated that the deviation in the amount of the reflected light does not occur, and it is estimated that the larger the point defect density, the larger the deviation of amount of the reflected tight.

Accordingly, it is considered possible to estimate the point defect density in the drift layer 22 based on a degree of deviation in the amount of the reflected light.

Regarding a sample different from the result shown in FIG. 18, the inventors of the present application found that, for example, when the degree of the deviation in the amount of the reflected light (degree of the intensity reflectance R) at a wavenumber of 1,650 cm$^{-1}$ is about 8%, the C concentration measured by SIMS is about $5 \times 10^{15}$ at ·cm$^{-3}$. It is suggested that C with a concentration of $10^{15}$ at ·cm$^{-3}$ or less can be detected in a non-contact and non-destructive manner by using the deviation in the amount of the reflected light.

The deviation in the amount of the reflected light is not limited to the estimation of the point defect density, and may be used for the inspection of the film quality by various methods. For example, the film quality may be inspected by checking whether the degree of the deviation in the amount of the reflected light is within a predetermined allowable range. Further, for example, the uniformity of the film quality may be inspected by detecting the deviation in the amount of the reflected light a plurality of times and examining whether the degree of the deviation in the amount of the reflected light is excessively variable.

For example, the in-plane uniformity of the film quality of the drift layer 22 may be inspected as follows. In the measurement step (S220), the actually measured reflection spectra are acquired at a plurality of positions on the main surface of the drift layer 22. Then, at each of the plurality of positions, the reflected light amount deviation is detected, and the detected plurality of reflected light amount deviations are compared with each other to check whether the difference between the reflected light amount deviations is equal to or less than a predetermined value.

Regarding a sample different from the result shown in FIG. 18, when the degree of the deviation in the amount of the reflected light (degree of the difference in the intensity reflectance R) at a wavenumber of 1,650 cm$^{-1}$ was examined in each of a central portion, a left portion, and a right portion on the main surface of the drift layer 22, it was 6.2%, 7.2% and 8.1%. The variability of these values is evaluated, for example, by the ratio of a maximum to a minimum (8.1%/6.2%). In this example, this ratio is 1.31 times, and the variation is estimated to be 31%. By generalizing this result, it can be said as follows regarding a good in-plane uniformity of the film quality. The variation of the deviation in the amount of the reflected light acquired at a plurality of positions on the main surface of the drift layer 22 is preferably 50% or less (That is, the ratio of the maximum to the minimum is 1.5 times or less).

Further, for example, as will be described in detail in a modified example of the second embodiment described later, the uniformity of the film quality among the drift layers 22 of the plurality of nitride semiconductor laminates 1 may be inspected by comparing the difference in the amount of reflected light of each drift layer 22 in the plurality of nitride semiconductor laminates 1.

In the step for specifying and outputting the film thickness value based on the analysis result (S240) of the second embodiment, a film thickness value is specified and outputted as in the first embodiment. In the second embodiment, the film quality is further specified by obtaining the result of the film quality inspection using the deviation in the amount of the reflected light, and this result is also outputted. Therefore, in the second embodiment, the above step (S240) is also referred to as "a step for specifying and outputting film thickness and film quality based on analysis result" instead of "a step for specifying and outputting film thickness based on analysis result" (see FIG. 11).

By inspecting the film thickness and film quality of the semiconductor layer 20 (particularly the drift layer 22 in this example) in the film thickness/film quality inspection step (S130), the film quality control of the semiconductor layer 20 can be strictly performed in addition to the film thickness control described in the first embodiment. Specifically, for example, by comparing the inspection result of the film quality of the semiconductor layer 20 and a predetermined reference, the quality of the produced nitride semiconductor laminate 1 can be determined. Further, for example, it is also conceivable to determine the suitability of various treatment conditions when producing the nitride semiconductor laminate 1 based on the film quality inspection result obtained in the film thickness/film quality inspection step (S130).

As described above, in the second embodiment, in the film thickness/film quality inspection step (S130), the film thickness is measured and the film quality is inspected using the film thickness measurement. The inspection of the film quality can be summarized as follows, for example, the film quality of the thin film (drift layer 22 in this example) to be inspected is inspected by detecting the deviation in the amount of the reflected light in a predetermined wavenumber (for example, 1,650 cm$^{-1}$) defined in the range of 1,600 cm$^{-1}$ or more and 1,700 cm$^{-1}$ or less in the measured reflection spectrum, from the amount of the reflected light in the predetermined wavenumber of the calculated reflection spectrum (that is, the amount of the reflected light in the predetermined wavenumber determined according to the set value of the optical model).

(2) Effect Obtained by the Present Embodiment

According to the present embodiment, one or more of the following effects can be obtained.

(a) Since the nitride semiconductor laminate 1 in which the semiconductor layer 20 is homoepitaxially grown on the substrate 10 is configured to enable film thickness measurement using the FT-IR method, the film quality inspection using the film thickness measurement can be performed. Provided is a method for producing a nitride semiconductor laminate 1, which comprises a novel step of performing a film quality inspection on the nitride semiconductor laminate 1 in a non-destructive and non-contact manner. Film thickness and film quality (both) can be inspected simultaneously in a non-destructive and non-contact manner. By controlling the film quality, properties and reliability of the semiconductor device configured using the nitride semiconductor laminate 1 can be improved.

A substrate in which the dislocation density on the main surface of the substrate 10 is $5 \times 10^6$ pieces/cm$^2$ or less, the oxygen concentration in the substrate 10 is less than $1 \times 10^{17}$ at ·cm$^{-3}$, and the concentration of impurities other than n-type impurities in the substrate 10 is less than $1 \times 10^{17}$ at ·cm$^{-3}$, is used as the substrate 10. Since the semiconductor layer 20 to be inspected is homoepitaxially grown on the substrate 10 having such a high quality, the deviation in the amount of the reflected light that occurs in the wavenumber range of 1,600 cm$^{-1}$ or more and 1.700 cm$^{-1}$ or less in the infrared light reflection spectrum, can be satisfactorily detected. That is, in other wavenumber ranges (for example, a wavenumber range of 1,500 cm$^{-1}$ or more and less than 1,600 cm$^{-1}$ and more than 1,700 cm$^{-1}$ and 1,800 cm$^{-1}$ or less, further for example, a wavenumber range of 1,000 cm$^{-1}$ or more and less than 1,600 cm$^{-1}$ and 1,700 cm$^{-1}$ or more and 2,000 cm$^{-1}$ or less), the actually measured reflection spectrum and the calculated reflection spectrum can be almost matched. Therefore, the characteristic deviation in the amount of the reflected light that occurs in the wavenumber range of 1,600 cm$^{-1}$ or more and 1,700 cm$^{-1}$ or less, can be clearly detected.

In the first embodiment, analysis was performed using a simplified optical model as illustrated in FIG. 12B. However, as illustrated in FIG. 16B, the reflection spectrum obtained by using the optical model and the actually measured reflection spectrum are similar to some extent. Then, in the wavenumber range of 1,600 cm$^{-1}$ or more and 1,700 cm$^{-1}$ or less, it is observed that the deviation in the amount of the reflected light is large. Accordingly, the film quality may be inspected by detecting the deviation in the amount of the reflected light using the simplified optical model as illustrated in FIG. 12B as shown in the first embodiment.

In order to improve the accuracy of the analysis, it is preferable to use an optical model that is closer to an actual one as described in the second embodiment. When one or more other films (in this example, the base n-type semiconductor layer 21) that are homoepitaxially grown are interposed on the substrate between the substrate (substrate 10 in this example) and the thin film to be inspected (drift layer 22 in this example the optical model preferably takes into account at least one of the other films, along with the above substrate and thin film, to improve the accuracy of analysis. As a dielectric function model, it is preferable to use the Lorenz-Drude model in which the influence of phonons is taken into consideration. In order to further improve the analysis accuracy, it is desirable to analyze the phonon attenuation coefficient as $\Gamma_{LO} \neq \Gamma_{TO}$.

(b) The deviation in the amount of the reflected light can be used for the inspection of the film quality by various methods. For example, a point defect density can be estimated based on the degree of the deviation in the amount of the reflected light. Further, for example, the uniformity of the film quality can be inspected by detecting the deviation in the amount of the reflected light a plurality of times and examining whether or not there is an excessive variation in the degree of the deviation in the amount of the reflected light. The in-plane uniformity of the film quality can be inspected by inspection at a plurality of positions of the same nitride semiconductor laminate 1. Further, by inspecting the plurality of nitride semiconductor laminates 1, the uniformity of the film quality among the plurality of nitride semiconductor laminates 1 can be inspected.

(c) Since the semiconductor layer 20 is homoepitaxially grown on the high quality substrate 10 described above, the nitride semiconductor laminate 1 is a nitride semiconductor laminate that makes it possible to clearly find a deviation in the amount of the reflected light from the calculated reflection spectrum that appears in the wavenumber range of 1,600 cm$^{-1}$ or more and 1,700 cm$^{-1}$ or less in the measured reflection spectrum. The features of the nitride semiconductor laminate 1 can be summarized as follows, for example, when taking into consideration of the deviation in the amount of the reflected light at a predetermined wavenumber in the measured reflection spectrum, from the amount of the reflected light at the predetermined wavenumber in the calculated reflection spectrum, a maximum value of the degree of the deviation in a wavenumber range of 1,600 cm$^{-1}$ or more and 1,700 cm$^{-1}$ or less is larger than any of a maximum value of the degree of the deviation in a wavenumber range of 1,500 cm$^{-1}$ or more and less than 1,600 cm$^{-1}$ and a maximum value of the degree of the deviation in a wavenumber range of more than 1,700 cm$^{-1}$ and 1,800 cm$^{-1}$ or less.

As described above, one possibility of the deviation in the amount of the reflected light is considered to be the mixing of C, and it is considered that degree of the deviation in the amount of the reflected light changes depending on the degree of mixing of C. For example, C is mixed in the semiconductor layer 20 grown by MOVPE at a concentration of about $3 \times 10^{15}$ to $5 \times 10^{15}$ at ·cm$^{-3}$. An approximate degree of the maximum deviation in the amount of the reflected light (difference in intensity reflectance R) in the wavenumber range of 1,600 cm$^{-1}$ or more and 1,700 cm$^{-1}$ or less regarding a sample in which C is mixed at a concentration on the order of $10^{15}$ at cm$^{-3}$ is % or more and 10% or less.

It is considered that the deviation in the amount of the reflected light becomes small by using a growth technique in which the mixing of C is further suppressed. When the deviation in the amount of the reflected light is very small, the measured reflection spectrum and the calculated reflection spectrum are almost matched in the wavenumber range of 1,600 cm$^{-1}$ or more and 1,700 cm$^{-1}$ or less, as in the other wavenumber ranges. By suppressing the mixing of C into a concentration below an order of $10^{14}$ at ·cm$^{-3}$, the degree of the maximum deviation in the amount of the reflected light (difference in intensity reflectance R) in the wavenumber range of 1,600 cm$^{-1}$ or more and 1,700 cm$^{-1}$ or less becomes as small as less than 1%, more preferably 0.5% or less. In this case, each of the maximum deviation iii the amount of the reflected light is less than 1%, more preferably 0.5% or less, in the wavenumber range of 1,600 cm$^{-1}$ or more and 1,700 cm$^{-1}$ or less, the wavenumber range of 1,500 cm$^{-1}$ or more and less than 1,600 cm$^{-1}$, and the wavenumber range of more than 1,700 cm$^{-1}$ and 1,800 cm$^{-1}$ or less.

The measured reflection spectrum and the calculated reflection spectrum show a complex shape with a fringe pattern. Accordingly, if the measured reflection spectrum cannot be well approximated by the calculated reflection spectrum, both reflection spectra will be significantly different in various wavenumbers, and therefore the above-described deviation in the amount of the reflected light cannot be appropriately detected. By using the nitride semiconductor laminate 1 according to the present embodiment, good approximation is possible, and even if the reflection spectrum has a fringe pattern, the deviation in the amount of the reflected light can be appropriately detected. That is, appropriate evaluation can be performed regardless of whether the deviation in the amount of the reflected light is large or the deviation in the amount of the reflected light does not occur.

Modified Example of the Second Embodiment

Figure 19:
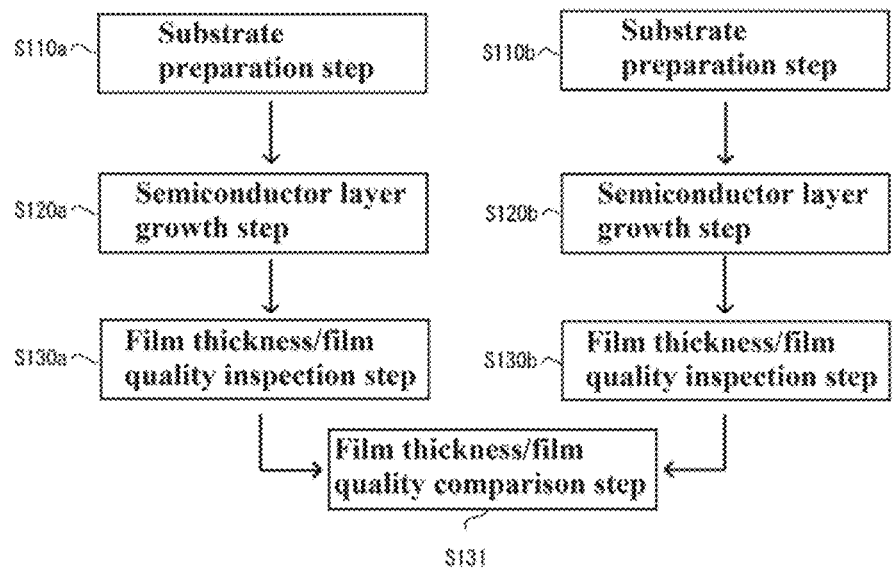
FIG. 19 is a flow chart illustrating a schematic procedure of a method for producing a plurality of the nitride semiconductor laminate 1 according to a modified example of the second embodiment.

Next, a modified example of the second embodiment will be described. As described above, in the modified example, the uniformity of the film quality between the drift layers 22 of the plurality of nitride semiconductor laminates 1 is inspected. FIG. 19 is a flow chart illustrating a method for producing a plurality of nitride semiconductor laminates 1 in this modified example. As an example, a case where two nitride semiconductor laminates 1 are produced will be described. Steps S110$a$ to S130$a$ show a method for producing a certain nitride semiconductor laminate 1, and steps S110$b$ to S130$b$ show a method for producing another nitride semiconductor laminate 1. Steps S110$a$ and S110$b$ are the same as the substrate production step (S110) described with reference to FIG. 7, respectively. Steps S120$a$ and S120$b$ are the same as the semiconductor layer growth step (S120) described with reference to FIG. 7, respectively. Steps S130a and S130b are the same as the film thickness/film quality inspection step (S130) in the second embodiment described with reference to FIG. 7, respectively.

In step S130a, the deviation in the amount of the reflected light is detected for the drift layer 22 of a certain nitride semiconductor laminate 1. Similarly, the deviation in the amount of the reflected light is detected in step S130b for the drift layer 22 of the other nitride semiconductor laminate 1.

This modified example further includes a film thickness/film quality comparison step (S131). In the film thickness/film quality comparison step (S131), by checking whether the difference between the deviation in the amount of the reflected light is less than the specified value, when the deviation in the amount of the reflected light detected for the drift layer 22 of a certain nitride semiconductor laminate 1 is compared with the deviation in the amount of the reflected light detected for the drift layer 22 of another nitride semiconductor laminate 1, the uniformity of the film quality between the drift layer 22 of a certain nitride semiconductor laminate 1 and the drift layer 22 of another nitride semiconductor laminate 1 is inspected. The uniformity of the film quality between the drift layers 22 may be inspected in the same manner for the three or more nitride semiconductor laminates 1. In this step (S131), the uniformity of the film thickness between the drift layers 22 of the plurality of nitride semiconductor laminates 1 may be inspected.

Third Embodiment

Next, a third embodiment will be described. In the third embodiment, a method for producing a nitride semiconductor laminate 2 including a semiconductor layer 40 configured as a multilayer film having multiple layers (two or more layers, for example, five layers) on a substrate 30 will be described. The method for producing the nitride semiconductor laminate 2 according to the third embodiment can be applied as an inspection method for a semiconductor growth apparatus, as will be described in detail later.

Figure 20:
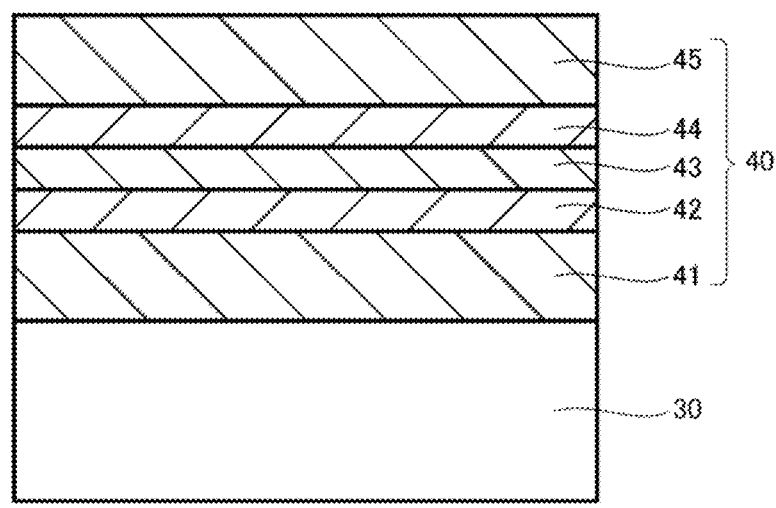
FIG. 20 is a cross-sectional view schematically illustrating a schematic configuration example of the nitride semiconductor laminate 2 according to a third embodiment.

FIG. 20 is a cross-sectional view schematically illustrating a schematic configuration example of the nitride semiconductor laminate 2. The semiconductor layer 40 is homoepitaxially grown on the substrate 30, and has, for example, five layers 41 to 45.

Figure 21:
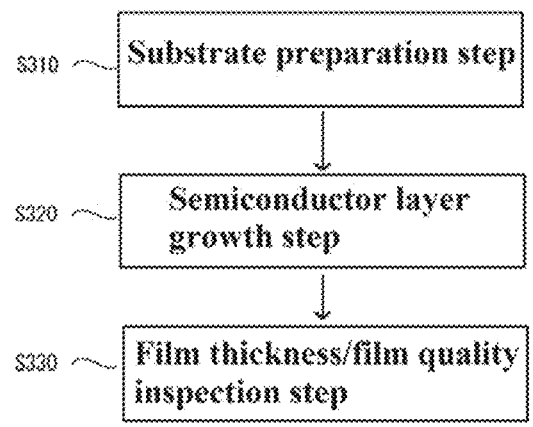
FIG. 21 is a flow chart illustrating a schematic procedure of a method for producing the nitride semiconductor laminate 2 according to the third embodiment.

FIG. 21 is a flow chart illustrating a method for producing the nitride semiconductor laminate 2. The method for producing the nitride semiconductor laminate 2 includes a substrate preparation step (S310), a semiconductor layer growth step (S320), and a film thickness/film quality inspection step (S330). In the substrate preparation step (S310), the substrate 30 is prepared. The substrate 30 is the same as the substrate 10 described in the first and second embodiments.

In the semiconductor layer growth step (S320), the semiconductor layer 40 is formed by growing the layers 41 to 45 on the substrate 30. Each layer of layers 41 to 45 is grown similarly to the growth of the base n-type semiconductor layer 21 or the drift layer 22 described in the semiconductor layer growth step (S120) in the first embodiment. Layers 41 to 45 are grown, for example, by a MOVPE apparatus.

In the film thickness/film quality inspection step (S330), the film quality of the semiconductor layer 40 is inspected similarly to the film thickness/film quality inspection step (S130) in the second embodiment. That is, the film quality of the semiconductor layer 40 is inspected by detecting the deviation in the amount of the measured reflected light in the reflected spectrum obtained from the nitride semiconductor laminate 2, from the amount of the reflected light in the calculated reflection spectrum.

Figure 22:
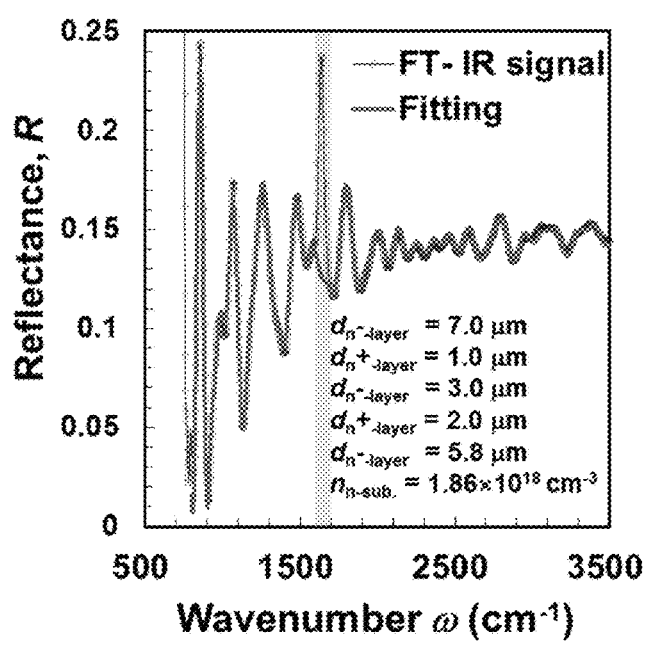
FIG. 22 is a view illustrating a reflection spectrum according to the third embodiment.

FIG. 22 illustrates an example of the reflection spectrum according to the present embodiment. The measured reflection spectrum is shown by a thin solid line and a circular plot in FIG. 22, and the calculated reflection spectrum is shown by a thick solid line in FIG. 22. Also in this example, a large deviation in the amount of reflected light is observed in the wavenumber range of 1,600 $cm^{-1}$ or more and 1,700 $cm^{-1}$ or less, and in the other wavenumber range, both reflection spectra are almost matched. As an optical model for obtaining the calculated reflection spectrum, an optical model in consideration of the medium, the layers 41 to 45, and the substrate 30 is used. The Lorenz-Drude model is used as the dielectric function model.

Set values of the optical model for the calculated reflection spectrum fitted to the actually measured reflection spectrum are as follows. The carrier concentration of the substrate 30 is $1.86 \times 10^{18}$ $cm^{-3}$. The thicknesses of layers 41 to 45 are 5.8 μm, 2.0 μm, 3.0 μm, 1.0 μm and 7.0 μm, respectively. The layers 41, 43 and 45 are $n^-$ layers having a relatively low carrier concentration (that is, n-type impurity concentration), and the carrier concentration of each of the layers 41, 43 and 45 is 0 $cm^{-3}$. Layers 42 and 44 are $n^+$ layers having a relatively high carrier concentration (that is, n-type impurity concentration), and the carrier concentration of each of the layers 42 and 44 is $2.35 \times 10^{18}$ $cm^{-1}$. Layers 41 to 45 have a structure in which $n^-$ layers 41, 43 and 45 and $n^+$ layers 42 and 44 are alternately laminated. In this example, fitting is performed by changing the carrier concentration of the substrate 30 and the thicknesses of the layers 41 and 45 as parameters. By this fitting, the thickness of the layer 41 is measured to be 5.8 μm, and the thickness of the layer 45 is measured to be 7.0 μm.

The calculated reflection spectrum according to this example has a fringe pattern that does not include a maximum or a minimum in the wavenumber range of 1,600 $cm^{-1}$ or more and 1,700 $cm^{-1}$ or less (or for example, the wavenumber range of 1,610 $cm^{-1}$ or more and 1,680 $cm^{-1}$ or less as a narrower range in the vicinity of 1,650 $cm^{-1}$). That is, in the calculated reflection spectrum according to this example, the change in the amount of the reflected light in the wavenumber range is gradual as compared with the case where the wavenumber range includes a maximum or a minimum. Thereby, in this example, in the above wavenumber range, the deviation in the amount of the measured reflected light in the reflected spectrum from the amount of the calculated reflected light in the reflected spectrum can be detected more clearly.

As in the example illustrated in FIG. 18, when the calculated reflection spectrum has a maximum or a minimum in the wavenumber range of 1,600 $cm^{-1}$ or more and 1,700 $cm^{-1}$ or less, there is a concern that an error that cannot reproduce the fringe pattern in calculation will be detected as the above-described deviation in the amount of the reflected light. However, as in the example illustrated in FIG. 22, even when the calculated reflection spectrum does not include a maximum or a minimum in the wavenumber range, the deviation in the amount of the reflected light as described above is clearly detected. From this fact, it is confirmed that the above-described deviation in the amount of the reflected light is not detected in an error manner.

The fringe pattern of the calculated reflection spectrum can be changed in the optical model, by adjusting the carrier concentration of the substrate 30 and the thickness and the carrier concentration of each of the layers 41 to 45 constituting the semiconductor layer 40. For example, by using the above set value, a fringe pattern having no maximum or minimum can be obtained in the wavenumber range of 1,600 $cm^{-1}$ or more and 1,700 $cm^{-1}$ or less. In order to obtain such a fringe pattern having no maximum or minimum in the calculated reflection spectrum, the semiconductor layer 40 is composed of a structure in which layers having a relatively low carrier concentration (n⁻ layer) and layers having a relatively high carrier concentration (n⁺ layer) are alternately laminated, and the thickness of each layer of the n⁻ layer may be adjusted, or the thickness of each layer of the n⁺ layer may be adjusted. If a fringe pattern that does not have a maximum or a minimum in the wavenumber range can be obtained, the number of layers of the semiconductor layer 40 is not limited to the five layers as illustrated, and may be less than or more than five layers. Further, the outermost layer of the semiconductor layer 40 may be the n⁺ layer instead of the n⁻ layer as illustrated.

In the substrate preparation step (S310), for example, the substrate 30 having a carrier concentration equal to the above-described set value may be prepared. Then, in the semiconductor layer growth step (S320), for example, the thickness and the carrier concentration may be adjusted so that the layers 41 to 45 are grown so as to be equal to the above-described set value. As a result, it is possible to obtain a nitride semiconductor laminate 2 in which the actually measured reflection spectrum is well fitted to the calculated reflection spectrum. Thereby, it is possible to obtain the nitride semiconductor laminate 2 in which the deviation in the amount of the reflected light in the wavenumber range of 1,600 $cm^{-1}$ or more and 1.700 $cm^{-1}$ or less can be detected more clearly. Although the carrier concentration of the n⁻ layers 41, 43, and 45 were 0 $cm^{-3}$ in the above set value, it may be sufficiently lower than the carrier concentration of the n+ layers 42 and 44, which is $2.35 \times 10^{18}$ $cm^{-3}$, and may be, for example, about $1 \times 10^{16}$ $cm^{-3}$.

As described above, according to the present embodiment, the clarity of the deviation in the amount of the reflected light can be improved by appropriately designing the laminated structure of the semiconductor layer 40. By applying this, the semiconductor growth apparatus for growing the semiconductor layer 40 can be inspected as described below. For example, by examining whether the degree of the deviation in the amount of the reflected light obtained in the film thickness/film quality inspection step (S330) is within a predetermined allowable range, whether or not the semiconductor growth apparatus is normal, can be judged. Also for example, by producing the nitride semiconductor laminate 2 a plurality of times and examining whether or not the degree of the deviation in the amount of the reflected light obtained in each film thickness/film quality inspection step (S330) is excessively changed, whether or not an abnormality has occurred in the semiconductor growth apparatus, can be determined.

Other Embodiments

The embodiments of the present invention have been specifically described above. However, the present invention, is not limited to the above-described embodiments, and various modifications can be made without departing from the gist thereof.

In the above-described embodiment, explanation is given for a case where the film thickness measurement or the film quality inspection is performed using the FT-IR method as an example, but the present invention is not limited thereto. For example, when the nitride semiconductor laminate 1 or 2 is constituted using the substrates 10 or 30 described in the above-described embodiment, the film thickness measurement or the film quality inspection can be performed not only by the FT-IR method but also by an infrared spectroscopic ellipsometry method, because an extinction coefficient k becomes relatively large on the lower wavenumber side than the TO phonon (560 $cm^{-1}$) due to free carrier absorption. The infrared spectroscopic ellipsometry method is one of the optical measurement methods, and is a technique for measuring the film thickness by measuring a change in a polarization state due to the reflection of light on the sample.

In the above-described embodiment, explanation is given for a case where the substrates 10 and 30 and the semiconductor layers 20 and 40 comprise GaN, respectively. However, the substrates 10 and 30 and the semiconductor layers 20 and 40 are not limited to GaN, and may comprise crystals of other group III nitride semiconductors. Examples of other group III nitride semiconductors include indium nitride (InN) and indium gallium nitride (InGaN Further, AlN, aluminum gallium nitride (AlGaN), indium gallium nitride (AlInGaN) and the like may be used. As described above, the group III nitride semiconductor includes those represented by a composition formula of $Al_xIn_yGa_{1-x-y}N$ ($0 \leq x \leq 1$, $0 \leq y \leq 1$, $0 \leq x+y \leq 1$). That is, the present invention can be applied not only to the GaN-on-GaN substrate, but also for, for example, to an AlN-on-AlN substrate in which an MN layer is homoepitaxially grown on an AlN substrate, or to a homoepitaxial growth substrate using other group III nitride semiconductors, in exactly the same manner. For those containing Al composition, it is conceivable to measure the film thickness or inspect the film quality by the spectroscopic ellipsometry method.

In the above-described embodiment, explanation is given for a case where the substrate 10 is produced by using the seed substrate 5 comprising a GaN single crystal in the substrate production step (S110). However, the substrate 10 may be produced by the following method. For example, a GaN layer provided on a dissimilar substrate such as a sapphire substrate is used as a base layer, and a crystal ingot in which a GaN layer is thickly grown interposing a nanomask or the like is peeled off from a dissimilar substrate, and a plurality of substrates 10 may be cut out from this crystal ingot.

In the above-described embodiment, explanation is given, for a case where the semiconductor layer 20 or 40 is formed by the MOVPE method in the semiconductor layer growth step (S120 or S320). However, the semiconductor layer 20 or 40 may be formed by another vapor phase growth method such as a HYPE method or a liquid phase growth method such as a flux method or an amonothermal method.

In the above-described embodiment, explanation is given for a case where the semiconductor device configured by using the nitride semiconductor laminate 1 is an SBD. However, the semiconductor device may be configured as another device as long as the substrate 10 containing n-type impurities is used. For example, the semiconductor device may be a light emitting diode, a laser diode, a junction barrier Schottky diode (JBS), a bipolar transistor, or the like.

Hereinafter, preferable supplementary descriptions of the present invention will be described.

(Supplementary Description 1)

There is provided a method for producing a nitride semiconductor laminate in which a thin film is homoepitaxially grown on a substrate comprising group lit nitride semiconductor crystals, the method including:

homoepitaxially growing a thin film on a substrate, using the substrate in which a dislocation density on its main surface is $5\times10^6$ pieces/cm$^2$ or less, a concentration of oxygen therein is less than $1\times10^{17}$ at ·cm$^{-3}$, and a concentration of impurities therein other than n-type impurity is less than $1\times10^{17}$ at ·cm$^{-3}$; and inspecting a film quality of the thin film formed on the substrate, wherein in the inspection of the film quality, the film quality of the thin film is inspected by detecting a deviation of an amount of reflected light at a predetermined wavenumber determined in a range of 1,600 cm$^{-1}$ or more and 1,700 cm$^{-1}$ or less in a reflection spectrum obtained by irradiating the thin film on the substrate with infrared light, from an amount of reflected light at the predetermined wavenumber determined according to a film thickness of the thin film, a carrier concentration of the substrate, and a carrier concentration of the thin film.

(Supplementary Description 2)

There is provided the method for producing a nitride semiconductor laminate according to the supplementary description 1, wherein in the inspection of the film quality, the deviation is detected at each of a plurality of positions on the main surface of the thin film, and multiple detected deviations are compared, to thereby inspect an in-plane uniformity of the film quality of the thin film.

(Supplementary Description 3)

There is provided the method for producing a nitride semiconductor laminate according to the supplementary description 1 or 2, further including:

inspecting a film quality for the other thin film of the other nitride semiconductor laminate in which the other thin film is homoepitaxially grown on the other substrate comprising crystals of the group III nitride semiconductor, in the same manner as for the thin film of the nitride semiconductor laminate; and inspecting a uniformity of the film quality between the thin film of the nitride semiconductor laminate and the other thin film of the other e semiconductor laminate, by comparing a detected deviation of the nitride semiconductor laminate from the thin film, and a detected deviation of the other nitride semiconductor laminate from the other thin film.

(Supplementary Description 4)

There is provided the method for producing a nitride semiconductor laminate according to any one of the supplementary descriptions 1 to 3, wherein in the inspection of the film quality, a point defect density in the thin film is estimated based on a degree of the deviation.

(Supplementary Description 5)

There is provided the method for producing a nitride semiconductor laminate according to any one of the supplementary descriptions 1 to 4, wherein in the inspection of the film quality, the film thickness of the thin film is measured based on a fringe pattern of the reflection spectrum.

(Supplementary Description 6)

There is provided the method for producing a nitride semiconductor laminate according to any one of the supplementary descriptions 1 to 5, wherein in the inspection of the film quality, the film quality of the thin film is inspected by using Fourier transform infrared spectroscopy or infrared spectroscopic ellipsometry.

(Supplementary Description 7)

There is provided the method for producing a nitride semiconductor laminate according to any one of the supplementary descriptions 1 to 6, wherein an absorption coefficient α in a wavelength range of at least 1 μm or more and 3.3 μm or less is approximated by equation (1) by a method of least squares, and an error of the measured absorption coefficient with respect to the absorption coefficient α obtained from the equation (1) is within ±0.1α at a wavelength of 2 μm, $$\alpha = N_e K \lambda^a \quad (1) \quad (\text{wherein, } 1.5\times10^{-19} \leq K \leq 6.0\times10^{-19}, a=3$$

where a wavelength is λ (μm), the absorption coefficient of the substrate at 27° C. is α (cm$^{-1}$), the carrier concentration in the substrate is Ne (cm$^{-1}$) and K and a are constants.

(Supplementary Description 8)

There is provided the method for producing a nitride semiconductor laminate according to any one of the supplementary descriptions 1 to 7, wherein a crystal of the group III nitride semiconductor is a gallium nitride crystal.

(Supplementary Description 9)

There is provided a method for inspecting a film quality for inspecting a film quality of a thin film in a nitride semiconductor laminate obtained by homoepitaxially growing the thin film on a substrate comprising crystals of a group III nitride semiconductor, which is a method for inspecting a film quality of a thin film (to detect carbon in the thin film) by detecting a deviation of an amount of reflected light at a predetermined wavenumber determined in a range of 1,600 cm$^{-1}$ or more and 1,700 cm$^{-1}$ or less in a reflection spectrum obtained by irradiating the thin film on the substrate with infrared light, from an amount of reflected light at the predetermined wavenumber determined according to a film thickness of the thin film, a carrier concentration of the substrate, and a carrier concentration of the thin film.

(Supplementary Description 10)

There is provided a method for producing a nitride semiconductor laminate in which a thin film is homoepitaxially grown on a substrate comprising group 111 nitride semiconductor crystals, the method including:

homoepitaxially growing a thin film on a substrate, using the substrate in which a dislocation density on its main surface is $5\times10^6$ pieces/cm$^2$ or less, a concentration of oxygen therein is less than $1\times10^{17}$ at ·cm$^{-3}$, and a concentration of impurities therein other than n-type impurity is less than $1\times10^{17}$ at ·cm$^{-3}$; and inspecting a film quality of the thin film formed on the substrate, the inspection of the film quality including:

acquiring an actually measured first reflection spectrum by irradiating the thin film on the substrate with infrared light;

acquiring a calculated second reflection spectrum using an optical model showing a laminated structure of the nitride semiconductor laminate and a dielectric function model showing a dielectric function of the nitride semiconductor laminate, that is, acquiring the second reflection spectrum by setting a film thickness of the thin film, a carrier concentration of the substrate, and a carrier concentration of the thin film in the optical model and the dielectric function model so that a fringe pattern of the second reflection spectrum is fitted to a fringe pattern of the first reflection spectrum; and detecting a deviation of an amount of reflected light in a predetermined wavenumber determined in a range of 1,600 cm$^{-1}$ or more and 1,700 cm$^{-1}$ or less in the first reflection spectrum, from an amount of reflected light at the predetermined wavenumber of the second reflection spectrum.

(Supplementary Description 11)

There is provided the method for producing a nitride semiconductor laminate according to the supplementary description 10, wherein when the nitride semiconductor laminate has at least one other film homoepitaxially grown on the substrate between the substrate and the thin film, the optical model is preferably an optical model in consideration of the substrate and the thin film as well as the other film.

(Supplementary Description 12)

There is provided the method for producing a nitride semiconductor laminate according to the supplementary description 10 or 11, wherein the dielectric function model is a Lorenz-Drude model.

(Supplementary Description 13)

There is provided a nitride semiconductor laminate, including:
  a substrate comprising group III nitride semiconductor crystals; and
  a thin film homoepitaxially grown on the substrate,
  wherein a dislocation density on a main surface of the substrate is 5×10$^6$ pieces/cm$^2$ or less, a concentration of oxygen in the substrate is less than 1×10$^{17}$ at·cm$^{-3}$, and a concentration of impurities other than n-type impurity in the substrate is less than 1×10$^{17}$ at·cm$^{-3}$, and
  when taking into consideration of a deviation of an amount of reflected light at a predetermined wavenumber in a reflection spectrum obtained by irradiating the thin film on the substrate with infrared light, from an amount of reflected light at the predetermined wavenumber determined according to a film thickness of the thin film, a carrier concentration of the substrate, and a carrier concentration of the thin film, a maximum value of a degree of a deviation in a wavenumber range of 1,600 cm$^{-1}$ or more and 1,700 cm$^{-1}$ or less is larger than any of a maximum value of a degree of a deviation in a wavenumber range of 1,500 cm$^{-1}$ or more and less than 1,600 cm$^{-1}$ and a maximum value of a degree of a deviation in a wavenumber range of more than 1,700 cm$^{-1}$ and 1,800 cm$^{-1}$ or less.

(Supplementary Description 14)

There is provided the nitride semiconductor laminate according to the supplementary description 13, wherein the maximum value of the degree of the deviation in the wavenumber range of 1,600 cm$^{-1}$ or more and 1,700 cm$^{-1}$ or less is 1% or more and 10% or less as a degree of a difference in intensity reflectance.

(Supplementary Description 15)

There is provided a nitride semiconductor laminate, including:
  a substrate comprising group III nitride semiconductor crystals; and
  a thin film homoepitaxially grown on the substrate,
  wherein a dislocation density on a main surface of the substrate is 5×10$^6$ pieces/cm$^2$ or less, a concentration of oxygen in the substrate is less than 1×10$^{17}$ at·cm$^{-3}$, and a concentration of impurities other than n-type impurity in the substrate is less than 1×10$^{17}$ at·cm$^{-3}$, and
  when taking into consideration of a deviation of an amount of reflected light at a predetermined wavenumber in a reflection spectrum obtained by irradiating the thin film on the substrate with infrared light, from an amount of reflected light at the predetermined wavenumber determined according to a film thickness of the thin film, a carrier concentration of the substrate, and a carrier concentration of the thin film, any of a maximum value of a degree of a deviation in a wavenumber range of 1,600 cm$^{-1}$ or more and 1,700 cm$^{-1}$ or less, a maximum value of a degree of a deviation in a wavenumber range of 1,500 cm$^{-1}$ or more and less than 1,600 cm$^{-1}$ and a maximum value of a degree of a deviation in a wavenumber range of more than 1,700 cm$^{-1}$ and 1,800 cm$^{-1}$ or less, is less than 1.% (more preferably 0.5% or less) as a degree of a difference in intensity reflectance.

(Supplementary Description 16)

There is provided the nitride semiconductor laminate according to any one of the supplementary descriptions 13 to 15, wherein when the maximum value of the degree of the deviation in the wavenumber range of 1,600 cm$^{-1}$ or more and 1,700 cm$^{-1}$ or less is acquired at a plurality of positions on the main surface of the thin film, a maximum value is 1.5 times or less of a minimum value among the plurality of acquired maximum values.

(Supplementary Description 17)

There is provided the nitride semiconductor laminate according to any one of the supplementary descriptions 13 to 16, wherein an amount of reflected light determined according to the film thickness of the thin film, the carrier concentration of the substrate, and the carrier concentration of the thin film, is represented by a calculated reflection spectrum using an optical model showing a laminated structure of the nitride semiconductor laminate and a dielectric function model showing a dielectric function of the nitride semiconductor laminate, and
  the reflection spectrum is the reflection spectrum acquired by setting the film thickness of the thin film, the carrier concentration of the substrate, and the carrier concentration of the thin film in the optical model and the dielectric function model so that a fringe pattern of the reflection spectrum is fitted to a fringe pattern of a reflection spectrum obtained by irradiating the thin film on the substrate with infrared light.

(Supplementary Description 18)

There is provided the nitride semiconductor laminate according to the supplementary description 17, wherein the optical model is an optical model in consideration of at least the substrate and the thin film, and when the nitride semiconductor laminate has at least one other film homoepitaxially grown on the substrate between the substrate and the thin film, the optical model is preferably an optical model in consideration of the substrate and the thin film as well as the other film.

(Supplementary Description 19)

There is provided the nitride semiconductor laminate according to the supplementary description 17 or 18, wherein the dielectric function model is a Lorenz-Drude model, (Supplementary Description 20)

There is provided the nitride semiconductor laminate according to any one of the supplementary descriptions 13 to 19, wherein a degree of the deviation is measured by using Fourier transform infrared spectroscopy or infrared spectroscopic ellipsometry.

(Supplementary Description 21)

There is provided the nitride semiconductor laminate according to any one of the supplementary descriptions 13 to 20, wherein an absorption coefficient α in a wavelength range of at least 1 μm or more and 3.3 μm or less is approximated by equation (1) by a method of least squares, and an error of the measured absorption coefficient at a wavelength of 2µ with respect to the absorption coefficient α obtained from the equation (1) is within ±0.1α, where a wavelength is λ (µm), an absorption coefficient of the substrate at 27° C. is α (cm$^{-1}$), a carrier concentration in the substrate is Ne (cm$^{-3}$), and K and a are constants.

(Supplementary Description 22)

There is provided the nitride semiconductor laminate according to any one of the supplementary descriptions 13 to 21, wherein a crystal of the group III nitride semiconductor is a gallium nitride crystal.

(Supplementary Description 23)

There is provided the method for producing a nitride semiconductor laminate according to the supplementary description 4, or the nitride semiconductor laminate according to the supplementary description 13, wherein a degree of the deviation is represented by a degree of a difference in intensity reflectance.

(Supplementary Description 24)

There is provided a method for inspecting a film quality, which is a method for inspecting a film quality of a multilayer film in a nitride semiconductor laminate formed by homoepitaxially growing the multilayer film in which multiple layers comprising group III nitride semiconductor are laminated, on a substrate comprising crystals of the group III nitride semiconductor, the method including:

inspecting the film quality of the thin film (detecting carbon in the thin film) by detecting a deviation of an amount of reflected light at a predetermined wavenumber determined in a range of 1,600 cm$^{-1}$ or more and 1,700 cm$^{-1}$ or less in a reflection spectrum obtained by irradiating the multilayer film on the substrate with infrared light, from an amount of reflected light at the predetermined wavenumber determined according to a film thickness of each layer of the multilayer film, a carrier concentration of the substrate, and a carrier concentration of each layer, using the substrate in which a dislocation density on its main surface is 5×10$^6$ pieces/cm$^2$ or less, a concentration of oxygen is less than 1×10$^{17}$ at cm$^{-3}$, and a concentration of impurities other than n-type impurity is less than 1×10$^{17}$ at ·cm$^{-3}$, wherein the multilayer film is a multilayer film grown by adjusting a thickness of each layer and a carrier concentration of each layer, so that an amount of reflected light determined according to the thickness of each layer, the carrier concentration of the substrate, and the carrier concentration of each layer, does not have a maximum or minimum in a wavenumber range of 1,600 cm$^{-1}$ or more and 1,700 cm$^{-1}$ or less.

(Supplementary Description 25)

There is provided the method for inspecting a film quality according to the supplementary description 24, wherein the multilayer film has a structure in which a first-type layer having a relatively low carrier concentration and a second-type layer having a relatively low carrier concentration are alternately laminated, and is configured not to have a maximum or a minimum in a wavenumber range of 1,600 cm$^{-1}$ or more and 1,700 cm$^{-1}$ or less by adjusting a thickness of each layer of the first-type layer, or by adjusting a thickness of each layer of the second-type layer.

(Supplementary Description 26)

There is provided a method for inspecting a semiconductor growth device, for homoepitaxially growing a group III nitride semiconductor on a substrate comprising crystals of a group III nitride semiconductor, the method including:

homoepitaxially growing a multilayer film in which multiple layers comprising group III nitride semiconductors are laminated on a substrate, using the substrate in which a dislocation density on its main surface is 5×10$^6$ pieces/cm$^2$ or less, a concentration of oxygen is less than 1×10$^{17}$ at ·cm$^{-3}$, and a concentration of impurities other than n-type impurity is less than 1×10$^{17}$ at ·cm$^{-3}$; and inspecting a film quality of the multilayer film formed on the substrate, wherein in the inspection of the film quality, the film quality of the multilayer film is inspected by detecting a deviation of an amount of reflected light at a predetermined wavenumber determined in a range of 1,600 cm$^{-1}$ or more and 1,700 cm$^{-1}$ or less in a reflection spectrum obtained by irradiating the multilayer film on the substrate with infrared light, from an amount of reflected light at the predetermined wavenumber determined according to a film thickness of each layer of the multilayer film, a carrier concentration of the substrate, and a carrier concentration of each layer, and in the epitaxial growth of the multilayer film, the multilayer film is grown by adjusting a thickness of each layer and the carrier concentration of each layer so that an amount of the reflected light determined according to the thickness of each layer, the carrier concentration of the substrate, and the carrier concentration of each layer, does not have a maximum or minimum in a wavenumber range of 1,600 cm$^{-1}$ or more and 1,700 cm$^{-1}$ or less.

What is claimed is:

1. A method for inspecting a film quality for inspecting a film quality of a thin film in a nitride semiconductor laminate obtained by homoepitaxially growing a thin film on a substrate comprising crystals of a group III nitride semiconductor, which is a method for inspecting a film quality of a thin film by detecting a deviation of an amount of reflected light at a predetermined wavenumber determined in a range of 1,600 cm$^{-1}$ or more and 1,700 cm$^{-1}$ or less in a reflection spectrum obtained by irradiating the thin film on the substrate with infrared light, from an amount of reflected light at the predetermined wavenumber determined according to a film thickness of the thin film, a carrier concentration of the substrate, and a carrier concentration of the thin film, using the substrate in which a dislocation density on its main surface is 5×10$^6$ pieces/cm$^2$ or less, a concentration of oxygen therein is less than 1×10$^{17}$ at ·cm$^{-3}$, and a concentration of impurities therein other than n-type impurity is less than 1×10$^{17}$ at ·cm$^{-3}$.

2. A nitride semiconductor laminate, comprising:

a substrate comprising group III nitride semiconductor crystals; and a thin film homoepitaxially grown on the substrate, wherein a dislocation density on a main surface of the substrate is 5×10$^6$ pieces/cm$^2$ or less, a concentration of oxygen in the substrate is less than 1×10$^{17}$ at ·cm$^{-3}$, and a concentration of impurities other than n-type impurity in the substrate is less than 1×10$^{17}$ at ·cm$^{-3}$, and when taking into consideration of a deviation of an amount of reflected light at a predetermined wavenumber in a reflection spectrum obtained by irradiating the thin film on the substrate with infrared light, from an amount of reflected light at the predetermined wavenumber determined according to a film thickness of the thin film, a carrier concentration of the substrate, and a carrier concentration of the thin film, a maximum value of a degree of a deviation in a wavenumber range of 1,600 cm$^{-1}$ or more and 1,700 cm$^{-1}$ or less is larger than any of a maximum value of a degree of a deviation in a wavenumber range of 1,500 cm$^{-1}$ or more and less than 1,600 cm$^{-1}$ and a maximum value of a degree of a deviation in a wavenumber range of more than 1,700 cm$^{-1}$ and 1,800 cm$^{-1}$ or less.

3. The nitride semiconductor laminate according to claim 2, wherein the maximum value of the degree of the deviation in the wavenumber range of 1,600 cm$^{-1}$ or more and 1,700 cm$^{-1}$ or less is 1% or more and 10% or less as a degree of a difference in intensity reflectance.

4. A nitride semiconductor laminate, comprising:
a substrate comprising group 111 nitride semiconductor crystals; and
a thin film homoepitaxially grown on the substrate,
wherein a dislocation density on a main surface of the substrate is 5×10$^6$ pieces/cm$^2$ or less, a concentration of oxygen in the substrate is less than 1×10$^{17}$ at ·cm$^{-3}$, and a concentration of impurities other than n-type impurity in the substrate is less than 1×10$^{17}$ at ·cm$^{-3}$, and
when taking into consideration of a deviation of an amount of reflected light at a predetermined wavenumber in a reflection spectrum obtained by irradiating the thin film on the substrate with infrared light, from an amount of reflected light at the predetermined wavenumber determined according to a film thickness of the thin film, a carrier concentration of the substrate, and a carrier concentration of the thin film, any of a maximum value of a degree of the deviation in a wavenumber range of 1,600 cm$^{-1}$ or more and 1,700 cm$^{-1}$ or less, a maximum value of a degree of a deviation in a wavenumber range of 1,500 cm$^{-1}$ or more and less than 1,600 cm$^{-1}$ and a maximum value of a degree of a deviation in a wavenumber range of more than 1,700 cm$^{-1}$ and 1,800 cm$^{-1}$ or less, is less than 1% as a degree of a difference in intensity reflectance.

5. The nitride semiconductor laminate according to claim 2, wherein when the maximum value of the degree of the deviation in the wavenumber range of 1,600 cm$^{-1}$ or more and 1,700 cm$^{-1}$ or less is acquired at a plurality of positions on the main surface of the thin film, a maximum value is 1.5 times or less of a minimum value among the plurality of acquired maximum values.

6. The nitride semiconductor laminate according to claim 2, wherein an absorption coefficient α in a wavelength range of at least 1 μm or more and 3.3 μm or less is approximated by equation (1) by a method of least squares, and
an error of the measured absorption coefficient at a wavelength of 2μ with respect to the absorption coefficient α obtained from the equation (1) is within ±0.1α,
where a wavelength is λ (μm), an absorption coefficient of the substrate at 27° C. is α (cm$^{-1}$), a carrier concentration in the substrate is N$_e$ (cm$^{-3}$), and K and a are constants.

7. The nitride semiconductor laminate according to claim 2, wherein a crystal of the group III nitride semiconductor is a gallium nitride crystal.

8. The nitride semiconductor laminate according to claim 4, wherein when the maximum value of the degree of the deviation in the wavenumber range of 1,600 cm$^{-1}$ or more and 1,700 cm$^{-1}$ or less is acquired at a plurality of positions on the main surface of the thin film, a maximum value is 1.5 times or less of a minimum value among the plurality of acquired maximum values.

9. The nitride semiconductor laminate according to claim 4, wherein an absorption coefficient α in a wavelength range of at least 1 μm or more and 3.3 μm or less is approximated by equation (1) by a method of least squares, and
an error of the measured absorption coefficient at a wavelength of 2μ with respect to the absorption coefficient α obtained from the equation (1) is within ±0.1α,
where a wavelength is λ (μm), an absorption coefficient of the substrate at 27° C. is α (cm$^{-1}$), a carrier concentration in the substrate is N$_e$ (cm$^{-3}$), and K and a are constants.

10. The nitride semiconductor laminate according to claim 4, wherein a crystal of the group III nitride semiconductor is a gallium nitride crystal.

* * * * *

UNITED STATES PATENT AND TRADEMARK OFFICE
CERTIFICATE OF CORRECTION

PATENT NO. : 11,946,874 B2
APPLICATION NO. : 17/055539
DATED : April 2, 2024
INVENTOR(S) : Fumimasa Horikiri It is certified that error appears in the above-identified patent and that said Letters Patent is hereby corrected as shown below:

In the Claims

In Claim 4, Column 53, Line 15, delete "111"; and insert --III--

Signed and Sealed this
Twenty-eighth Day of May, 2024

*Katherine Kelly Vidal*
Katherine Kelly Vidal
*Director of the United States Patent and Trademark Office*